US008566047B2

(12) United States Patent
Montreuil et al.

(10) Patent No.: US 8,566,047 B2
(45) Date of Patent: Oct. 22, 2013

(54) ELECTRICAL ANOMALY DETECTION METHOD AND SYSTEM

(75) Inventors: Michel Montreuil, Quebec (CA); Karl Fecteau, Quebec (CA)

(73) Assignee: Corporation Nuvolt Inc. (CA)

( * ) Notice: Subject to any disclaimer, the term of this patent is extended or adjusted under 35 U.S.C. 154(b) by 252 days.

(21) Appl. No.: 12/937,753

(22) PCT Filed: Apr. 14, 2009

(86) PCT No.: PCT/CA2009/000512
§ 371 (c)(1),
(2), (4) Date: Oct. 14, 2010

(87) PCT Pub. No.: WO2009/127068
PCT Pub. Date: Oct. 22, 2009

(65) Prior Publication Data
US 2011/0153236 A1    Jun. 23, 2011

Related U.S. Application Data

(60) Provisional application No. 61/044,631, filed on Apr. 14, 2008.

(51) Int. Cl.
*G01R 31/00*    (2006.01)
(52) U.S. Cl.
USPC ............... 702/59; 702/58; 702/182; 702/185
(58) Field of Classification Search
USPC ........................................... 702/58–59, 185
See application file for complete search history.

(56) References Cited

U.S. PATENT DOCUMENTS

| 3,911,323 A | * | 10/1975 | Wilson et al. ................ 361/42 |
| 4,296,450 A | * | 10/1981 | Paice et al. .................. 361/50 |
| 4,398,188 A | | 8/1983 | Feigal et al. |
| 5,123,017 A | | 6/1992 | Simpkins et al. |
| 5,250,894 A | | 10/1993 | Bridges et al. |
| 5,452,223 A | | 9/1995 | Zuercher et al. |

(Continued)

FOREIGN PATENT DOCUMENTS

| JP | 2003032826 | 1/2003 |
| JP | 2007046992 A2 | 2/2007 |

*Primary Examiner* — Mischita Henson
(74) *Attorney, Agent, or Firm* — Robert Plotkin, P.C.

(57) ABSTRACT

There are provided a method and a system for real time monitoring of a powered on electrical network in a facility in order to detect an electrical anomaly while the electrical network is in use. The system comprises a sensor data receiver for receiving real time sensor data including at least one measured value measured in real time by at least one sensor installed on a conductor of the electrical network in the facility while the electrical network is in use; an anomaly detector for retrieving an anomaly detection rule from an anomaly detection rule database, the rule having an identification of a required input, a formula, and a threshold reference value, for a detection of an anomaly; receiving the real time sensor data from the sensor data receiver and extracting at least one relevant measured value from the at least one measured value using the identification of the required input; comparing the at least one relevant measured value to the threshold reference value according to the formula to determine one of a presence and an absence of the anomaly in the real time sensor data; an event generator controlled by the processor for retrieving and providing anomaly monitoring data if the anomaly is determined to be present by the processor, the anomaly monitoring data including an indication of a monitoring course of action to be carried out to address the anomaly determined to be present.

37 Claims, 23 Drawing Sheets

(56) References Cited

U.S. PATENT DOCUMENTS

| | | |
|---|---|---|
| 5,680,025 A | 10/1997 | Bowers et al. |
| 5,739,698 A | 4/1998 | Bowers et al. |
| 5,825,170 A | 10/1998 | Montreuil |
| 5,839,092 A | 11/1998 | Erger et al. |
| 6,175,810 B1 | 1/2001 | Jurisch |
| 6,292,717 B1 | 9/2001 | Alexander et al. |
| 6,308,140 B1 | 10/2001 | Dowling et al. |
| 6,396,283 B1 | 5/2002 | Kimoto |
| 6,631,063 B2 | 10/2003 | Ortiz et al. |
| 6,963,475 B2 | 11/2005 | Klippel et al. |
| 6,989,977 B2 | 1/2006 | Kase et al. |
| 7,161,393 B1 | 1/2007 | Potanin et al. |
| 7,191,074 B2 | 3/2007 | Rostron et al. |
| 7,236,338 B2 | 6/2007 | Hale et al. |
| 7,254,004 B2 | 8/2007 | Mladenik et al. |
| 7,368,918 B2 * | 5/2008 | Henson et al. ............... 324/536 |
| 2006/0176631 A1 | 8/2006 | Cannon |
| 2006/0215335 A1 * | 9/2006 | Deshpande et al. ............ 361/42 |
| 2007/0265713 A1 | 11/2007 | Veillette et al. |
| 2008/0180866 A1 * | 7/2008 | Wong ............................. 361/45 |
| 2013/0060524 A1 * | 3/2013 | Liao ............................. 702/184 |

* cited by examiner

*Fig. 18*

Nuvolt Monitoring System

File  Configuration

Refresh interval in seconds (0 to stop) [0] Last refresh: 27/03/2009 7:42:01 AM [Refresh] [Ack alarms] [Test alarm]  Start: 26/03/2009 ▽  End: 27/03/2009 ▽  ○Active ○Historic Drag a column to group by

| Occurrence date △ | Recovery date | Location | Severity | Description | Acknowledg... |
|---|---|---|---|---|---|
| 26/03/2009 4:45:34 AM | 26/03/2009 4:45:56 AM | CM1 - PE2 - 29 | Alarm | The system has detected a ground fault. This is a severe defect and requires immediate course of action. | ✓ |
| 26/03/2009 4:46:05 AM | 26/03/2009 4:46:15 AM | Étable - PE3 - 03 | Alarm | An electrical arc has been identified. The type of the electrical arc is "parallel". | ✓ |
| 26/03/2009 4:46:05 AM | 26/03/2009 4:46:15 AM | Étable - PE3 - 15-17 | Alarm | An electrical arc has been identified over "1,2". The type of the electrical arc is "parallel". | ✓ |
| 26/03/2009 5:00:06 AM | 26/03/2009 5:01:21 AM | CM1 - PE1 - 09 | Warning | The total of 60 Hz current are over 80 % of the circuit capacity. | ✓ |
| 26/03/2009 5:00:07 AM | 26/03/2009 5:01:21 AM | CM1 - PE1 - 09 | Alarm | The total of 60 Hz current are over 100 % of the circuit capacity at hole 3. | ✓ |
| 26/03/2009 5:08:59 AM | 26/03/2009 5:10:03 AM | Étable - PE3 - 26 | Warning | The voltage over 1 in the sensor 200811071000000162 is missing | ✓ |
| 26/03/2009 5:08:59 AM | 26/03/2009 5:10:04 AM | CM1 - PE1 - 01 | Warning | The voltage over 2 in the sensor 200810141000000122 is missing | ✓ |
| 26/03/2009 5:09:59 AM | 26/03/2009 5:10:04 AM | CM1 - PE1 - 06 | Warning | The voltage over 2 in the sensor 200810021000000148 is missing | ✓ |
| 26/03/2009 5:10:00 AM | 26/03/2009 5:10:04 AM | CM1 - PE1 - 02 | Warning | The voltage over 1 in the sensor 200810021000000127 is missing | ✓ |
| 26/03/2009 5:10:00 AM | 26/03/2009 5:10:33 AM | Étable - PE3 - 14-16 | Alarm | The circuit breaker has been opened, by a human intervention and not an electrical default, load was not in operation. | ✓ |
| 26/03/2009 5:10:05 AM | 26/03/2009 5:10:05 AM | CM1 - PE1 - 09 | Warning | The voltage over 2 in the sensor 200810021000000130 is missing | ✓ |
| 26/03/2009 5:10:01 AM | 26/03/2009 5:10:05 AM | CM1 - PE1 - 09 | Alarm | The circuit breaker has been opened, by a human intervention and not an electrical default, load was not in operation. | ✓ |
| 26/03/2009 5:10:05 AM | 26/03/2009 5:10:05 AM | Étable - PE3 - 35 | Warning | The voltage over 2 in the sensor 200810021000000131 is missing | ✓ |
| 26/03/2009 5:10:01 AM | 26/03/2009 5:10:06 AM | Étable - PE3 - 18-20 | Warning | The voltage over 1 in the sensor 200810021000000112 is missing | ✓ |

Fig. 19

Monitoring sytems - Alarm details

Alarm
- Owner: todo
- Location: Chambre Électrique
- Panel: PE1
- Circuit: 12
- Description: Load is lost
- Alarm #: 249286
- Severity: Alarm
- Occurrence date: 29/01/2009 10:52:49 AM
- Recovery date: 29/01/2009 10:52:54 AM
- Acknowledge date: 30/01/2009 9:23:49 AM
- Acknowledge user: Nom

Description
Message # 44    Alarm Occurrence 17

Currently the motor operates without a load. The link between the motor and the mechanical load is broken.

Solution
Verify the link between the motor and the mechanical load.

[Prior] [Later] [Close]

*2020*

| Status of circuit sensors | | | | | | | |
|---|---|---|---|---|---|---|---|
| Location | Panel | Circuit | Description | Sensor serial number | Sensor firmware ver... △ | Status | |
| CM1 | PE2 | 17 | Pompe a Pression | 20081002100000121 | curr0050 | Connected | |
| CM1 | PE2 | 18 | Brasseur eau usée | 20081009100000136 | curr0050 | Connected | |
| CM1 | PE2 | 20 | Lumière + prise laitière | 20081002100000125 | curr0050 | Connected | |
| CM1 | PE2 | 21 | Controle pompe à lait | 20080828100000004 | curr0050 | Connected | |
| CM1 | PE2 | 22-24 | Salle de traite | 20081002100000108 | curr0050 | Connected | |
| CM1 | PE2 | 26 | inconnue | 20080902100000025 | curr0050 | Connected | |
| CM1 | PE2 | 29 | Controle A | 20080902100000037 | curr0050 | Connected | |
| CM1 | PE2 | 30 | Controle eau usée | 20080902100000024 | curr0050 | Connected | |
| CM1 | PE2 | 33 | Controle traite | 20080902100000028 | curr0050 | Connected | |
| CM1 | PE2 | 34 | Controle A-B | 20080902100000019 | curr0050 | Connected | |
| CM1 | PE2 | 38 | Controle C-D | 20081002100000126 | curr0050 | Connected | |
| Étable | PE3 | 02 | Controle chien | 20081107100000158 | curr0050 | Connected | |
| Étable | PE3 | 03 | Soudeuse | 20080902100000022 | curr0050 | Connected | |
| Étable | PE3 | 07 | Prise Évacuair B | 20080902100000032 | curr0050 | Connected | |
| Étable | PE3 | 08 | Prise panneau | 20081002100000118 | curr0050 | Connected | |
| Étable | PE3 | 09 | Prise évacuair A | 20081002100000132 | curr0050 | Connected | |
| Étable | PE3 | 11-13 | Lumière 400W Stabulation | 20081211100000163 | curr0050 | Connected | |
| Étable | PE3 | 14-16 | Ventilation A | 20081002100000101 | curr0050 | Connected | |
| Étable | PE3 | 15-17 | Lumière 400W Stabulation | 20080828100000007 | curr0050 | Connected | |
| Étable | PE3 | 18-20 | Ventilation C-D | 20081002100000112 | curr0050 | Connected | |
| Étable | PE3 | 19-21 | Lumière 400W Stabulation | 20081014100000150 | curr0050 | Connected | |
| Étable | PE3 | 22 | Ralette | 20080902100000020 | curr0050 | Connected | |
| Étable | PE3 | 23 | Angee | 20081002100000116 | curr0050 | Connected | |
| Étable | PE3 | 25 | Ratelette | 20080902100000009 | curr0050 | Connected | |
| Étable | PE3 | 26 | Ratelette | 20081107100000162 | curr0050 | Connected | |
| Étable | PE3 | 29 | Prise coté ouest | 20081002100000123 | curr0050 | Connected | |
| Étable | PE3 | 31 | Soudeuse | 20080828100000006 | curr0050 | Connected | |
| Étable | PE3 | 34 | Soudeuse | 20081002100000115 | curr0050 | Connected | |
| Étable | PE3 | 35 | Inconnue | 20081002100000131 | curr0050 | Connected | |
| Refresh | Last refresh: 27/03/2009 11:09:35 AM | | | | Update firmware | Sensor reading | Close |

ELECTRICAL ANOMALY DETECTION METHOD AND SYSTEM

CROSS REFERENCE TO RELATED APPLICATIONS

This application claims priority under 35 U.S.C. §371 from PCT Application No. PCT/CA2009/000512, entitled, "Electrical Anomaly Detection Method and System," filed on Apr. 14, 2009; which in turn claims priority of U.S. provisional patent application No. 61/044,631 filed on Apr. 14, 2008 by Applicant.

TECHNICAL FIELD

This invention relates to electrical anomaly detection in electrical distribution and grounding networks and more particularly, to detecting an anomaly and providing course of action data.

BACKGROUND OF THE ART

Electrical networks are used in industrial applications such as, for example, in production, manufacturing, industrial or agricultural facilities. These networks, when implemented in large scale facilities, may comprise various electrical equipments such as motors, pumps, heaters, and cooling systems to accomplish various industrial tasks. Electrical networks used in a large scale industrial application tend to be difficult to manage, for example, because of the number of electrical elements, their complexity in terms of electrical connections, the efficiency of the network planning, the lifetime of the network, etc. Inappropriate management, replacement or planning of electrical equipments in a large scale industrial application may affect the electrical network and render the electrical equipment or a part of the electrical network unusable, and thus decrease the electrical signal quality.

In animal livestock facilities, the electrical networks are placed in a very demanding environment of high humidity, ammonia gas, frequent spraying of water and electrical equipment operating at many different frequencies.

Continuous real-time monitoring of electrical networks, with or without loads, is necessary to identify any events or faulty equipment over an entire electrical network. However, this is not currently achieved.

SUMMARY

It is therefore an aim of the present invention to address at least one of the above mentioned difficulties.

There are provided a method and a system for real time monitoring of a powered-on electrical network in a facility in order to detect an electrical anomaly while the electrical network is in use.

The method comprises receiving real time sensor data including at least one measured value measured in real time by at least one sensor installed on a conductor of the electrical network in the facility while the electrical network is in use; retrieving an anomaly detection rule, the rule having an identification of a required input, a formula, and a threshold reference value, for a detection of an anomaly; extracting at least one relevant measured value from the at least one measured value using the identification of the required input; comparing the at least one relevant measured value to the threshold reference value according to the formula to determine one of a presence and an absence of the anomaly in the real time sensor data; and if the anomaly is determined to be present, retrieving and providing anomaly monitoring data, the anomaly monitoring data including an indication of a monitoring course of action to be carried out to address the anomaly determined to be present.

In one embodiment, the method further comprises generating an indication that the electrical anomaly is detected and outputting a message including the anomaly monitoring data.

In one embodiment, the method further comprises formatting the real time sensor data into formatted data, and wherein the outputting the message comprises including the formatted data with the anomaly monitoring data.

In one embodiment, the receiving real time sensor data comprises receiving real time sensor data including at least one measured value measured in real time by sixteen current sensors and a voltage sensor.

In one embodiment, the method further comprises: retrieving potential sources data for the anomaly determined to be present including a list of potential sources for the anomaly; retrieving installation data for the electrical network; determining a source of the electrical anomaly in the electrical network using the list of potential sources, the real time sensor data and the installation data; and wherein providing anomaly monitoring data comprises providing an indication of the determined source.

In one embodiment, the method further comprises: retrieving type data for the anomaly determined to be present including a list of types for the anomaly and a corresponding detection rule for each of the types; determining a type of the electrical anomaly in the electrical network using the list of types, the corresponding detection rule and the real time sensor data; and wherein providing anomaly monitoring data comprises providing an indication of the determined type.

In one embodiment, determining the type further comprises using the installation data.

In one embodiment, determining the type further comprises using the potential sources data.

In one embodiment, the anomaly is one of: an erroneous installation of the sensor, an electrical arc, a short circuit, an external intervention on a current limitation device, a bonding, a leakage of current, an overcurrent, a lost load, a harmonic distortion anomaly, a mechanical jam, an unbalanced current, an overload of a load, a repetitive start, a heavy start, a thermal protection anomaly, a power failure, an unbalanced voltage, a frequency value anomaly, a voltage value anomaly, a loss of a neutral conductor, and a temperature anomaly.

In one embodiment, the anomaly is the electrical arc, the at least one sensor is a current sensor, and the at least one measured value is a current value, the identification of the required input is a value for a current, the formula is performing a standard deviation on a vector of subtractions of the value for the current for a previous cycle by another current value, for a number n of cycles, the another current value being one of a current value for a present cycle and a current value for an average cycle, the threshold reference value is a reference value for the standard deviation; wherein extracting comprises extracting n current acquired signals from the real time sensor data; and wherein comparing comprises applying the formula to the n current acquired signals and comparing the standard deviation to the reference value to determine one of a presence and an absence of the electrical arc.

In one embodiment, the number n of cycles is five.

In one embodiment, the method further comprises determining the current value for an average cycle by accumulating a number m of current values over m cycles and performing an average on the m current values to obtain the current value for the average cycle.

In one embodiment, the anomaly is the external intervention on the current limitation device, the at least one sensor is a current sensor, and the at least one measured value is two sets of values from consecutive time periods, each set including a current presence value, a voltage presence value and a load presence value, the identification of the required input is a status of a current, a status of a voltage and a status of a load, the formula is subtracting each value from one of the two consecutive sets from a corresponding value in the other one of the two consecutive sets, the threshold reference value is a transition value; wherein extracting comprises extracting an indication of a status of a current from the current presence value, of a status of a voltage from the voltage presence value and a status of a load from the load presence value from the real time sensor data; wherein comparing comprises applying the formula and comparing the obtained set of subtracted values to the transition value to determine an occurrence of a abnormal transition if one of the transition for each of the voltage, the current and the load is from a present status to an absent status over the two consecutive time periods; and the transition for the voltage is from a present status to an absent status over the two consecutive time periods and the status of the current and the load is an absent status and the transition for the current and the load is nil; the method further comprises retrieving a status for other anomalies, the status being one of presence of at least one other anomaly and absence of any other anomaly; and wherein comparing further comprises if the status for other anomalies is the absence of any other anomaly and the abnormal transition is determined to be occurred, determining a presence of the external intervention on a current limitation device anomaly.

In one embodiment, the method further comprises determining the current presence value by comparing a measured current value with a current presence threshold value, determining the voltage presence value by comparing a measured voltage value with a voltage presence threshold value and determining the load presence value by comparing a measured load value with a load presence threshold value.

In one embodiment, the anomaly is the erroneous installation of the sensor, the at least one sensor is a current sensor having at least two conductor holes, and the at least one measured value is a measured voltage value for each of the at least two conductor holes of the sensor, the identification of the required input is a value for a voltage, the threshold reference value is a threshold voltage value, the formula is subtracting the value for the voltage by the threshold voltage value; wherein comparing comprises applying the formula to each the measured voltage value and further comprises: if the measured voltage value is greater than the threshold voltage value, determining the corresponding one of the sensor holes to be a line conductor; if the measured voltage value is smaller than the threshold voltage value, determining the corresponding one of the sensor holes to be a neutral conductor; determining a number of holes having been determined to be a neutral conductor to be neutral holes, if the number of neutral holes is greater than one, determining a presence of the erroneous installation anomaly and determining a type of the erroneous installation anomaly to be a number of neutral holes anomaly.

In one embodiment, comparing further comprises: determining a number of holes having been determined to be a line conductor to be a number of live holes; if the number of live holes is zero, determining a presence of the erroneous installation anomaly and determining a type of the erroneous installation anomaly to be a number of live holes anomaly.

In one embodiment, the at least one measured value includes a measured phase value for each of the at least two conductor holes of the sensor, the identification of the required input includes a value for a phase, the threshold reference value includes a single phase threshold phase value and a three-phase threshold phase value, the formula further includes subtracting a phase shift between phases of each line conductors with one of the single phase threshold phase value and the three-phase threshold phase value; wherein comparing further comprises: if the number of live holes is two, determining a phase shift between the phase measured value of the line conductors, comparing the phase shift with the single phase threshold phase value, if the erroneous installation anomaly is determined to be present, determining a type of the erroneous installation anomaly to be a phase shift anomaly; if the number of live holes is three, determining three phase shifts between the phase measured value of the line conductors, comparing each of the three phase shifts with the three-phase threshold phase value, if the erroneous installation anomaly is determined to be present, determining a type of the erroneous installation anomaly to be a phase shift anomaly; if the number of live holes is four, determining a presence of an erroneous installation anomaly and determining a type of the erroneous installation anomaly to be a live hole anomaly.

The system comprises a sensor data receiver for receiving real time sensor data including at least one measured value measured in real time by at least one sensor installed on a conductor of the electrical network in the facility while the electrical network is in use; an anomaly detector for retrieving an anomaly detection rule from an anomaly detection rule database, the rule having an identification of a required input, a formula, and a threshold reference value, for a detection of an anomaly; receiving the real time sensor data from the sensor data receiver and extracting at least one relevant measured value from the at least one measured value using the identification of the required input; comparing the at least one relevant measured value to the threshold reference value according to the formula to determine one of a presence and an absence of the anomaly in the real time sensor data; an event generator controlled by the processor for retrieving and providing anomaly monitoring data if the anomaly is determined to be present by the processor, the anomaly monitoring data including an indication of a monitoring course of action to be carried out to address the anomaly determined to be present.

In one embodiment, the system further comprises an event display for generating an indication that the electrical anomaly is detected and outputting a message including the anomaly monitoring data.

In one embodiment, the system further comprises a sensor data formatter for formatting the real time sensor data into formatted data, and wherein the event display outputs the message including the formatted data with the anomaly monitoring data.

In one embodiment, the system further comprises a source locator for retrieving potential sources data for the anomaly determined to be present from the anomaly detection rule database including a list of potential sources for the anomaly; retrieving installation data for the electrical network from a system installation database; and determining a source of the electrical anomaly in the electrical network using the list of potential sources, the real time sensor data and the installation data; wherein the event generator provides an indication of the determined source.

In one embodiment, the system further comprises a type determiner for: retrieving type data for the anomaly determined to be present from the anomaly detection rule database including a list of types for the anomaly and a corresponding detection rule for each of the types; and determining a type of the electrical anomaly in the electrical network using the list of types, the corresponding detection rule and the real time sensor data; wherein the event generator provides an indication of the determined type.

In one embodiment, the type determiner further uses the installation data.

In one embodiment, the type determiner uses the potential sources data.

In one embodiment, the anomaly is the electrical arc, the at least one sensor is a current sensor, and the at least one measured value is a current value, the identification of the required input is a value for a current, the formula is performing a standard deviation on a vector of subtractions of the value for the current for a previous cycle by another current value, for a number n of cycles, the another current value being one of a current value for a present cycle and a current value for an average cycle, the threshold reference value is a reference value for the standard deviation; wherein the anomaly detector extracts n current acquired signals from the real time sensor data and applies the formula to the n current acquired signals and compares the standard deviation to the reference value to determine one of a presence and an absence of the electrical arc.

In one embodiment, the anomaly is the external intervention on a current limitation device, the at least one sensor is a current sensor, and the at least one measured value is two sets of values from consecutive time periods, each set including a current presence value, a voltage presence value and a load presence value, the identification of the required input is a status of a current, a status of a voltage and a status of a load, the formula is subtracting each value from one of the two consecutive sets from a corresponding value in the other one of the two consecutive sets, the threshold reference value is a transition value; wherein the anomaly detector extracts an indication of a status of a current from the current presence value, of a status of a voltage from the voltage presence value and a status of a load from the load presence value from the real time sensor data; applies the formula and compares the obtained set of subtracted values to the transition value to determine an occurrence of a abnormal transition if one of the transition for each of the voltage, the current and the load is from a present status to an absent status over the two consecutive time periods; and the transition for the voltage is from a present status to an absent status over the two consecutive time periods and the status of the current and the load is an absent status and the transition for the current and the load is nil; the system further comprises a system communicator for retrieving a status for other anomalies, the status being one of presence of at least one other anomaly and absence of any other anomaly; and wherein the anomaly detector obtains the status for other anomalies from the system communicator and if the status for other anomalies is the absence of any other anomaly and the abnormal transition is determined to be occurred, determines a presence of the external intervention on a current limitation device anomaly.

In one embodiment, the anomaly is an erroneous installation of the sensor, the at least one sensor is a current sensor having at least two conductor holes, and the at least one measured value is a measured voltage value for each of the at least two conductor holes of the sensor, the identification of the required input is a value for a voltage, the threshold reference value is a threshold voltage value, the formula is subtracting the value for the voltage by the threshold voltage value; wherein the anomaly detector applies the formula to each the measured voltage value; if the measured voltage value is greater than the threshold voltage value, determines the corresponding one of the sensor holes to be a line conductor; if the measured voltage value is smaller than the threshold voltage value, determines the corresponding one of the sensor holes to be a neutral conductor; determines a number of holes having been determined to be a neutral conductor to be neutral holes, if the number of neutral holes is greater than one, determines a presence of the erroneous installation anomaly and determines a type of the erroneous installation anomaly to be a number of neutral holes anomaly.

In one embodiment, the anomaly detector: determines a number of holes having been determined to be a line conductor to be a number of live holes; if the number of live holes is zero, determines a presence of the erroneous installation anomaly and determines a type of the erroneous installation anomaly to be a number of live holes anomaly.

In one embodiment, the at least one measured value includes a measured phase value for each of the at least two conductor holes of the sensor, the identification of the required input includes a value for a phase, the threshold reference value includes a single phase threshold phase value and a three-phase threshold phase value, the formula further includes subtracting a phase shift between phases of each line conductors with one of the single phase threshold phase value and the three-phase threshold phase value; wherein the anomaly detector, if the number of live holes is two, determines a phase shift between the phase measured value of the line conductors, compares the phase shift with the single phase threshold phase value, if the erroneous installation anomaly is determined to be present, determines a type of the erroneous installation anomaly to be a phase shift anomaly; if the number of live holes is three, determines three phase shifts between the phase measured value of the line conductors, compares each of the three phase shifts with the three-phase threshold phase value, if the erroneous installation anomaly is determined to be present, determines a type of the erroneous installation anomaly to be a phase shift anomaly; if the number of live holes is four, determines a presence of an erroneous installation anomaly and determines a type of the erroneous installation anomaly to be a live hole anomaly.

BRIEF DESCRIPTION OF THE DRAWINGS

Having thus generally described the nature of the invention, reference will now be made to the accompanying drawings, showing by way of illustration a preferred embodiment thereof and in which:

FIG. 18 illustrates a window of a graphical user interface in accordance with an embodiment;

FIG. 19 illustrates a window of a graphical user interface in accordance with an embodiment;

FIG. 20 illustrates a window of a graphical user interface in accordance with an embodiment;

FIG. 21 illustrates a window of a graphical user interface in accordance with an embodiment;

FIG. 23 comprises FIG. 23a and FIG. 23b.

It will be noted that throughout the appended drawings, like features are identified by like reference numerals.

DETAILED DESCRIPTION

Figure 1:
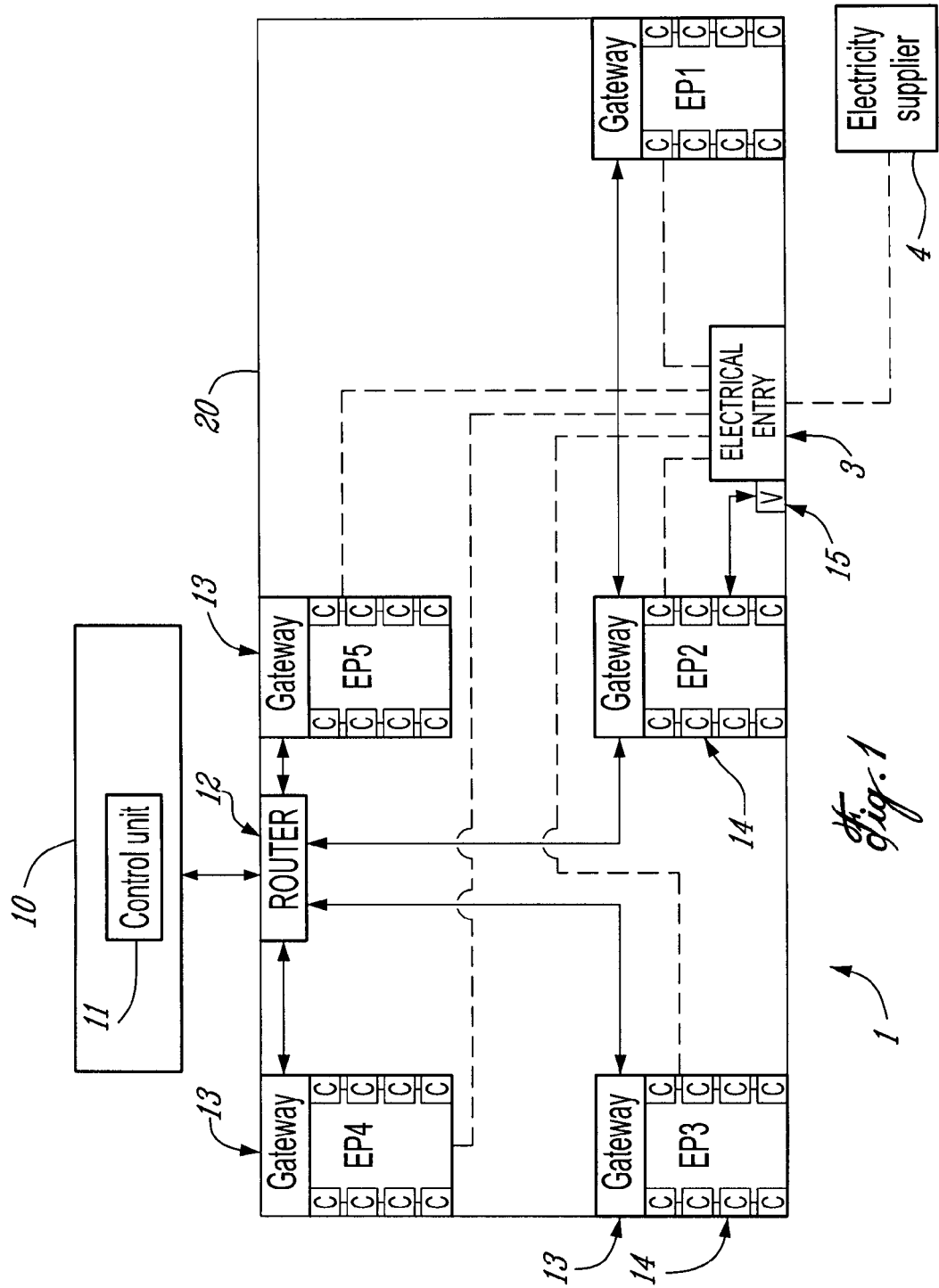
FIG. 1 is a block diagram showing an electrical network to be monitored for detecting anomalies in accordance with an embodiment.

Reference is now made to FIG. 1, which is a block diagram showing an electrical network 1 to be monitored for detecting anomalies. The facility can be an agricultural facility, a farm, an industrial complex, a commercial building or any other building with electrical equipments to be monitored. The network 1 is monitored to allow system updates, remote debugging, threshold adjustments, general monitoring, detect network disturbances, equipment malfunctions or the like, and to identify the type of anomaly, and to prevent equipment breakdown with early detection of anomalies prior to a failure occurring. The network 1 can be monitored to analyze long term recurrent problem of temporary and uncorrelated problem. The electricity is provided to the network 1 by a traditional electricity supplier 4 connected to an electrical entry 3.

Figure 2:
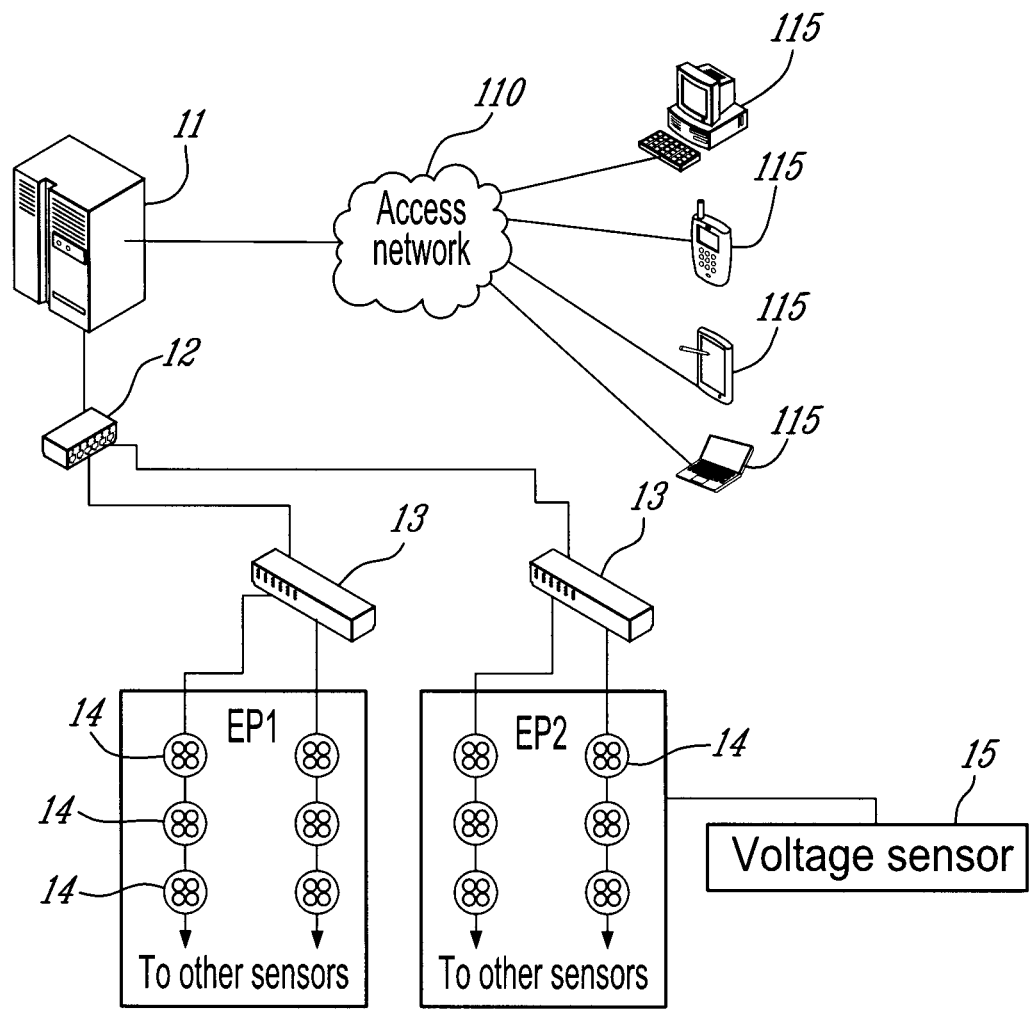
FIG. 2 is a block diagram of a distant access to the electrical network of FIG. 1 in accordance with an embodiment.

Reference is now made to FIG. 2, which is a block diagram of a distant access to the electrical network 1 in accordance with an embodiment. In the embodiment shown in FIG. 2, a user can communicate with the network 1 via an external access network 110 such as the Internet via a user device 115. The user device 115 can be, for example, any type of Personal Computer (PC), Portable computer, Personal Digital Assistant (PDA), mobile phone or the like. It should be noted that one skilled in the art would understand that the external access could be provided via any distant access. This external access can allow system updates, remote debugging, threshold adjustments and general monitoring.

The monitoring system constantly verifies the electrical network even when no loads are active. The system permanently reads and analyses all sensor parameters. For example, the system can easily identify, quantify and locate electrical arcs, voltage drops, motor problems, conductor and neutral overloads, current leakages, equipment overcharges, THD, etc. Moreover, to prevent risks of fire or equipment damage, the system verifies the panel and room temperature where the panel is located. The system can differentiate whether the panel temperature increase is caused by an electrical defect or if the room temperature itself is increasing. In both cases, the system advises the network manager to take immediate action. The monitoring system details the anomaly detected and proposes a course of action to address the anomaly and eventually solve the issue. This reduces the debugging time and minimizes the downtime by proposing preventive maintenance.

The monitoring system addresses multiple types of motor problems such as the motor thermal protection or the circuit breakers are not set properly, the motor is in overload due to a voltage drop or in a mechanical jam, the motor lost his load, the motor was stopped by an external intervention (such as a human intervention on a breaker, an accidental physical triggering of a breaker or a remote controlling of an electronic breaker), etc. The system also has the capability to detect, quantify and locate anomalies over standard loads, such as electrical arcs, bounding faults, current leakage, THD, etc. Finally events affecting electrical power quality or security of the local electrical network are detected.

Figure 3:
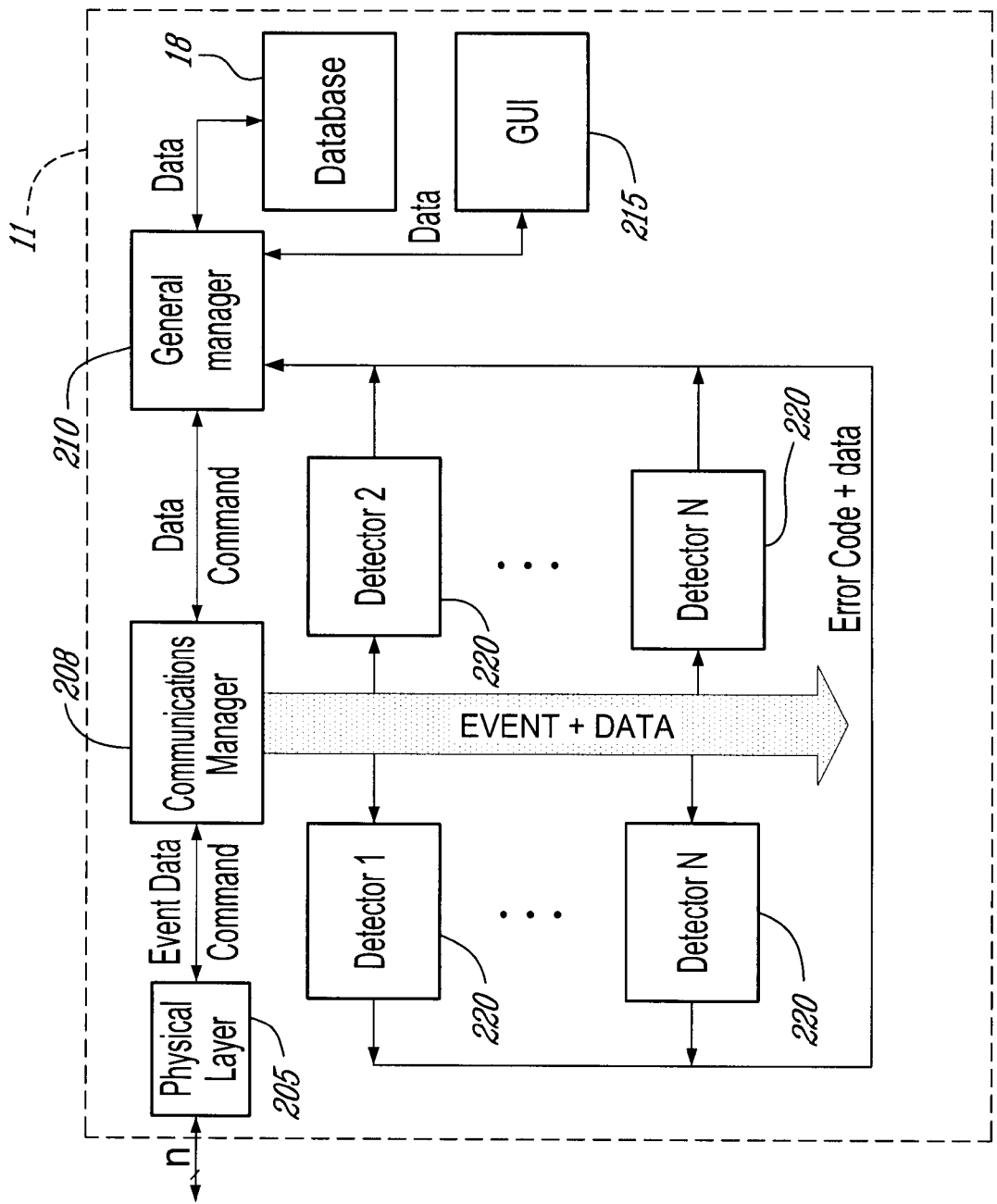
FIG. 3 is a bloc diagram of the control unit of FIG. 1 in accordance with an embodiment.

Reference is now made to FIG. 3, which is a schematic view of the control unit 11 in accordance with an embodiment. The control unit 11 can be a personal computer (PC) or a server that can process received data from any communication medium. The control unit 11 can be local or remotely located, for example, in another building like building 10. The control unit 11 can be hardware, software of any combination thereto. The control unit 11 may comprise a computer medium embodied therein to manage and operate the control unit 11. Solid lines represent data links while the dashed lines are electrical supply connections. The control unit 11 receives at a physical layer 205, events, data, and command feedback from the network 1. The physical layer forwards the events, data, and command feedback from the network 1 to a communication manager 208. The control unit 11 also sends data and commands to the network 1.

Events, data and command feedback are forwarded to a general manager 210, which receives the error code from the detector. With the error code the general manager 205 retrieves from a database 18 an error message and the Proposed course of action is sent to a graphic user interface (GUI) 215. The database can be any persistent repository, or non-volatile storage that stores information related to each of the sensors such as the breaker information (number, rating, type, etc), the load information, the panel information (number, location, manufacturer, etc), cable information, etc. The GUI 215 displays the information received and processed at the general manager 210 to a user. The GUI 215 also sends data input from the user. For each alarm or warning related to a anomaly or a failure, the system shows over the user device 115 screen of the GUI 215 a comprehensive written description of the anomaly and the related solution or the course of action to resolve/address the issue.

Figure 4:
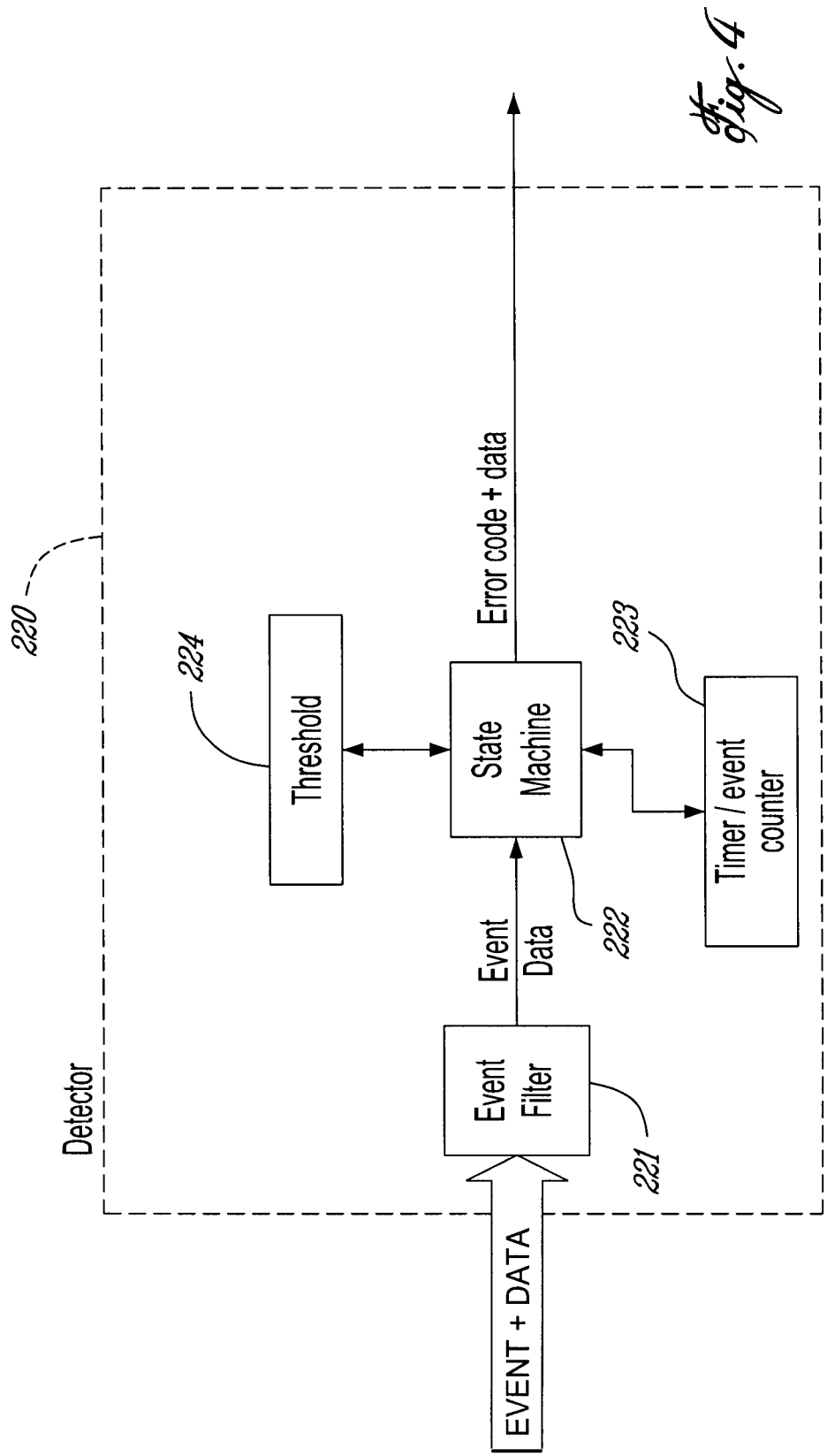
FIG. 4 is a block diagram of a detector of the control unit of FIG. 2 in accordance with an embodiment.

Reference is now made to FIG. 4, which is a block diagram of a detector 220 of the control unit of FIG. 3 in accordance with an embodiment. The control unit 11 comprises detectors that receive all the events at the same time. Each detector 220 has a different event filter 221 to receive events relative to its state machine 222. Some detectors may use a timer and/or an event counter 223. The state machine 222 verifies if a rule is violated using a threshold for that rule 224. In case of a rule violation, the detector 220 then sends an error code and any related data to the general manager 210.

A router 12 is connected to the control unit 11 via a Radio Frequency (RF) link or the like. The router can be an ethernet router, a hub, a switch, a wireless router or the like. All hubs are preferably linked to the user device 115 via a standard Ethernet network. The network can be built using wired or wireless interconnection. The router 12 is also connected to gateways 13. In FIG. 1, gateways 13 are directly connected to the router 12, and alternatively the gateways 13 may also be connected in series from one another.

The gateways 13 are connected to electrical panels (EP) like electrical panels EP1, EP2, EP3, EP4 and EP5, which are distributed within a building 20. Each electrical panel EP1, EP2, EP3, EP4, EP5 monitors and measures data to be are forwarded to a control unit 11. FIG. 1 shows one configuration of an electrical anomaly detection system. In the embodiment shown in FIG. 1, there are five electrical panels (EP1 to EP5) in building 2. Each electrical panel comprises sensors each connected to a gateway 13.

The gateways 13, the router 12 and the control unit 11 can be, for example, interconnected via cable, Wireless Fidelity (Wi-Fi), RF or any other medium using Ethernet protocol for example. The system can include sensors (C and V) in one or multiple buildings or the like. In another embodiment, the gateways 13 may have multiple branches with different types, sizes or sensor grades connected to it.

In the electrical panel, sensors 14 are typically daisy chained in groups, preferably of up to eight sensors. Those sensors are connected to a hub 13. The hub can manage up to, preferably, eight groups of eight sensors. The sensors 14, 15 and the hub 13 can communicate using different protocols. Examples of such protocols are CANOPEN 2.0, TCP/IP, TCP/MODBUS RS485 SERIAL/MODBUS.

The network 1 may comprise two types of sensors: current (C) sensors 14 and voltage (V) sensors 15, which are each identified with sensor unique ID. The current sensor 14 may be connected to each electrical line of the network 1 to perform current measurements on its associated line, as it will be described below. In one embodiment, a voltage sensor 15 is disposed at an electrical entry 3 of the electric supply network and performs voltage measurements. Current sensors 14 and voltage sensors 15 are connected to a gateway 13 to send measurement data to the gateway 13, the control unit 11. A single voltage (V) sensor 15 may be used in electrical connection with the EP2. In another embodiment, the voltage (V) sensor 15 may in fact be connected to any of gateway 13. The measurement data are then sent to the router 12 to be processed by the control unit 11. In another embodiment, the network 1 may comprise sensors of any type like voltage, current, temperature, pressure, etc. In yet another embodiment, the sensors can be any size such as two holes, three holes, etc. In yet another embodiment, the sensors can be of any grade (15 A, 30 A, 600V, etc.) can be connected to the same gateway 13.

The sensors 14, 15 are provided in different sizes, quantities of holes (1 to 4), type (current or voltage) and family (intrusive or nonintrusive). The sensors 14, 15 can be located anywhere over the electrical network. The sensors 14, 15 can be in the electrical panel, over a cable close to a motor or even in a machine tool to verify some solenoids.

The current sensor 14 can be similar to sensors described in U.S. Patent Pub. No. US 2006/0255793 A1, published on Nov. 16, 2006. The sensors used with the present invention are commercially available from Nuvolt Corporation Inc. under the brand SmartScan™.

SmartScan™ sensors are easily installed, as follows: select a SmartScan™ sensor having the same number of hole as the wired circuit, pass any wire through any hole of the sensor, connect the wire to the circuit breaker as usual and use the Ethernet cable to link the sensor to the hub or to the previously installed sensor. The monitoring system will automatically determine the configuration between the holes and conductors.

The SmartScan™ sensor technical specifications are as follows:

| | | | | | | |
|---|---|---|---|---|---|---|
| Current reading | 0-15 | 0-30 | 0-60 | 0-100 | 0-150 | 0-200 |
| Channel detection capacity | 0.15 A to 30 A | 0.3 A to 60 A | 0.6 A to 120 A | 1 A to 200 A | 1.5 A to 300 A | 1 A to 400 A |
| Number of input conductor | 1 to 4 | | | | | |
| Electrical network frequency | 50 Hz and 60 Hz | | | | | |
| Number of phases supported | 1 to 3, depending on the number of input conductors. (cannot support more phases then the number of holes) | | | | | |
| Differential detection | 10 mA and up | | | | | |
| FFT analysis | To the $16^{th}$ Harmonic | | | | | |
| ADC Resolution | 12 bits | | | | | |
| Analysis Bandwidth | 20 Hz to 1000 Hz | | | | | |
| Detection Bandwidth | 20 Hz to 100 000 Hz | | | | | |
| Temperature measurement range | −40° C. to 125° C. | | | | | |
| Operating temperature | −20° C. to 60° C. | | | | | |
| Temperature accuracy (typ.) | 2° C. | | | | | |
| Timestamp precision | 10 μS | | | | | |

The SmartScan™ maximum cable sizes are:

| Sensor model | AL | CU | |
|---|---|---|---|
| 15 A | 12 | 14 | AWG |
| 30 A | 8 | 10 | AWG |
| 60 A | 4 | 6 | AWG |

-continued

| Sensor model | AL | CU | |
|---|---|---|---|
| 100 A | 1 | 2 | AWG |
| 150 A | 3/0 | 2/0 | AWG |
| 200 A | 250 | 4/0 | AWG |

The SmartScan™ technical specifications for the communications interface are:

| | |
|---|---|
| Connector type | RJ45 |
| Cable type | Ethernet cable |
| Protocol | CAN 2.0 B (CANOPEN) |
| Communication type | Full duplex |
| Communication speed | 1 Mb/s |
| Power over Can | 48 VDC |

The SmartScan™ connector pinout for the sensor is as follows:

| PIN # | Name | Function | Description |
|---|---|---|---|
| 1 | CANH | I/O | High Bus |
| 2 | CANL | I/O | Low Bus |
| 3 | Reserved | TEST | TEST |
| 4 | VCC | POWER | Supply Voltage |
| 5 | VCC | POWER | Supply Voltage |
| 6 | GND | POWER | Ground |
| 7 | GND | POWER | Ground |
| 8 | GND | POWER | Ground |

The current sensor 14 is equipped with a processor like processing unit (CPU) that verifies a list of characteristics of the electrical circuit it monitors such as the voltage, current and harmonic content or the like. The current sensor 14 constantly analyses the electrical current on its associated conductors and sends a message to the software when any threshold is reached, a rule is broken or if periodic information is required by the control unit 11.

Figure 5:
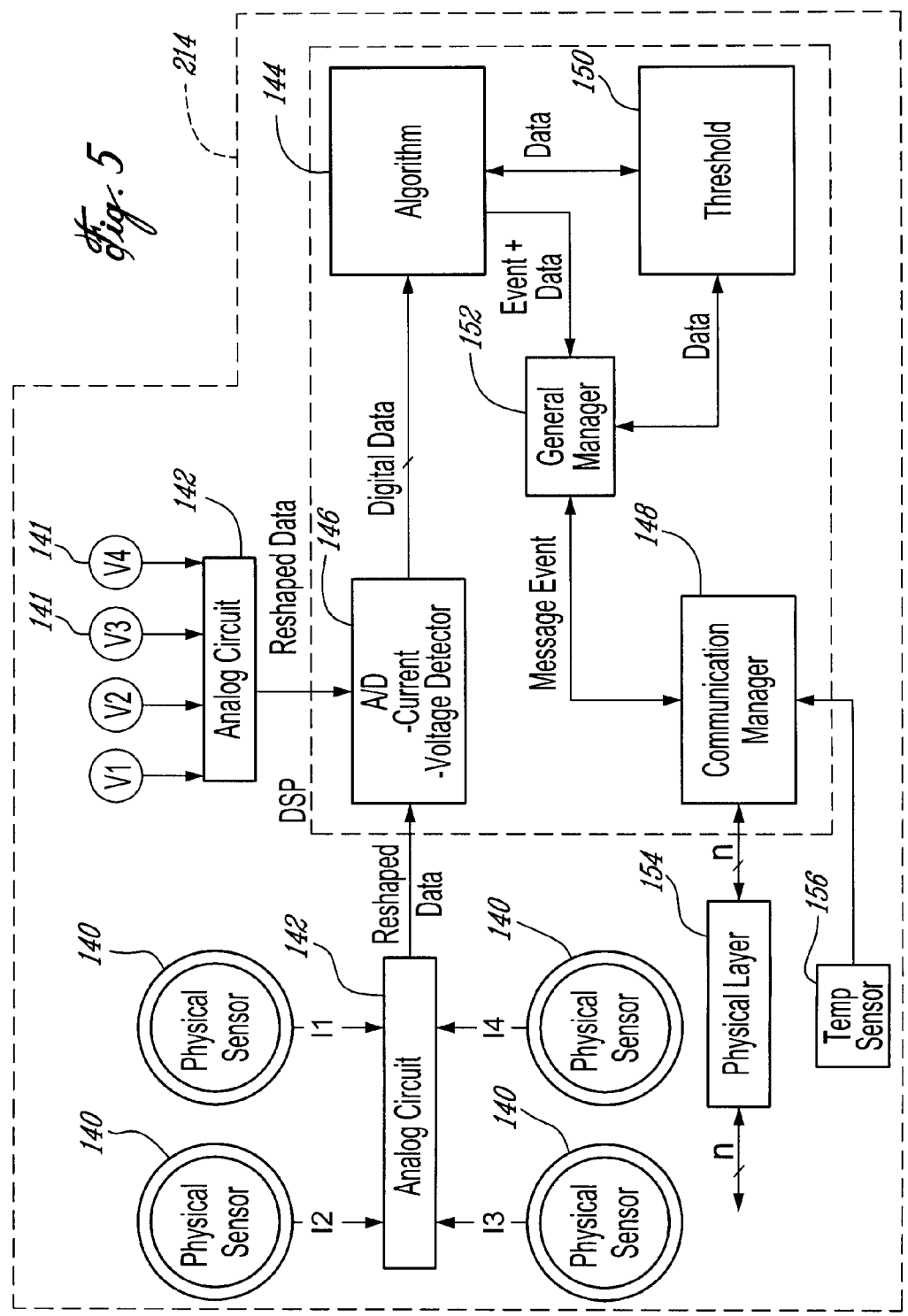
FIG. 5 is a block diagram of a current sensor of the electrical network of FIG. 1 in accordance with an embodiment.

Reference is now made to FIG. 5, which is a block diagram of a current sensor 14 of the electrical network 1 in accordance with an embodiment. The current sensor 14 is composed of physical sensor 140 where raw data 141 can be obtained from a conductor (not shown). The raw data pass through an analog circuit 142, which reshapes the raw data. The Analog/Digital converter (A/D) 146 receives the reshaped data and converts the data received into a digital signal. After the signal is converted into its digital signal, an algorithm module 144 extracts relevant measured value from the digital signal. The algorithm module 144 compares the relevant measured value to a threshold reference value in a threshold module 150. The algorithm module 144 detects an anomaly of the circuit state in the network 1 like passing from a normal operation of the circuit to an overload, or passing from an overload to a normal operation, a general manager 154 formats the algorithm information and sends it to the communication manager 148, which encapsulates or de-capsulates messages and data from the communication protocol. The current sensor 14 comprises a physical layer 152 which translates information for incoming/outgoing transmission, from a voltage level, for example a processor level, to another voltage level like a voltage level based protocol requirements and vice versa.

The current sensor can further comprise a temperature sensor 156 to determine the temperature of a monitored element.

In another embodiment, the one-hole current sensor 14 can be used in conjunction with other one-hole sensors over large conductor gauges. In yet another embodiment, the current sensor 14 will be able to operate with one or many empty holes. The system will determine that a hole is an empty hole when the load is in operation and no current flows through a specific hole. In yet another embodiment, sensors 14 can include more holes than the number shown in the embodiment of FIG. 5. A current sensor 14 that comprises a plurality of holes would comprise a corresponding number buses and lines to convey digital an analog data.

The current sensor 14 is mounted to a group of electrical conductors for monitoring electrical disturbances on the group of electrical conductors. In one embodiment, a current sensor 14 is mounted on two conductors corresponding to one phase and one neutral. In another embodiment, the current sensor is mounted up to four conductors corresponding to three phases and one neutral. The current sensor 14 typically measures the amplitude of the current (i.e. the 60-Hz component) on each conductor and the magnitude of at least the first current harmonic. In yet another embodiment, the current sensor 14 also measures the temperature of each conductor. In another embodiment, each current sensor 14 collects the measurement data and sends it to its associated gateway 13 which transmits it to the control unit 11.

The gateway 13 multiplexes measurement data and sends the multiplexed data to the control unit 11 in order to be processed and analyzed by the computer medium. If more information is needed by the control unit 11 to find a precise Diagnosis Condition, the control unit 11 may send commands to the sensors (C and V) to gather more information from sensors 14 and 15. The result of this analysis can be an error message, a warning message or an event message, and for each of these messages a course of action and/or solution may be provided, as it will be described below. In another embodiment, in the case of an error or a warning message, a local electrical network (LEN) manager may be advised. In yet another embodiment, these messages can be stored in the database 18.

As explained above, the control unit 11 receives data from the various sensors. When a sensor has detected a fault, the software via its connection to a database knows where the sensor is located in the electrical network. The control unit 11 also knows what kind of circuit the sensor interfaces with. Furthermore, as soon as a rule is broken, this identifies the fault and the course of action that should be applied. The identified course of action is sent to the LEN manager. The result of this analysis can be an alarm message, a warning message or an event message. Those messages are logged in a database (e.g. database 18). In the case of the alarm and the warning messages, the LEN manager is also advised. When the alarm or the warning message is resolved, the time and date of the resolution of the error is logged.

The message sent to the LEN manager typically takes the form of a dialog window that contains the following elements:

| | |
|---|---|
| Level | Each message may have one of the following levels, namely Critical, Warning or Event. |
| Circuit Number | The circuit number in the panel where the sensor is located. | c. a specific circuit, d. a specific panel, the number of times that an equipment starts, the power quality for a specific time.

| | |
|---|---|
| Electrical panel number | A LEN may comprise multiple electrical panels. This element indicates the number of the panel in cause. |
| Localization of the electrical panel | This field indicates where, in the facility, the panel in cause is located. |
| Name of the equipment | A name that describe the nature or the function of the equipment i.e. Vacuum Pump |
| Nature of the anomaly (Description) | This is the description of the anomaly observed on the LEN. |
| Proposed course of action (Solution) | This is the description of the course of action proposed by the system to resolve the anomaly and/or address the issue identified. |

Reference is made to FIGS. 1 and 2, where the control unit 11 is connected to a database 18. The database 18 stores the log of every event, message, warning or error. Attached with those events are all the data and the state of the sensors saved in the database. The history of every event helps to understand any past or upcoming problem. This tool can be used to analyze long term problem of temporary and not correlated problem.

Each element of the circuit is fully detailed, information about the element including: circuit ID, circuit name, panel ID, load type, conductor type, protection type, protection rating, equipment supplier.

Each time an event happens, the system builds a signature for the event. With sufficient history, the system is able to predict an equipment failure. Statistics are cumulated and include: the frequency of failure for a. an equipment type, b. a manufacturer equipment, c. a specific circuit, d. a specific panel, the number of times that an equipment starts, the power quality for a specific time.

The system analyses the electrical measurements provided by sensors distributed on critical portions of the electrical network 1 in order to detect network disturbances, equipment malfunctions or the like, and to identify the type of anomaly and prevent equipment breakdown with early detection of anomalies prior a failure occurs. When a user accesses the control unit 11 directly as described in FIG. 1 or remotely as described in FIG. 2, the user is provided with an applet or window from the GUI 215.

Figure 17:
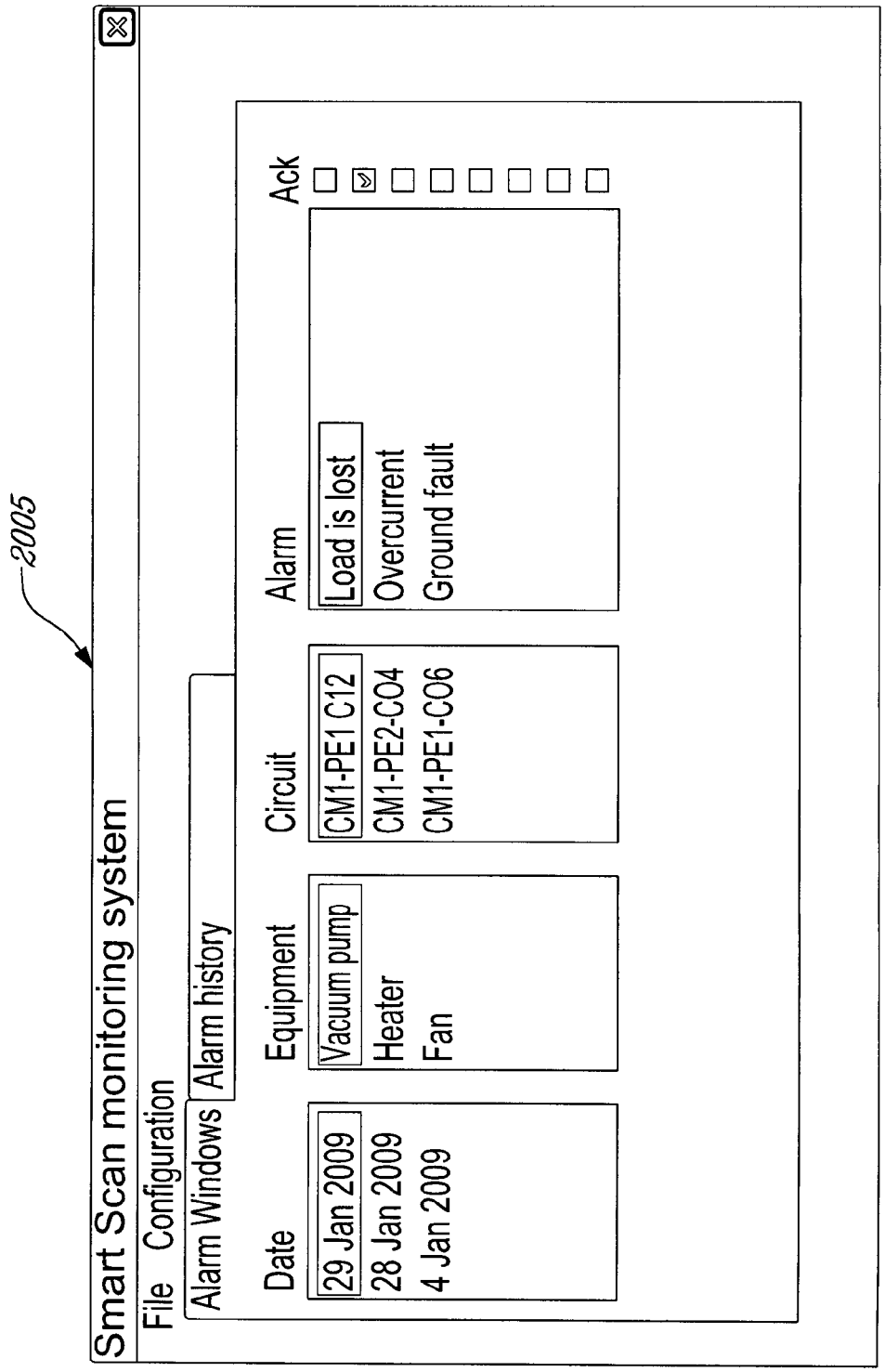
FIG. 17 illustrates a window of a graphical user interface in accordance with an embodiment.

Reference is now made to FIG. 17, which illustrates an example of a alarm screen window 2005 of the GUI 215. The alarm screen gives an overview of all active alarms. The alarms are preferably color coded and sorted by emergency level. The first alarm at the top is therefore preferably the most critical. Date for the first occurrence of the alarm, equipment, circuit breaker identification and alarm information fields are provided. An acknowledge checkbox can be used to allow a user of the GUI 215 to acknowledge having learned about the alarm.

Reference is now made to FIG. 18, which illustrates an image of a window 2010 of a graphical user interface in accordance with an embodiment. A user is provided with the history of alarms which comprises dates and times (appearance of event and disappearance of events), location, severity of event and description of an event. A check box can be used to allow the user to note an acknowledgement of the event.

The user may have access to more details on a particular event or alarm. This is illustrated in FIG. 19, which provides an alarm window 2015 of the GUI where messages, and recommended course of action and/or solutions, are provided to the user. Details on the location of the anomaly are given and the number of times the alarm has occurred since the first occurrence, namely the recurrence of an alarm, can also be provided to the user.

In order to perform monitoring and to obtain a network topology of sensors in the network 1, the user may access a particular window for the status of sensors. This is illustrated in window 2020 of FIG. 20. The location, electrical panel, circuit, description, sensor serial number, sensor firmware version number and status are shown for a refresh time and date shown at the bottom.

Figure 21:
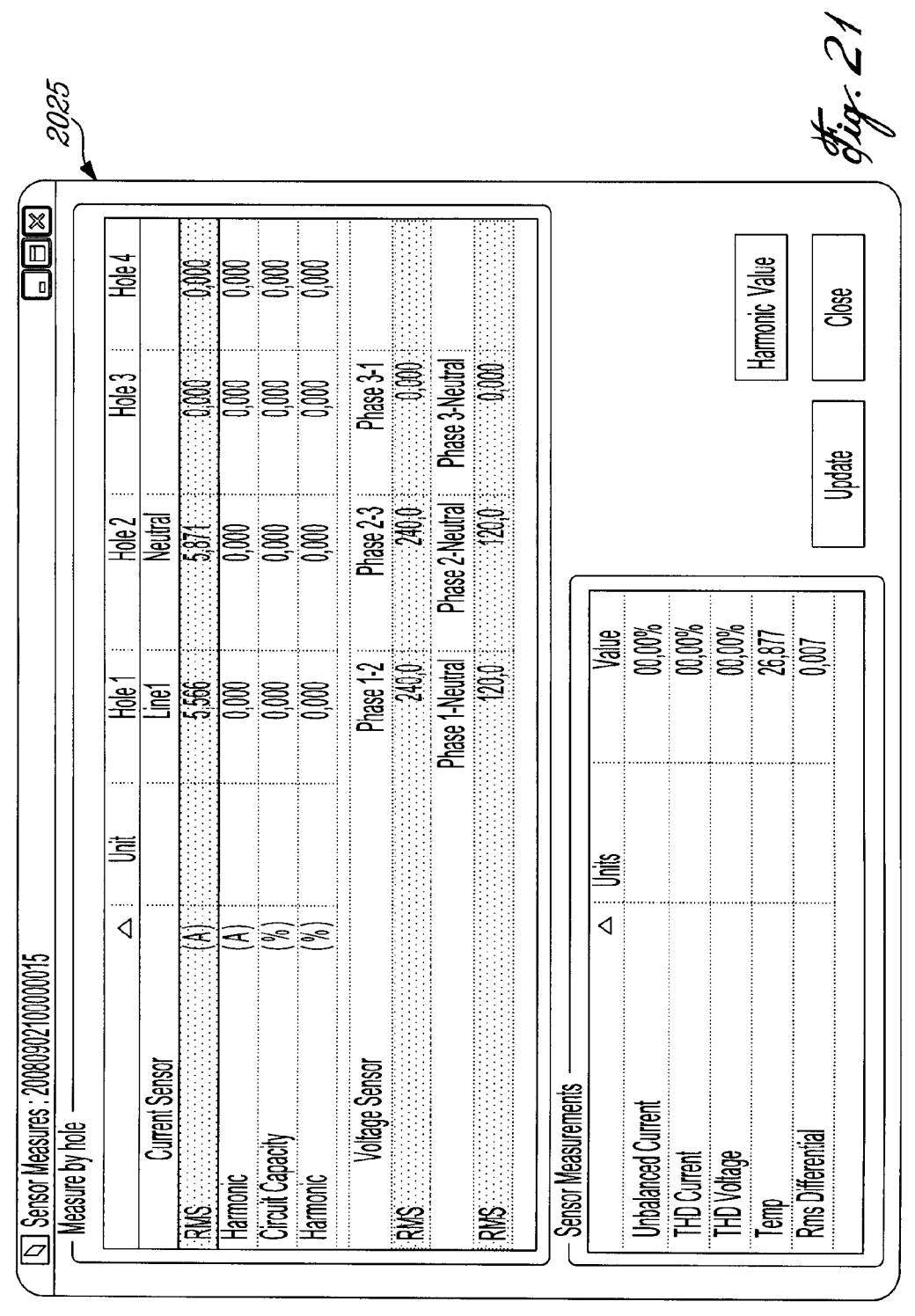

When clicking on a particular sensor listed, the real time sensor measurement data can be obtained in another window, as illustrated in the window 2025 of FIG. 21, the user may access the live measurements performed by a current or voltage sensor. Thus, the user may have access to the data of any conductor of the network. Phase to phase data and phase-neutral data are available.

Harmonic values can also be shown and compared to international standard thresholds.

As will be readily understood, windows (not shown) can be provided in GUI 215 to configure the system. Such windows include circuit management, panel configuration, user profiles, alarm profiles, equipment configuration, etc.

Figure 6:
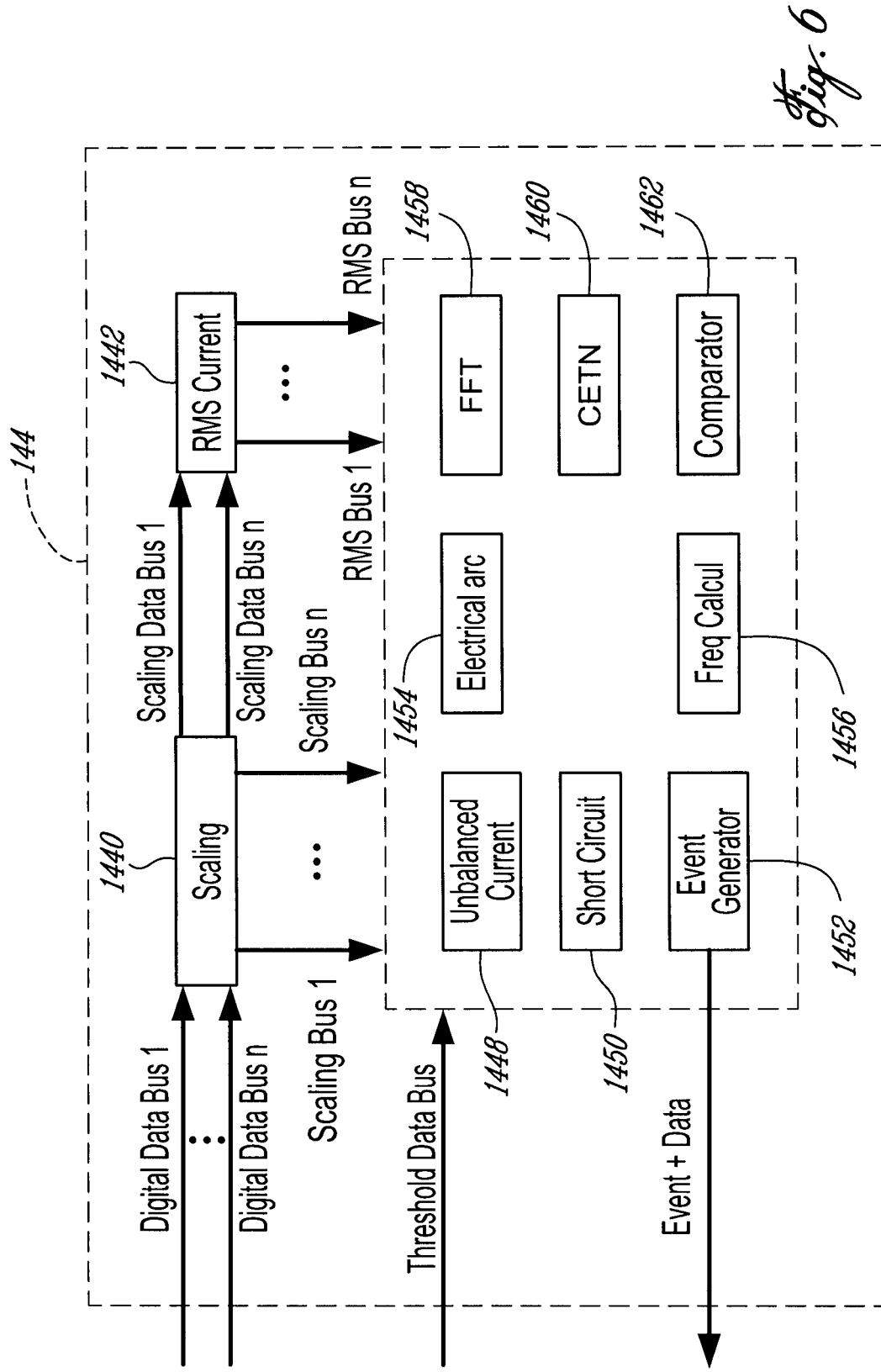
FIG. 6 is a block diagram of an algorithm module of the current sensor of FIG. 3 in accordance with an embodiment.

Reference is now made to FIG. 6, which is a block diagram of the algorithm module 144 of the current sensor 14 in accordance with an embodiment. The algorithm 144 may comprise various elements to perform various algorithms, as it will be described below. The algorithm module 144 receives data from the A/D 146, which are scaled by the scaling element 1440 before any element module of the algorithm module 144 can be able to process the data. The algorithm module 144 also calculates the Root mean square (RMS) version of the data. The algorithm module 144 may use the scaling data or/and the RMS version of the signal. In another embodiment, the elements may use threshold data to compare with its results. If a maximum or a minimum value of threshold is reached or if certain results are obtained, an event is created by an event generator 1452. The event generator 1452 sends events and their related data the control unit to be displayed to an end user. Events are generated by circuits integrated in the event generator 1452. In another embodiment, events are only generated when the state of the circuit has changed.

The following table provides a non-exhaustive list of events with associated definitions:

| Event Name | Definition |
|---|---|
| Arc | Detection of an electrical arc. |
| MarginalCircuit | Exceeding 80% of the circuit capacity. |
| OverloadCircuit | Exceeding 100% of the circuit capacity. |
| OverCurrentCircuit | Exceeding 200% of the circuit capacity. |
| CETN | The state codes indicate to the system the configuration of the wiring of the sensor. |
| ShortCircuit | A short-circuit has been detected. |
| FreqLow | This indicator is sent when the network frequency is lower compared to the nominal frequency. |
| FreqHigh | This indicator is sent when the network frequency is higher compared to the nominal frequency. |
| IDiff | Indicates a presence of a differential current. |
| LoadLost | Indicates a load loss. |
| LoadDetected | Indicates an electrical load. |
| CurrentDetected | Indicates presence of current. |
| VoltageDetected | Indicates the presence of voltage. |
| OverloadLoad | Indicates that the load is overloaded. |
| HighTemp | Indicates the temperature is over 40° C. (default threshold). |
| VeryHighTemp | Indicates the temperature is over 50° C. (default threshold). |

-continued

| Event Name | Definition |
|---|---|
| THD | Indicates a violation of the THD threshold. |
| UnbalancedCurrent | Indicates an unbalanced current. |

Figure 7:
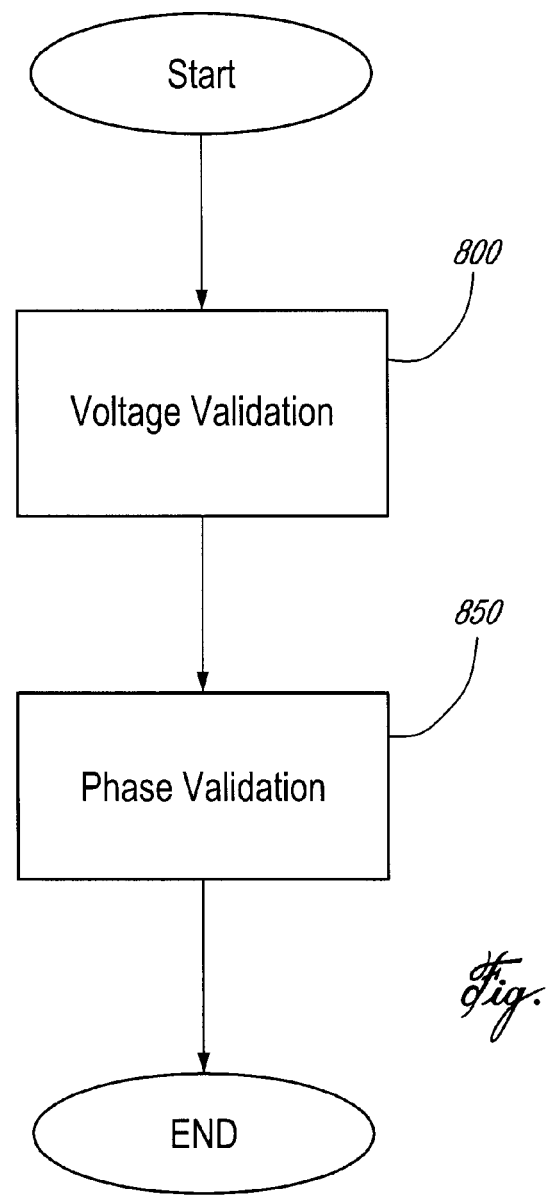
FIG. 7 is a flow chart for illustrating the operations performed by a CETN element of the algorithm module of FIG. 6 in accordance with an embodiment.

Reference is now made to FIG. 7 which is a flow chart for illustrating the operations performed by a CETN element 1460 in accordance with an embodiment. In the embodiment shown in FIG. 7, the CETN element 1460 allows an identification of conductors by the algorithm module 144. The algorithm module 144 identifies the nature of the conductors passing through the current sensors 14. In another embodiment, the algorithm module identifies the type of electrical network when connected to the voltage sensor 15. During the identification of a conductor, a voltage validation and a phase validation is performed according to 800 and 850 to identify the conductors of the network 1 and thus determining a network topology. These are to determine, in a case of an incorrect installation, the location of the error. This procedure also verifies that the network works properly to prevent any damage to any electrical equipment.

Figure 8:
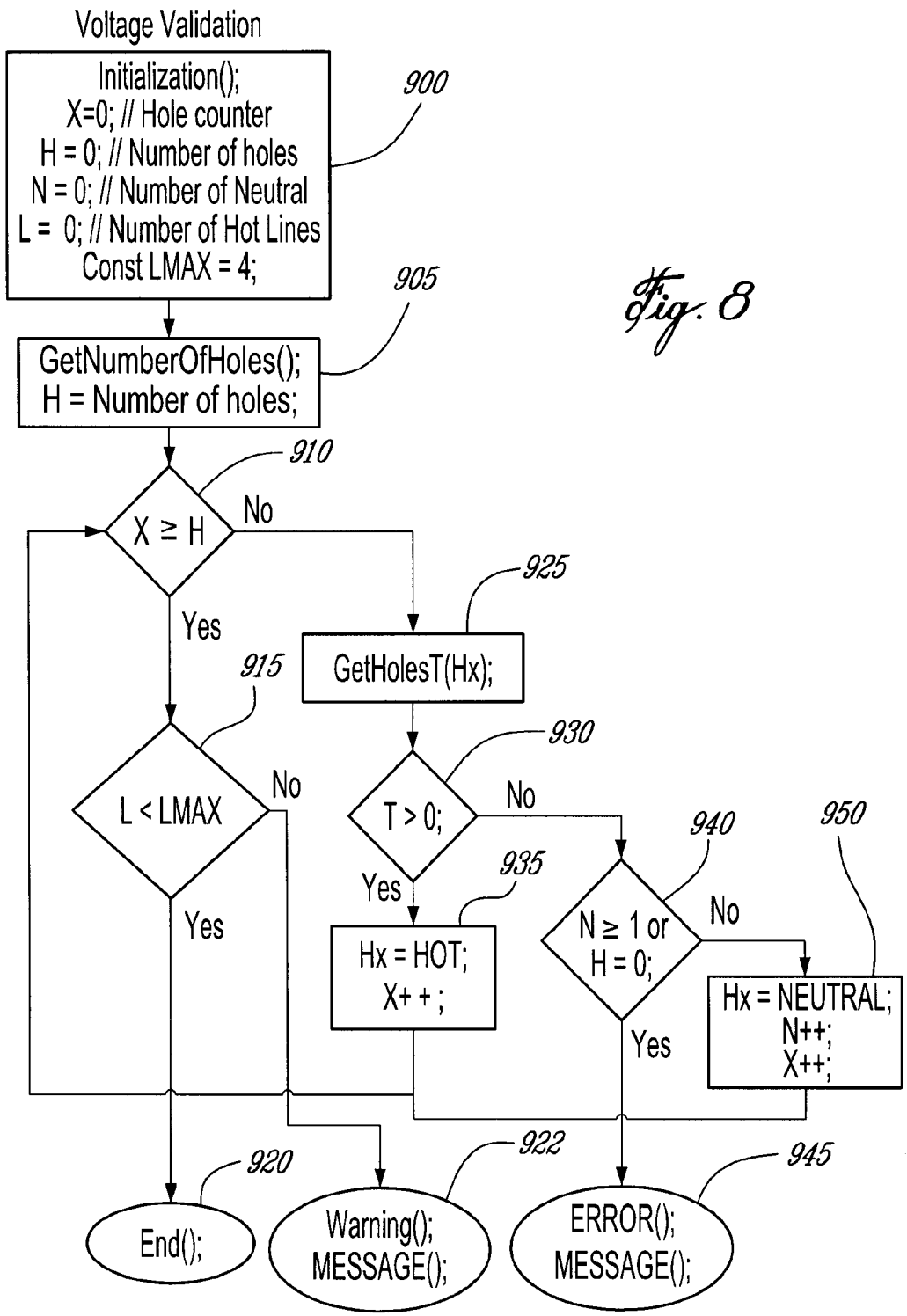
FIG. 8 is a flow chart of a procedure to perform voltage validation to be executed by the algorithm module of FIG. 6 in accordance with an embodiment.

Reference is now made to FIG. 8 which is a flow chart of a procedure to perform voltage validation to be executed be the algorithm module 144 in accordance with an embodiment. During this procedure, when an anomaly or error in the system is detected a CETN code is sent to the control unit 11. The code corresponds to an error message and a recommended course of action and/or solution.

According to 900, the algorithm module 144 initializes the counters. Thus the counters for the hole, the counter for the number of holes, the counter for the number of neutral wire, the counter for the number of active wires are initialized.

According to 905, the voltage the algorithm module 144 verifies the configuration of the wiring of the current sensors 14, and the algorithm module 144 retrieves the number of holes for the current sensors 14.

According to 910, the holes counter is compared with the number of holes, if the counter is equal or greater than the number of holes, then it is determined, at 915, if the number of active wires is smaller than the maximum number of active wires, namely 4, and if so, that the system is normal according to 920. Otherwise, according to 922, if the minimum requirements are not met the system issues a warning message.

According to 925, if the holes counter is less than the number of holes, the voltage information of the holes is measured. According to 930, if the hole has a voltage presence, it is considered as an active wire and the counter is increased, at 935. According to 940, if the hole has no voltage, it is verified if there is already a neutral wire or if the number of hole is equal to zero. According to 950, if there is no neutral wire or if the number of hole is equal to zero, the neutral status is assigned to the hole and the neutral counter and the holes counter are incremented. According to 945, if there is already a neutral and a second neutral is detected, there is an installation error.

Figure 9:
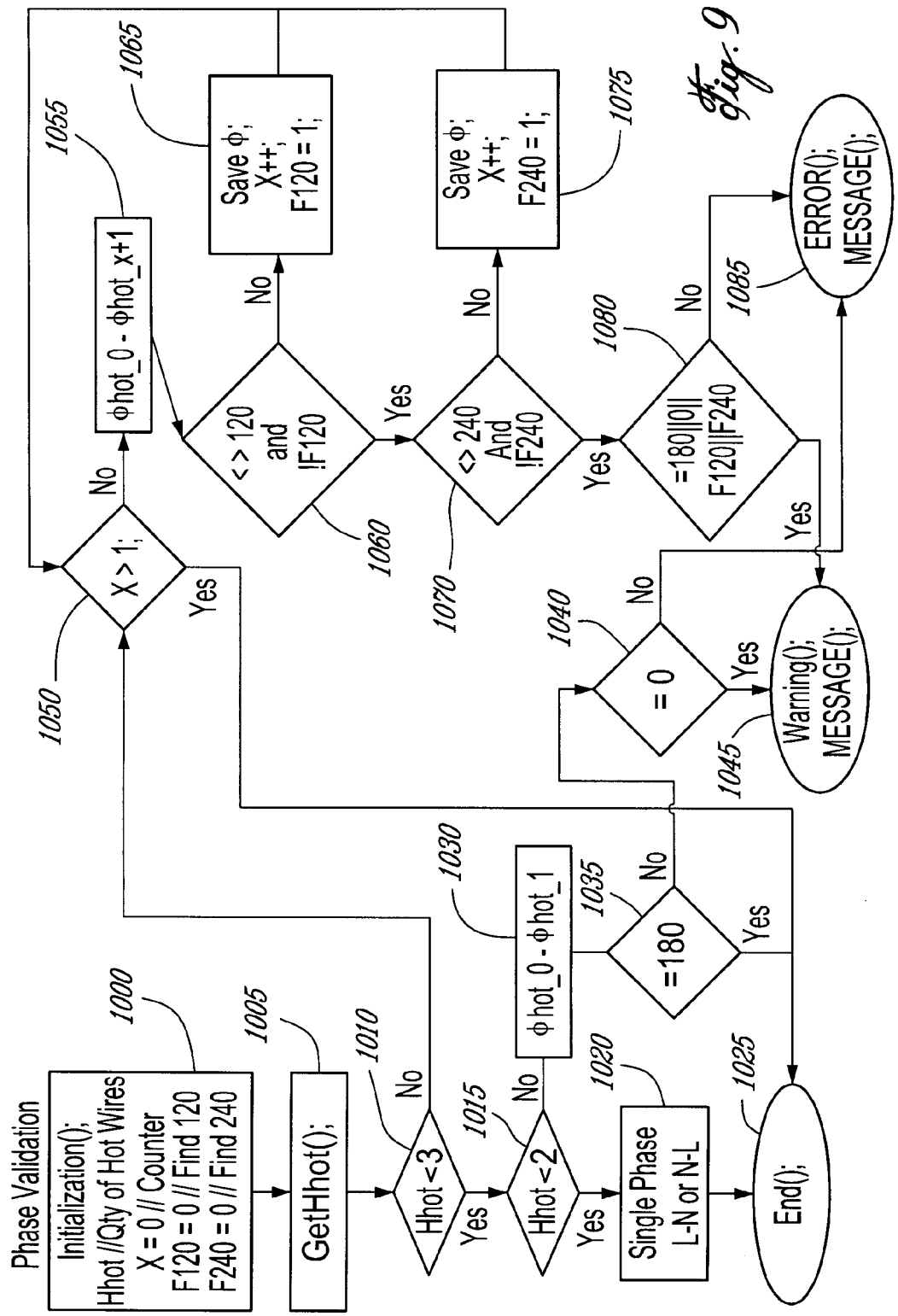
FIG. 9 is a flow chart of a procedure to perform phase validation to be executed by the algorithm module of FIG. 6 in accordance with an embodiment.

Reference is now made to FIG. 9, which is a flow chart of a procedure to perform phase validation to be executed the algorithm module 144 in accordance with an embodiment. The algorithm module 144 verifies, depending on the configuration, if the phase shift is standard. The phase validation verifies and validates the type of network.

According to 1000, the algorithm module 144 initializes the counters. Thus, the counters for the hole, the counter for the number of holes, the counter for the number of neutral wire, the counter for the number of active wires are initialized.

According to 1005, the algorithm 144 retrieves the number of Hots (active wires) to determine if the system is a single-phase or a three-phase system. According to 1050, in a case of a three-phase system, it is verified if the counter of hole is greater than one. According to 1055, the algorithm module 144 verifies whether each phase has a 120° or a 240° phase shift. The comparison is done by determining the difference between each of the phase one to another. For example, according to 1060, the subtraction 1 is made between phase 1 and phase 2, according to 1060 a subtraction 2 is made between phase 1 and phase 3, according to 1070 a subtraction 3 is made between phase 2 and phase 3. For each of 1060, 1070, and 1080, when the result is a 120° phase shift, the hole counter is incremented. If not, according to 1045, there is a phase anomaly and an error message is issued and sent to the control unit 11 and 1085.

According to 1015, if there are less than two (2) Hots, the system is a single-phase system. According to 1015, the system is evaluated if it is a phase-phase by determining whether the number of Hots is less than two. According to 1020, if it is the case, the system is a phase-neutral system and no phase shift is needed. According to 1030, the algorithm 144 verifies whether the system is a phase-phase system. According to 1035, a subtraction is performed by the algorithm module 144 using the two phases to determine if the system has a 180° phase shift. Should that be the case then the system is normal, according to 1025. Otherwise, according to 1040, the algorithm 144 determines whether the phase shift the phase shift is between 0° and 180°. According to 1085, if the phase-shift is 0, there is a phase anomaly and an error message is issued. According to 1045, if the phase-shift is 0° a warning message is issued.

Figure 10:
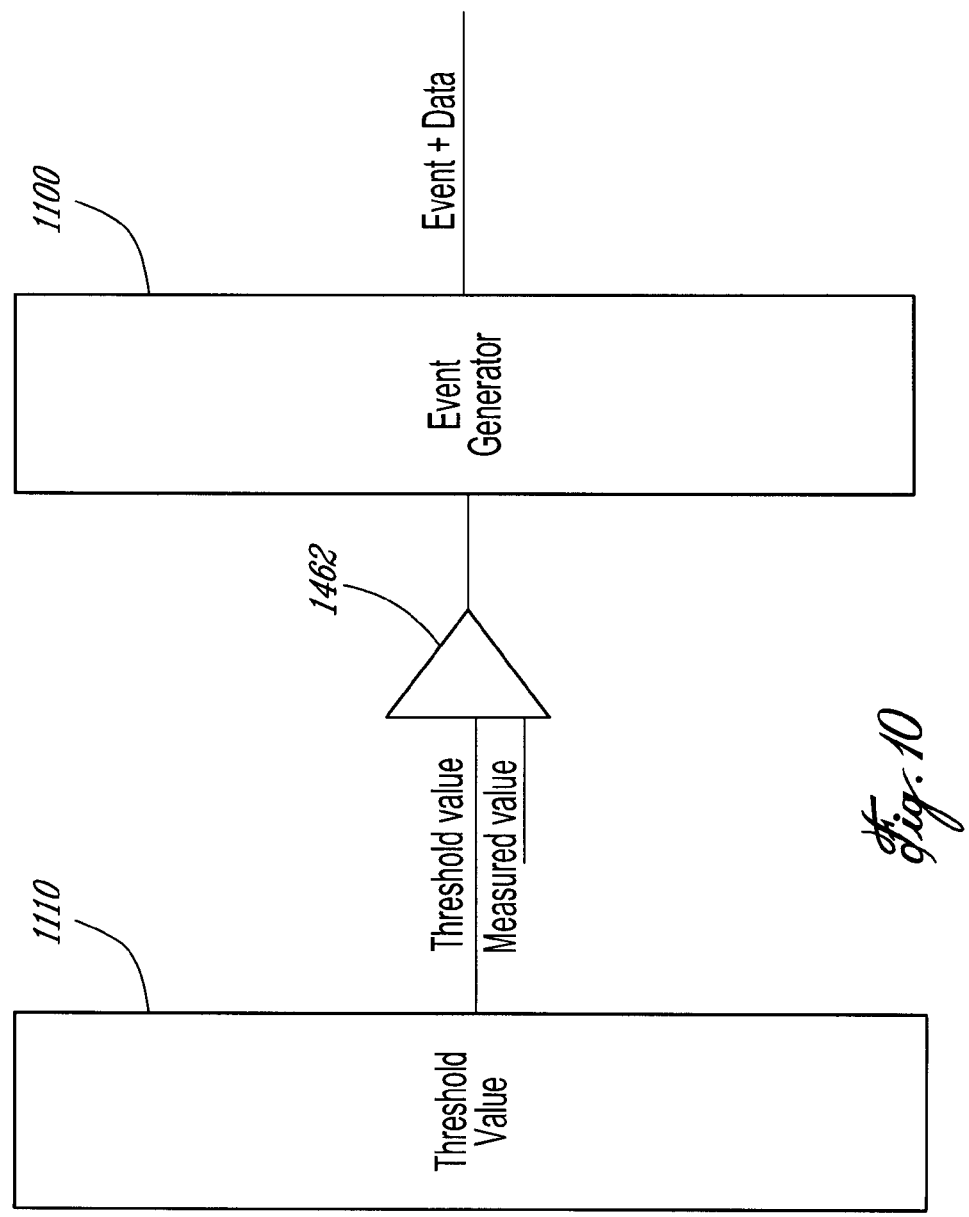
FIG. 10 is a schematic view a comparator of the algorithm module of FIG. 6 in accordance with an embodiment.
Figure 11:
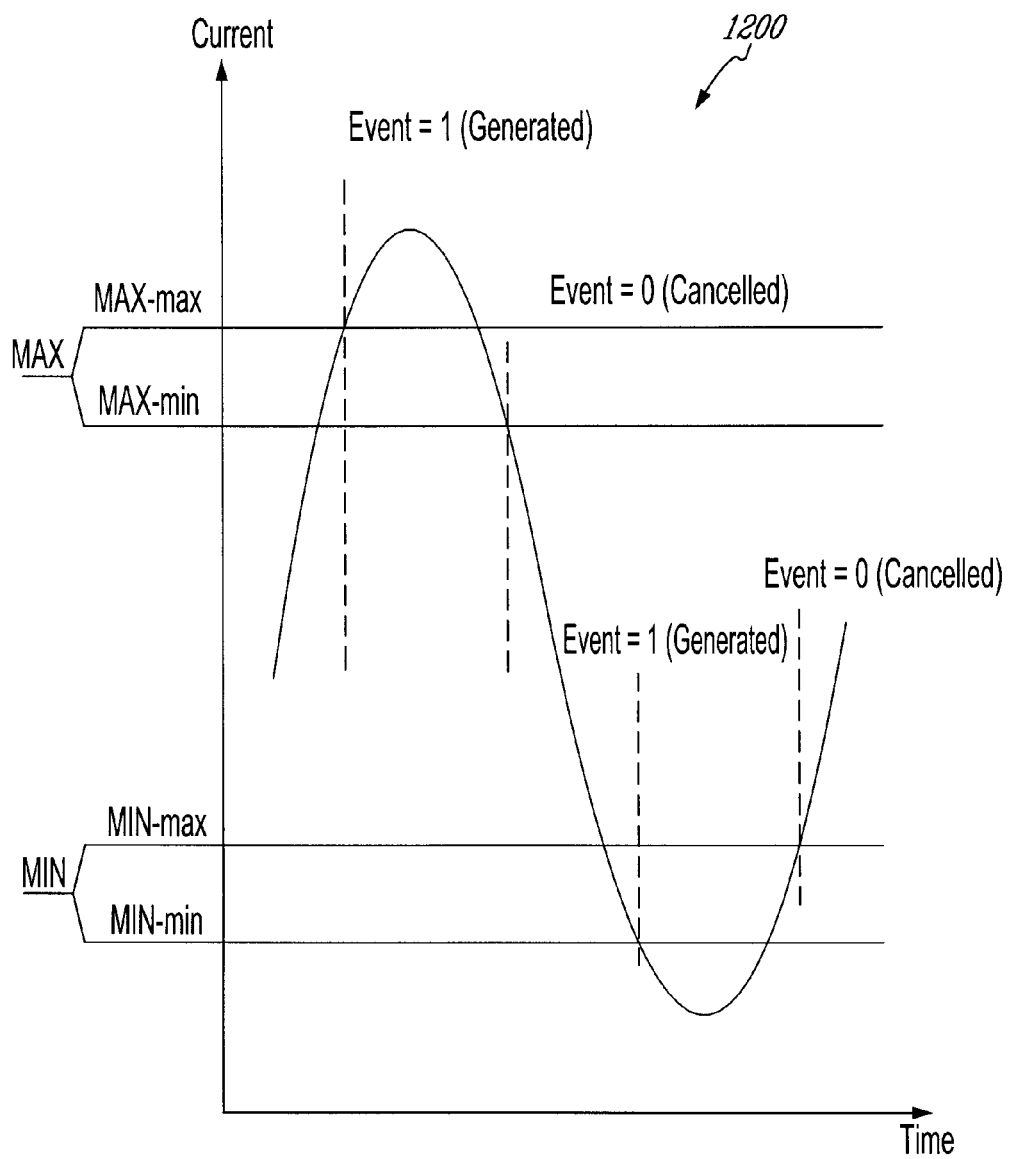
FIG. 11 is a diagram that represents thresholds to determine whether an event is detected by the comparator of FIG. 10 in accordance with an embodiment.

Reference is now made to FIG. 10, which describes a schematic view a comparator element 1462 in accordance with an embodiment. Reference is also made concurrently to FIG. 11, which is a diagram that represents thresholds to determine whether an event is detected by the comparator 1462 in accordance with an embodiment. The comparator element 1462 receives scaled data and is verifies if a threshold has been exceeded. Thresholds are programmable and can be stored in a threshold repository 1110, which can be located, for example, in the database 18. For each threshold value, there is a MAX and/or a MIN value. For MAX and MIN values, there is a corresponding hysteresis diagram 1200, as shown on the embodiment of FIG. 11. When the signal or measured value exceeds the MAX value, an event is generated. The event is cancelled and when the measured value passes under the MAX–min value. For the MIN value, the event is generated when the signal value is lower than the MIN–min and is cancelled when the value of the signal is higher than the MIN–max value. The definition of the threshold is based either on electrical codes, on manufacturer data or on safety.

The following table provides a list of non-exhaustive thresholds along with their definition:

| Threshold name | Definition |
|---|---|
| HighTemp-thld | Default value is 40° C. Beyond this temperature equipment is in jeopardy. |
| VeryHighTemp-thld | Default value is 50° C. Equipment has reached a temperature range where permanent damage occurs and action needs to be taken immediately. |
| MarginalCircuit-thld | By regulation, circuit load must not exceed 80% of the circuit capacity. Default value is 80% of the circuit capacity. |

-continued

| Threshold name | Definition |
| --- | --- |
| OverloadCircuit-thld | Exceeding 100% of the circuit capacity is forbidding by regulation. Default value is 100% of the circuit capacity. |
| OverCurrent-thld | Exceeding 200% of the circuit capacity. Default value is 200% of circuit capacity. |
| OverloadLoad-thld | Depending on the nominal current of the motor, this will be "x" percent more than 100% of the nominal motor current. Default value is 115% of the motor nominal current. |
| LoadDetected-thld | Depending on the nominal current of the motor, this will be "x" percent of the nominal motor current. Default value is 10% or 100 mA. |
| CurrentDetected-thld | Depending of the noise level, the threshold will has low it's can be. Default value is 100 mA. |
| IDiffDetected-thld | Indicates a presence of a differential current. To protect the animal, the default value is 50 mA. |
| IDiffHfDetected-thld | Indicates a presence of a high frequency differential current. To protect the animal, the default value is 50 mA. |
| THD thld | As per international convention. |

Figure 12:
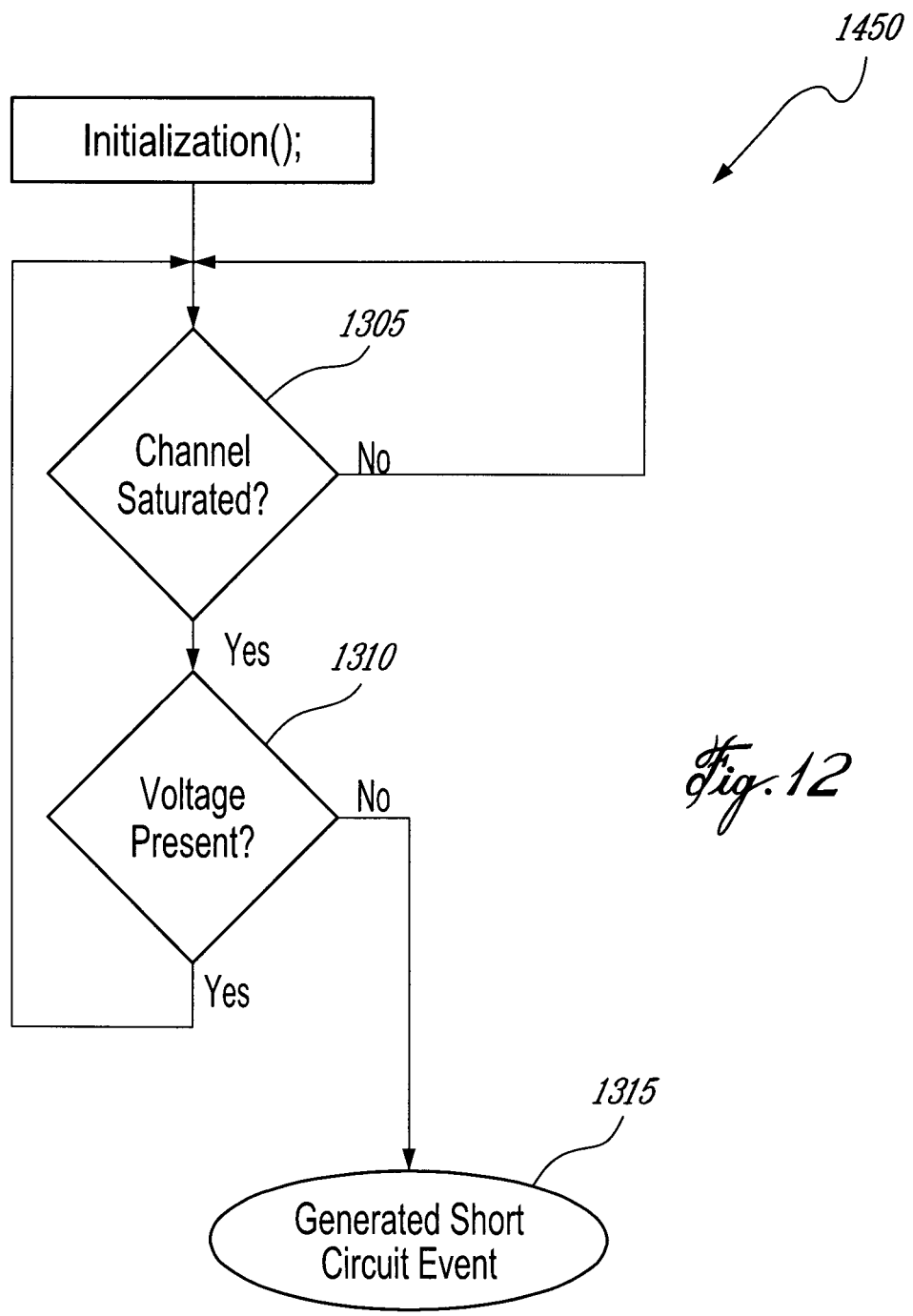
FIG. 12 is a flow chart of the operation performed in a short circuit element in the electrical network of FIG. 1 in accordance with an embodiment.

The algorithm module 144 comprises a short-circuit element 1450 is to detect a short circuit in the network 1. Reference is now made to FIG. 12, which is a flow chart of the operation performed in the short circuit element 1450 in the electrical network 1 in accordance with an embodiment. The short circuit 1450 can generate, for example, 75 A to 10 000 A or more. Such level of current may overload a channel. According to 1305, the short-circuit element 1450 verifies if the channel is saturated. According to 1310, if at 1305 saturation is detected, the voltage presence is tested. According to 1315, if no voltage is present, this indicates the presence of a short-circuit.

The algorithm module 144 comprises an unbalanced current element 1448, which is applied only to three-phased circuit. The unbalanced element, verifies if a circuit is unbalanced. This is determined when detecting that Maximum deviation from the average divided by the average, for example, with measurements of 65 A 75 A 79 A. The current average is 73 A and the maximum deviation from the average is 8 A (73−65=8 A, 75−73=2 A and 79−73=6 A). As a results, the unbalanced result is 8 A/73 A=11%. In this embodiment, the threshold to send an alarm could be 2% and beyond 5%, the load should be shed immediately before damage occurs to the equipment.

The algorithm module 144 comprises a FFT element 1458, a FFT (Fast Fourrier Transform) computes the DFT (Discrete Fourrier transform) and produces exactly the same result as evaluating the DFT definition directly; the only difference is that a FFT is much faster. The formula below is to illustrate the idea of implementation but not necessary the selected implementation. The implementation can be done with the matlab library for TI DSP.

$$X_k = \sum_{n=0}^{N-1} x_n e^{-\frac{2\pi i}{N}nk}$$

$$k = 0, \ldots, N-1.$$

The algorithm module 144 comprises a FreqCalcul element 1456 calculates the frequency of the signal. If the frequency is higher or lower than the nominal frequency (60 hz or 50 hz depending where you are), an event is generated. The voltage detector signal is used to calculate the frequency. The voltage detector produces a square-wave signal and calculates the number of uppers and lowers samples. The addition of both indicates the frequency. Theses samples information also indicates the signal symmetric when comparing of the upper and the lowers samples.

The algorithm module 144 comprises an electrical arc element 1454. The electrical arc element 1454 is a chaotic signal. The electrical Arc Bloc subtracts the current cycle from the next cycle to isolate the electrical arc from the power signal. The result for each sample is stored in a vector memory. After a number of cycles such as five cycles, the standard deviation on the vector is performed. The trend of the standard deviation indicates if an electrical arc is present or not.

Figure 22:
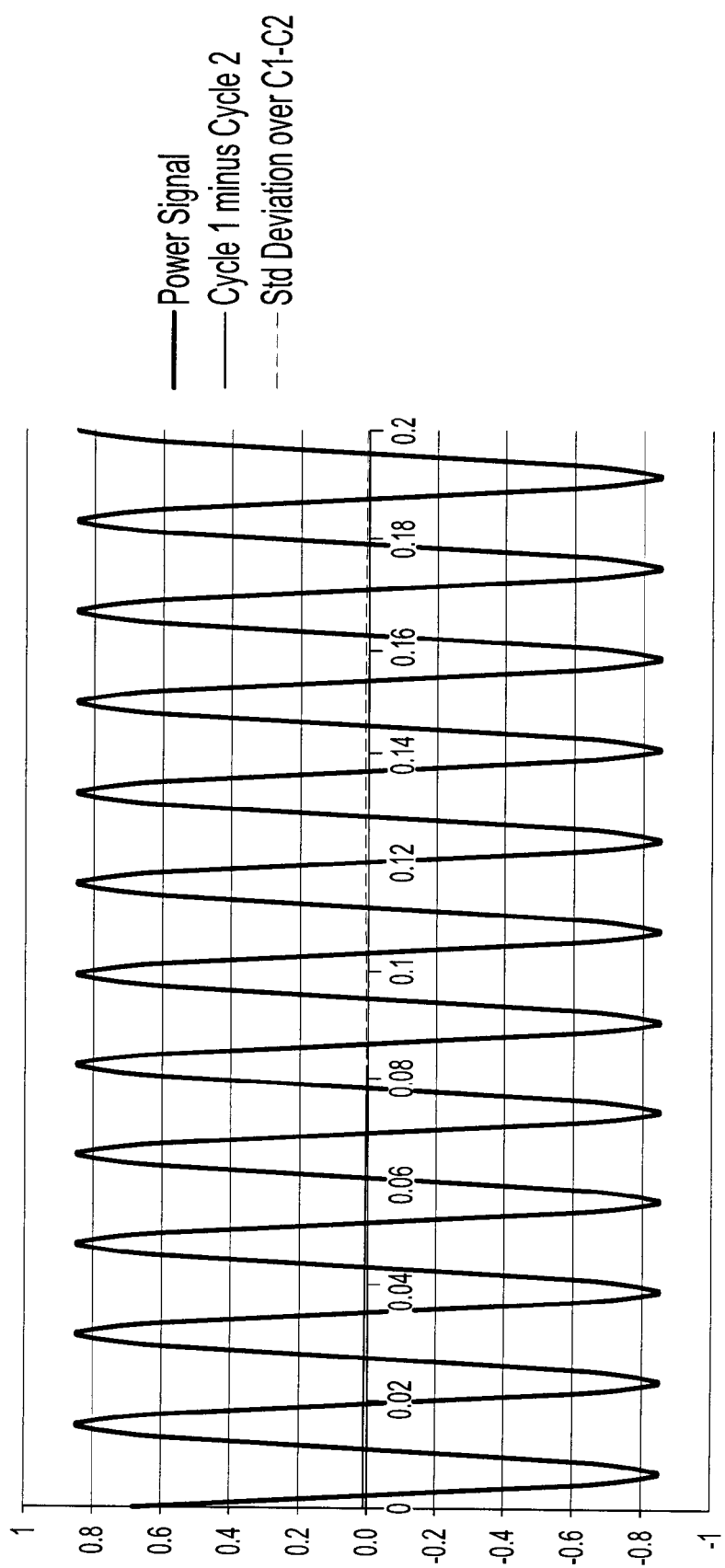
FIG. 22 illustrates an example power signal, subtracted signal (cycle 1 minus cycle 2) and standard deviation signal over C1–C2, for which there is no electrical arc.

A power signal which does not comprises an electrical arc is symmetrical, as shown in FIG. 22 as the sine curve for an example application. When the current cycle is subtracted from the previous cycle, the result should be 0. However, because of noise and other system characteristics, there is typically a residual small noise value. In FIG. 22, the example application does not have an electrical arc and the subtracted cycle is very close to 0 and the standard deviation on the subtracted cycle is constant and of a value of about 0.

Figure 23A:
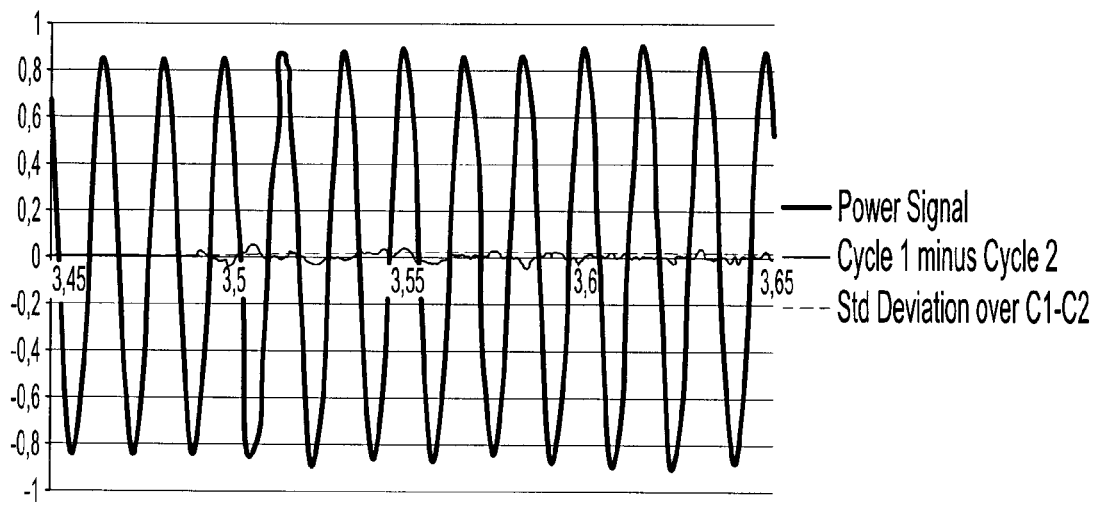
FIG. 23a is an example power signal, subtracted signal (cycle 1 (C1) minus cycle 2 (C2)) and standard deviation signal over C1–C2, for which there is an electrical arc present
Figure 23B:
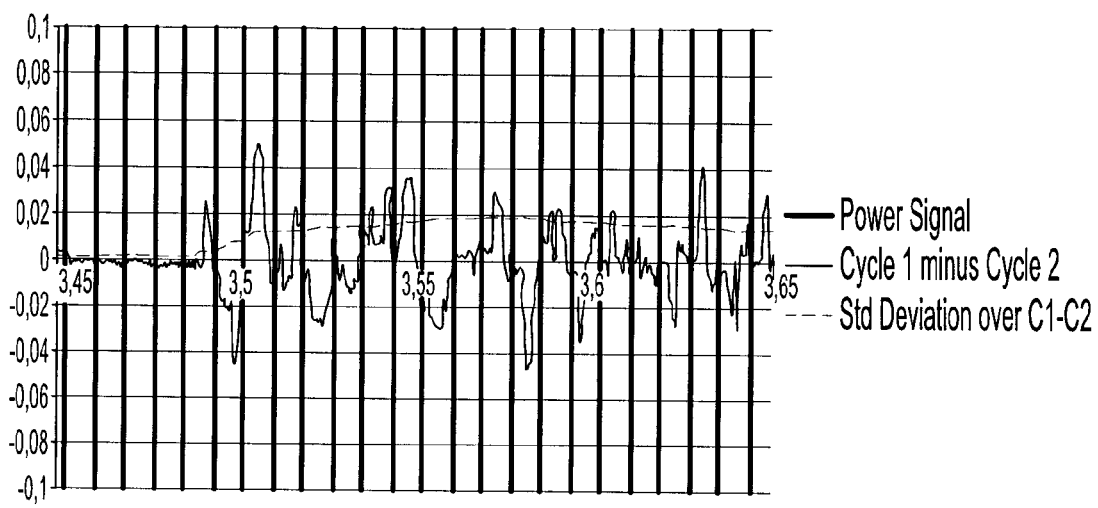
FIG. 23b is a zoomed-in version of FIG. 23a to show the standard deviation amplitude variations in more detail.

FIG. 23*a* is an example power signal, subtracted signal (cycle 1 (C1) minus cycle 2 (C2)) and standard deviation signal over C1–C2, for which there is an electrical arc present and FIG. 23*b* is a zoomed-in version of FIG. 23*a* to show the standard deviation amplitude variations in more detail. When an electrical arc is present in the power signal, the electrical arc is added to the residual noise value to create a non-regular, ie chaotic, signal. The standard deviation of the subtracted signal therefore varies over time and is non-zero. In FIG. 23*a*, the example application has an electrical arc from a time of about 3.48 sec. The power signal shows a slight variation in amplitude from that time, the subtracted cycle (current cycle minus previous cycle—C1–C2) shows a chaotic signal and the standard deviation over the subtracted cycle shows a varying non-zero value.

Mathematically, in order to detect an electrical arc on the measured data by the sensor, the following steps are carried out. All subtractions are done point-by-point on measured signals for which a constant number of acquisition points are acquired by an Analog to Digital Converter (ADC).

A half-cycle preprocessing is optional and occurs prior to the other calculations. It is a half-cycle slip. The current half-cycle is subtracted from the previous half-cycle. The result is a subtracted half-cycle. The process is repeated with the next two current and previous half-cycles. The two subtracted half cycles are cumulated to obtain a full subtracted cycle.

Then, a subtraction method is used to determine the presence of an electrical arc. Three example alternative methods are described herein.

The first method is the average cycle slipping method. The average signal for a number of cycles is done. Typically, 5 cycles are used. The result is an average cycle (or reference cycle). This average cycle is then subtracted from future cycles. Typically the five next cycles are used. Each newly acquired cycle is subtracted by the average cycle. The subtraction result is kept in a vector. The results are cumulated for the five next cycles. The standard deviation is performed on the vector. The standard deviation is compared to a pre-determined standard deviation threshold. If the calculated standard deviation on the vector is greater than the pre-determined standard deviation threshold, there is an electrical arc anomaly. In the example application of FIG. 22*c*, if a standard deviation threshold of 0.01 is used, the electrical arc will be detected.

The second method is the slipping cycle method. Two cycles are cumulated in memory. The oldest cycle is subtracted from the current cycle. The result of the subtraction is kept in a vector. The results are cumulated over five cycles. When a new cycle is acquired, the oldest kept cycle is deleted. The current cycle from the previous acquisition becomes the oldest cycle and the current cycle from the current acquisition is the new current cycle. Therefore, the subtraction formula is SC=C(X)−C(X+1) where X is the number of the cycle, C is a cycle and SC is a subtracted cycle. Each acquired cycle is therefore used twice, once as the oldest cycle and once as the current cycle. The standard deviation is performed on the vector. The standard deviation is compared to a pre-determined standard deviation threshold. If the calculated standard deviation on the vector is greater than the pre-determined standard deviation threshold, there is an electrical arc anomaly.

The third method is the cycle pairs method. Two cycles are cumulated in memory. The oldest cycle is subtracted from the current cycle. The result of the subtraction is kept in a vector. The results are cumulated five times. Two new cycles are acquired for each subtraction, a cycle is only used for one subtraction. Therefore, the subtraction formula is SC=C(2*X)−C(2*X+1) where X is the number of the cycle, C is a cycle and SC is a subtracted cycle. The standard deviation is performed on the vector. The standard deviation is compared to a pre-determined standard deviation threshold. If the calculated standard deviation on the vector is greater than the pre-determined standard deviation threshold, there is an electrical arc anomaly.

Figure 13:
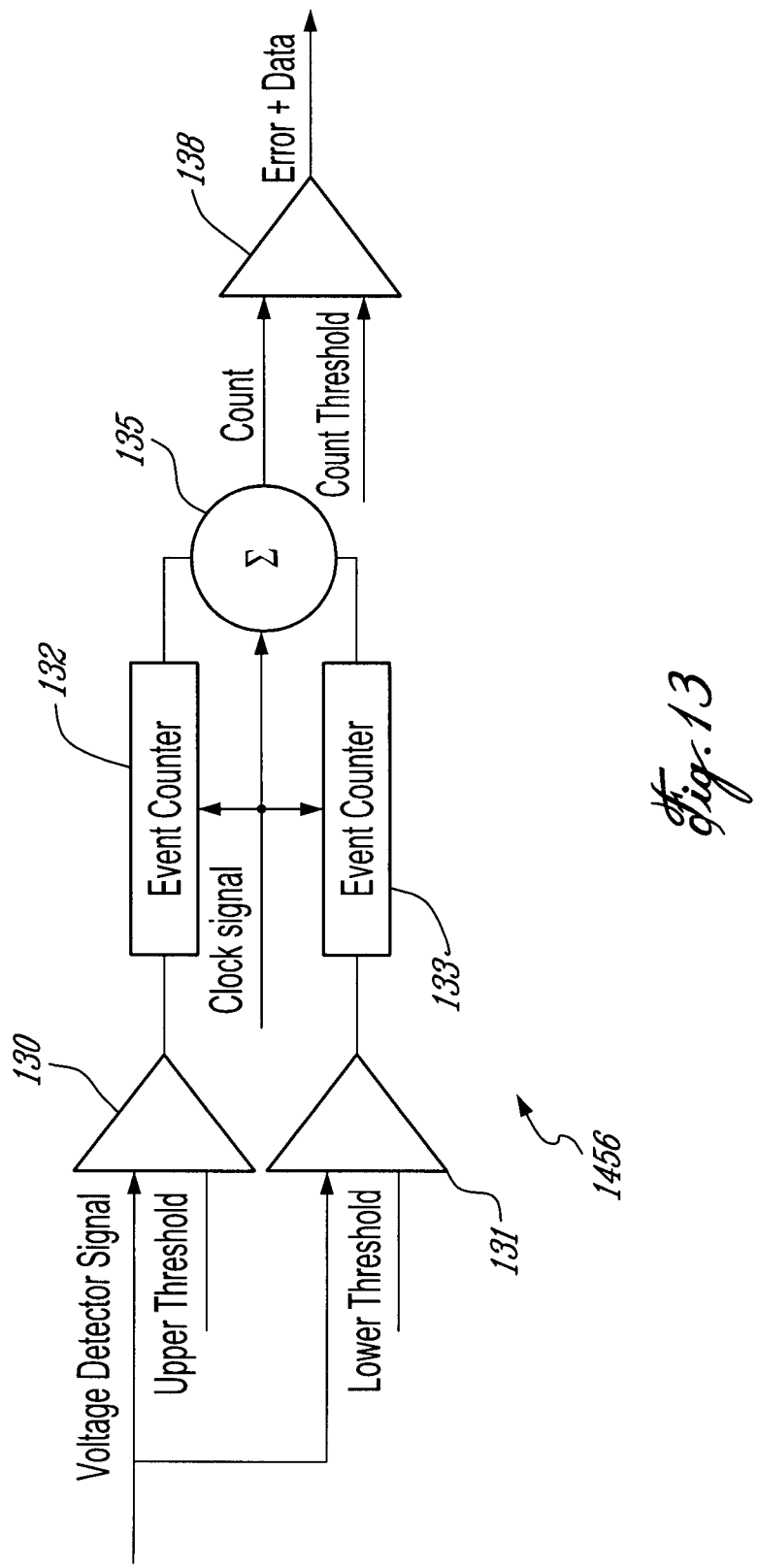
FIG. 13 is a block diagram of an electrical circuit for counting event occurring in the electrical network of FIG. 1 in accordance with an embodiment.

Reference is now made to FIG. 13, which is a block diagram of an electrical circuit of the Frequency calculation element 1456 for counting event occurring in the electrical network 1. Whenever the voltage detector signal exceeds the upper or the lower threshold, a corresponding counter is incremented. Each counter 132 and 133 are incremented using a corresponding comparator 131, 132. After a determined period of time, the electrical circuit adds and subtracts the upper and the lower counter. The addition of the lower and the upper counter in a clock 135 gives the period of the signal. This period is compared to the count threshold to verify of the signal period is according to a given standard. A comparator 138 verifies the difference of the upper and the lower counter and determines whether the signal is symmetrical. The result for a symmetrical signal is zero. Counters are reinitialized after a determined period of time. Any deviation of the result of the addition or the subtraction, generates an error code plus the related data.

Figure 14:
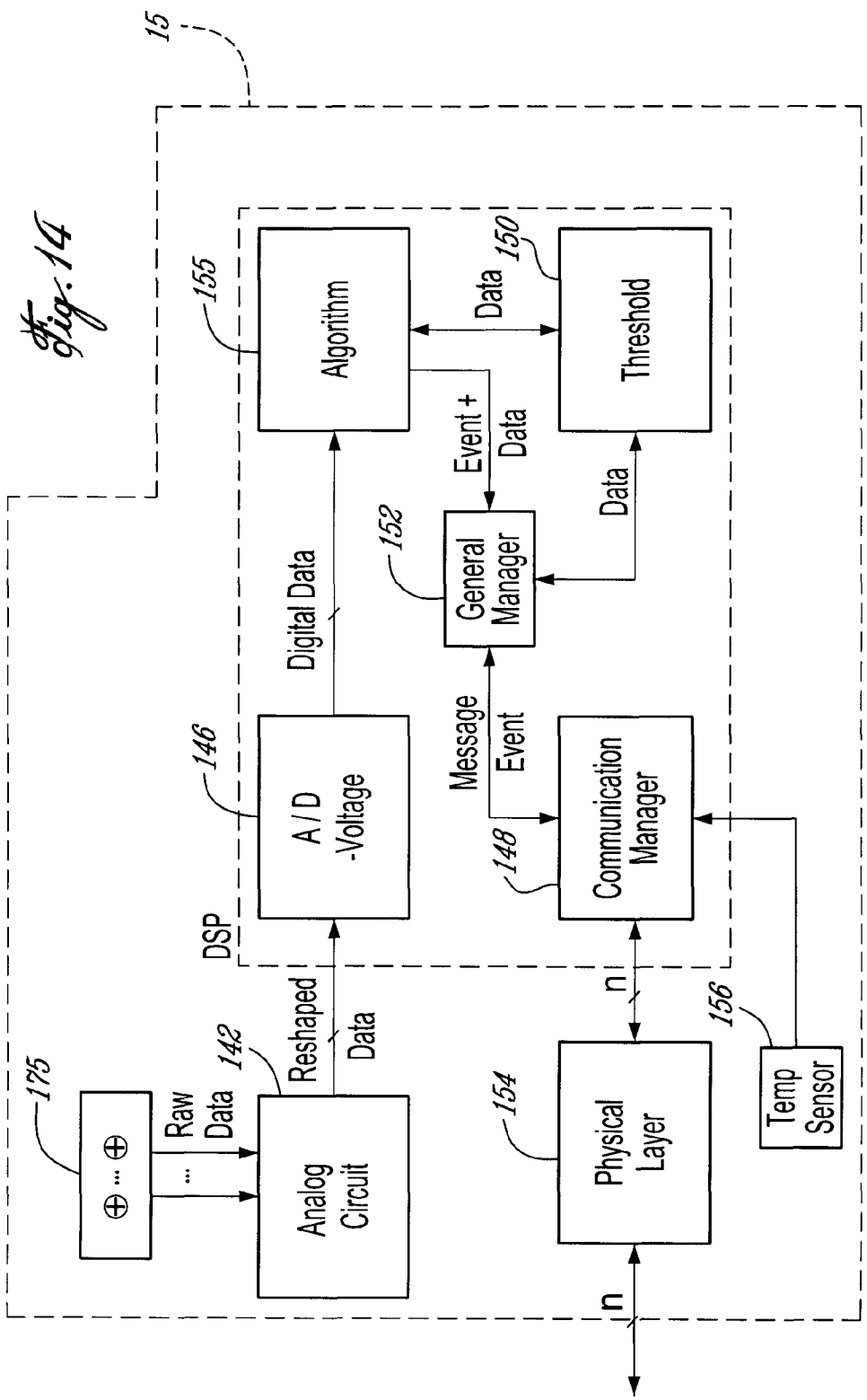
FIG. 14 is a block diagram of a voltage sensor for determining anomalies in the network of FIG. 1 in accordance with an embodiment.

Reference is now made to FIG. 14, which is a block diagram of the voltage sensor 15 for determining anomalies in the network 1 in accordance with an embodiment. In this embodiment, the voltage sensor 15 comprises modules referred to with the same numeral reference as those described for the current sensor 14, and for clarity, these descriptions of those will not be repeated. The voltage sensor comprises a physical sensor 175 where raw data 141 can be obtained from a conductor (not shown). The raw data pass through an analog circuit 142, which reshapes the raw data. The Analog/Digital (A/D) 146 receives the reshaped data and converts the data receives the analog signal and converts it into a digital signal. When the signal is converted into its digital signal, an algorithm module 155 extracts relevant measured value from the digital signal. The algorithm module 144 compares the relevant measured value to a threshold reference value in a threshold module 150. The algorithm module 144 detects an anomaly of the circuit state in the network 1 like passing from a normal operation of the circuit to an overload, or passing from an overload to a normal operation, a general manager 152 formats the algorithm information and sends it to the communication manager 148, which encapsulates or de-capsulates messages and data from the communication protocol. The voltage sensor 15 comprises a physical layer 152 which translates information for incoming/outgoing transmission, from a voltage level, for example a processor level, to another voltage level like a voltage level based protocol requirements and vice versa. The voltage sensor 14 comprises a temperature sensor 156 to determine the temperature of a monitored conductor.

Figure 15:
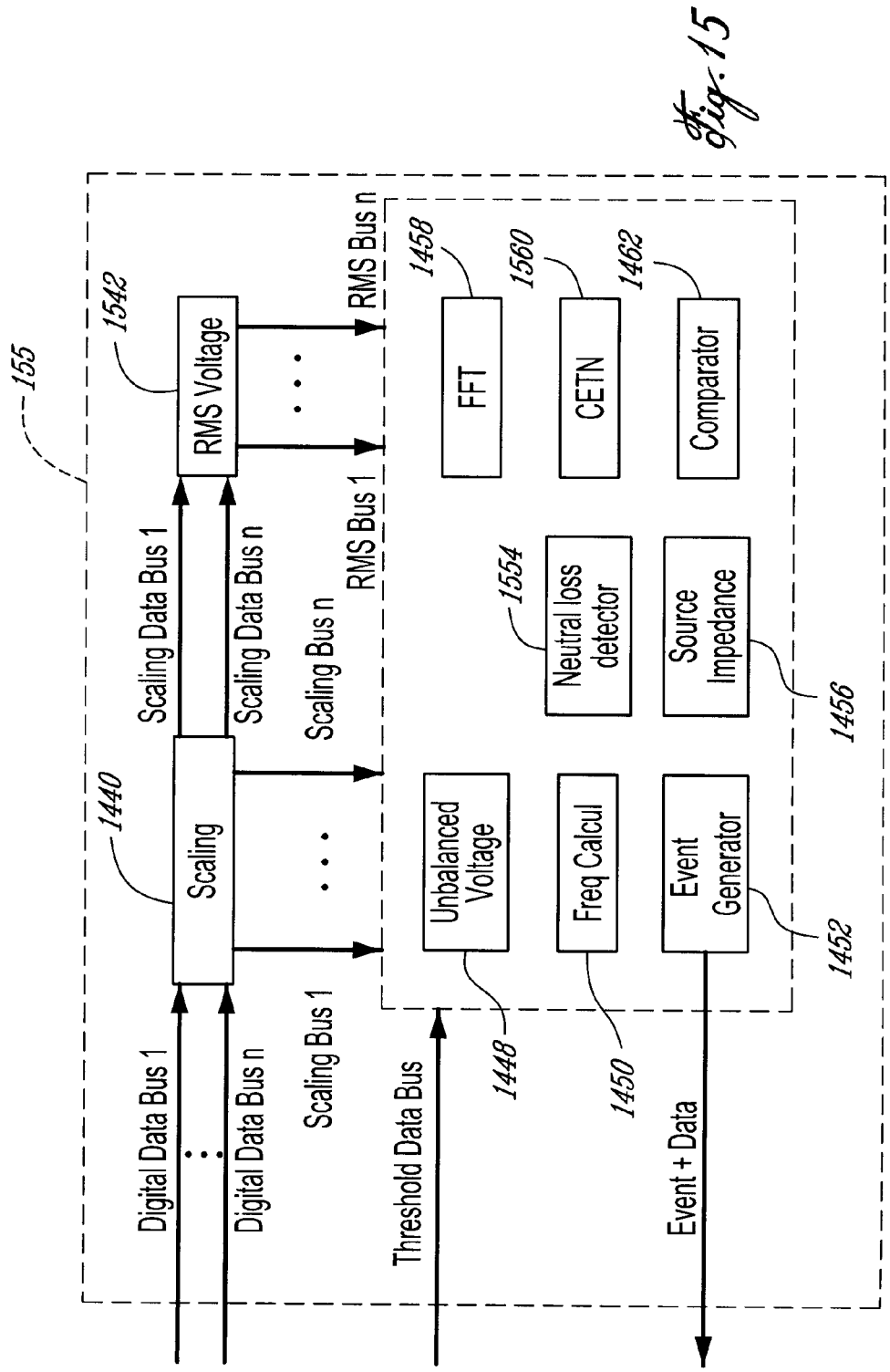
FIG. 15 is a block diagram of an algorithm module of the voltage sensor of FIG. 14 in accordance with an embodiment.

Reference is now made to FIG. 15, which is a block diagram of the algorithm module 155 of the voltage sensor 15 in accordance with an embodiment. The algorithm 155 may comprise various elements to perform various algorithms, as it will be described below. The algorithm module 155 receives data from the A/D 146, which are scaled by the scaling element 1440 before any element module of the algorithm module can be able to process the data. The algorithm module 155 also calculates the Root mean square (RMS) version of the data at a RMS voltage element 1542. An algorithm module 144 may use the scaling data or/and the RMS version of the signal. In another embodiment, the elements may use threshold data to compare with its results. If a maximum or a minimum value of threshold is reached or if certain results are obtained, an event is created by an event generator 1452. The event generator 1452 sends events and their related data the control unit to be displayed to an end user. Events are generated by circuits integrated in the event generator. In another embodiment, events are only generated when the state of the circuit has changed. The algorithm module comprises a neutral loss 1554 to detect whether a neutral conductor is properly connected. The neutral loss element 1554 is used during electricity outage and when alternative supplies are used to provide electricity to the network 1.

The following table is a list of events and their definition:

| Event name | Definition |
| --- | --- |
| HC | The harmonic contents indicator is periodically generated. When the indicator is sent, the relative value compared to the fundamental one is also sent. The sixteen (16) first harmonics are sent. |
| PhaseShift | This indicator is sent when a phase error between phases signal has been detected. |
| UnbalancedVoltage | This indicator is for three-phase system only. To calculate this indicator, the maximum variation is compared to the average of the three currents divided by the average of the three currents. |
| FreqLow | This indicator is sent when the network frequency is lower compared to the nominal frequency. |
| FreqHigh | This indicator is sent when the network frequency is higher compared to the nominal frequency. |
| NeutralLoss | This indicator is calculated with this formula: $|V1n| - |V2n| - |V3n| < 5\% \times Vn$. |
| VoltageDetected | This indicator is sent when the voltage is higher than 10% nominal voltage. |
| Undervoltage | This indicator is sent when the voltage is lower than 90% nominal voltage. |
| Overvoltage | This indicator is sent when the voltage is higher than 110% nominal voltage. |
| THDv | This indicator is sent when $(V^2 \, (V1)^2)/(V1)^2$ exceeds local standard threshold. |

The voltage sensor comprises a CETN element 1560, which operates in a same way as described for CETN element of the current sensor 14. The CETN element 1560 differs form the CETN 1460 in that the CETN element 1460 comprises holes while the CETN element 1560 comprises physical junction attachments to attach the CETN element 1560 to a wire. In this embodiment, the CETN element 1560 allows an identification of wires by the algorithm module 155, and the algorithm module 155 identifies the conductors attached to the voltage sensor. The CETN element 1560 also performs a similar voltage validation and phase validation as described for the description of FIG. 7. When identifying a conductor, a voltage validation is performed according to 800 and phase validation is performed according to 850 to identify and determine the location by the sensors, gateways and conductors of the network 1 occurs, and thus determining a network topology. These are to prevent inefficient installation and insure that the network works properly.

The voltage sensor 15 comprises, an Unbalanced voltage element 1448, which is applied only for three-phased circuit. The Unbalanced voltage element 1448 calculates and verifies if a circuit is unbalanced: Maximum deviation from the average divided by the average. Ex.: 584V 610V 603V. The voltage average is 599V and the maximum deviation from the average is 15V (599−584=15V, 610−599=11V and 603−599=4V). The result is 15V/599V=2.5%. The threshold to send an alarm is 2% and beyond 5%, the load should be shed immediately before damage occurs to the equipment.

The following is a table of the thresholds and their definitions:

| Threshold name | Definition |
|---|---|
| VoltageDetected-thld | 10% of nominal voltage. |
| FreqLow-thld | As per international convention 59 Hz for 60 Hz network and 49 Hz for 50 Hz network. |
| FreqHigh-thld | As per international convention 61 Hz for 60 Hz network and 51 Hz for 50 Hz network. |
| Overvoltage-thld | As per international convention 10% more than the nominal voltage. |
| Undervoltag-thld | As per international convention 10% less than the nominal voltage. |
| THD-thld | As per international convention. |

The Neutral Loss Detector Bloc detects a neutral loss conductor with these formulas:

Formula Single-phase: $|V1n|-|V2n|<5\% \times Vn$

Formula Three-phase: $|V1n|-|V2n|-|V3n|<5\% \times Vn$

Legend for Current Sensor Decision Rules and for Voltage Sensor Decision Rules

In the description of the current sensor decision rules and the voltage sensor decision rules below, the following notation will be used in the event sequence tables. The event sequence tables list the events sent by the sensors to the PC or the algorithm executed by the PC to identify a anomaly condition. The table also gives the conditions upon which the error message is sent to the user.

The symbols used in the event sequence tables are the following:

| Symbol | Meaning |
|---|---|
| # | Refers to the event number for example, #1 means event #1 |
| h | Hour |
| I | Current |
| I^2 | Square value of the Current |
| n | Nominal |
| HC | Harmonic Contents |
| IC | Circuit current |
| IDB | Identification of the Database |
| Hx | One of the sensor hole, x is the number of the hole |
| Hx_list | List of Hx in the sensor |
| Hn | Neutral conductor |
| Hhx | One of the line conductor |
| Cmp | Comparison |
| ≠ | Is not equal |
| @ | Localisation, for example VoltageDetected@DIST means Presence of voltage at main distribution |
| ϴ | Average |
| Δ | Delta, for example, ΔT is the Difference between a time x and a time x + 1 |
| ↑ | Starting |
| [#] | Number of the last time Ex: ϴ[3]↑ is the Average of the 3 last startings |
| {c} | Calculation |
| {m} | Message |
| {e} | Event |
| {v} | Value |
| «any_variable» | variable data read in the database. Ex: «ICmax» is the circuit maximum current value in the database |

For each rule, the function, the application, the explanation, the fault condition(s) and the event sequence(s) are provided. The error message that is provided to the display is also provided.

An example event sequence table is as follows:

| # | Source | Event/Data | State (T0) | Transition (T1) | Diagnosis Condition |
|---|---|---|---|---|---|
| 1 | Sensor{e} | CurrentDetected | 0 | 1 | |
| 2 | Sensor{e} | IsqrT | 0 | 1 | |
| 3 | Sensor{v} | IsqrT | | | |
| 4 | PC{c} | ↑motor | 0 | 1 | |
| 5 | PC{v} | ϴ[3] IsqrT | | | |
| 6 | PC{c} | | | | IsqrT cmp ϴ[3] IsqrT |
| 7 | PC{m} | | | | |

In this example event sequence table, the following information is provided:

Event #1: The Sensor sends a CurrentDetected event since the state of the current detected event changed from 0 at T0 to 1 at T1.

Event #2: The Sensor sends a IsqrT event since the state of the IsqrT event changed from 0 at T0 to 1 at T1.

Event #3: The Sensor sends the value of the IsqrT.

Event #4: The PC creates a starting motor event, therefore changing the state of the starting motor event from 0 at T0 to 1 at T1.

Event #5: The PC reads in the database the average of the last three (3) IsqrT values.

Event #6: The PC compares the IsqrT value sent by the sensor at event #3 with the value in the database that is the average of the last three (3) IsqrT and therefore is the threshold value.

Event #7: The PC displays a message.

All event sequence tables are provided in the same format and the sequence of events and steps carried out by the system can therefore be readily understood.

Following the event sequence table, the message to be displayed to the user via the user interface is provided. The message comprises an identification of the anomaly detected and the proposed course of action or solution. Variables are used in the message template and refer to variables in the event sequence table. For the user displayed message, the variable will be replaced by the actual value.

For example, if the message template is

The value of the IsqrT is {c}#3.

And if the value of the calculated parameter at event #3 in the event table is 10.7, the message that will be displayed to the user when the system is in operation will be The value of the IsqrT is 10.7.

Current Sensor Decision Rules

Electrical Arc

The objective of the electrical arc (serial, parallel and differential) fault detection algorithm is to identify the presence of an electrical arc, its amplitude and its location. This electrical fault detection algorithm can be applied to all applications.

In the electrical fault detection algorithm, the sensor will be able to identify an electrical arc from the analysis of the current. When a load is interrupted or a switch is activated, an electrical arc is created for a very short period of time but the program will emit an alarm for those arcs.

This fault can be detected even if the arc is with or without a load. It should be noted that an electrical arc creates a load.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|------------|------------|-----------------|---------------------|
| 1 | Sensor{e} | CurrentDetected | 0 | 1 | |
| 2 | Sensor{e} | AE Detect | 0 | 1 | |
| 3 | Sensor{e} | LoadDetected | 0 | 0 | |
| 4 | Control unit{c} | ΔT#2 | | | |
| 5 | Control unit {c} | | | | ΔT#2 > 1 sec |
| 6 | PC{c} | «AEgen» | | | |
| 7 | Control unit {m} | | | | |

The following table is a description of the variables use in the previous table:

| «AEgen» [0, 1, 2] | [(generated by a loose conductor at a terminal, a bad junction, a burned contact on a motor starter), (generated by an insulation defect between two electrical conductors. Identify with a megger. Open the breaker immediately! Proceed to the identification of the defect and repair it), (generated by a capacitive link between a conductor and the ground. Identify with a megger. Open the breaker immediately! Proceed to the identification of the defect and repair it.)] |
|---|---|

The following is a template for a message to be displayed to the user:

Anomaly: An electrical arc has been identified over <<Hx_list>>.

Proposed course of action: The electrical arc is located between the circuit breaker and the switch. It is <<Aegen>>.

Example

Anomaly: An electrical arc has been identified over H1 and H2.

Proposed course of action: The electrical arc is located between the circuit breaker and the load switch. This could be generated by an insulation defect between two wires. Open the circuit breaker immediately. Use a megger to locate and repair the defect.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|--------|------------|------------|-----------------|---------------------|
| 1 | Sensor{e} | CurrentDetected | 1 | 1 | |
| 2 | Sensor{e} | AE Detect | 0 | 1 | |
| 3 | Sensor{e} | LoadDetected | 1 | 1 | |
| 4 | Control unit{c} | ΔT#2 | | | |
| 5 | Control unit{c} | | | | ΔT#2 > 1 sec |
| 6 | Control unit{c} | «AEgen» | | | |
| 7 | Control unit{m} | | | | |

The following table is a description of variables from the previous table:

| «AEgen» [0, 1, 2] | [(generated by a loose conductor at a terminal, a bad junction, a burned contact on a motor starter. Inspect all cable junctions, terminals and switches.), (generated by an insulation defect between two electrical conductors. Identify with a megger. Open the breaker immediately! Proceed to the identification of the defect and repair it.), (generated by a capacitive link between a conductor and the ground. Identify with a megger. Open the breaker immediately! Proceed to the identification of the defect and repair it.)] |
|---|---|

The following is a template for a second type of message to be displayed to the user:

Anomaly: An electrical arc has been identified over <<Hx_list>>.

Proposed course of action: The electrical arc is located between the circuit breaker and the load. It is <Aegen>>.

Example

Anomaly: An electrical arc has been identified over H1 and H2.

Proposed course of action: The electrical arc is located between the circuit breaker and the load. This could be generated by a loose conductor at a terminal, a bad junction, a burned contact on a motor starter. Inspect all cable junctions, terminals and switches.

Overcurrent

The objective of the Overcurrent algorithm is to identify any exceeding of the circuit capacity. This electrical fault detection algorithm can be useful for the breaker panel and sub breaker panel. This electrical fault detection algorithm adds the fundamental and the harmonics currents to evaluate the circuit load and refers to the electrical code.

The Overcurrent rules regroup the sensor events: MarginalCircuit, Overload and Overcurrent. Those events have the same message template.

The anomaly is detected when circuit capacity exceeds 81% of the normal circuit capacity for more than one (1) minute.

The following is a table listing the events sent by the sensors to the control unit or the algorithm executed by the PC to identify the defect condition. The table also gives the conditions to send the error message to the display.

Table for the first sequence of events:

| # | Source | Event/Data | State (T0) | Transition (T1) | Diagnosis Condition Condition |
|---|---|---|---|---|---|
| 1 | Sensor{e} | MarginalCircuit | 0 | 1 | |
| 2 | Sensor{e} | Overload | 0 | 0 | |
| 3 | Sensor{e} | Overcurrent | 0 | 0 | |
| 4 | Sensor{v} | «PExceed» | | | |
| 5 | Sensor{e} | HC | 0 | 0 | |
| 6 | Sensor{e} | HC_VeryHigh | 0 | 0 | |
| 7 | Control unit{c} | ΔT #1 | | | ΔT > 1 min |
| 8 | Control unit{m} | | | | |

The following table is a description of variables from the previous table:

| «PThreshold» | Value in percentage of I compared to I. Default value is 80%. |
|---|---|
| «PExceed» | The percentage of exceeding compared to «PThreshold». The formula is: $((I - I)/I) - \text{«PThreshold»}$ |

The following is a template for a message to be displayed to the user:

Anomaly: The total of 60 Hz current is over {v}#4% of the circuit capacity.
Proposed course of action: Lower the 60 Hz load by a new load distribution.

Example

Anomaly: The total of 60 Hz current is over 15% of the circuit capacity.
If <<InHhx>>≠<<InHn>>, the following is a template for a message to be displayed to the user:
Anomaly: The total of 60 Hz current is over {v}#4% of the neutral capacity. This conductor is at risk.
Proposed course of action: Increase the capacity of the neutral conductor to meet the line conductor capacity.

Example

Anomaly: The total of 60 Hz current is over 15% of the neutral capacity. This conductor is at risk.

The following is a table listing the events sent by the sensors to the control unit or the algorithm executed by the PC to identify the defect condition. The table also provides the conditions to send the error message to the user.

Table for the second sequence of events:

| # | Source | Event/Data | State (T0) | Transition (T1) | Diagnosis Condition Condition |
|---|---|---|---|---|---|
| 1 | Sensor{e} | MarginalCircuit | 1 | 1 | |
| 2 | Sensor{e} | Overload | 0 | 1 | |
| 3 | Sensor{e} | Overcurrent | 0 | 0 | |
| 4 | Sensor{v} | «PExceed» | | | |
| 5 | Sensor{e} | HC | 0 | 0 | |
| 6 | Sensor{e} | HC_VeryHigh | 0 | 0 | |
| 7 | Control unit{c} | ΔT #1 | | | ΔT > 1 min |
| 8 | Control unit{m} | | | | |

The following table is a description of variables from the previous table:

| «PThreshold» | Value in percentage of I compared to I. Default value is 80%. |
|---|---|
| «PExceed» | The percentage of exceeding compared to «PThreshold». The formula is: $((I - I)/I) - \text{«PThreshold»}$ |

The following is a template for a type of message to be displayed to the user:
Anomaly: The total of 60 Hz current is over {v}#4% of the circuit capacity.
Proposed course of action: Lower the 60 Hz load by a new load distribution.

Example

Message: The total of 60 Hz current is over 35% of the circuit capacity.
If <<InHhx>>≠<<InHn>>, the following is a template for a type of message to be displayed to the user:
Anomaly: The total of 60 Hz current is over {v}#4% of the neutral capacity. This conductor is at risk.
Proposed course of action: Increase the capacity of the neutral conductor to meet the line conductor capacity.

Example

Anomaly: The total of 60 Hz current is over 35% of the neutral capacity. This conductor is at risk.

The following is a table listing the events sent by the sensors to the control unit or the algorithm executed by the PC to identify the defect condition. The table also provides the conditions to send an error message to the user.

Table for the third sequence of events:

| # | Source | Event/Data | State (T0) | Transition (T1) | Diagnosis Condition Condition |
|---|---|---|---|---|---|
| 1 | Sensor{e} | MarginalCircuit | 1 | 1 | |
| 2 | Sensor{e} | Overload | 1 | 1 | |
| 3 | Sensor{e} | Overcurrent | 0 | 1 | |
| 4 | Sensor{v} | «PExceed» | | | |
| 5 | Sensor{e} | HC | 0 | 0 | |
| 6 | Sensor{e} | HC_VeryHigh | 0 | 0 | |
| 7 | Control unit{c} | ΔT #1 | | | ΔT > 1 min |

-continued

| # | Source | Event/Data | State (T0) | Transition (T1) | Diagnosis Condition Condition |
|---|---|---|---|---|---|
| 8 | Control unit{m} | | | | |

The following table is a description of variables from the previous table:

| «PThreshold» | Value in percentage of I compared to I. Default value is 80%. |
|---|---|
| «PExceed» | The percentage of exceeding compared to «PThreshold». The formula is: ((I − I)/I) − «PThreshold» |

The following is a template for a type of message to be displayed to the user.
Anomaly: The total of 60 Hz current is over {v}#4% of the circuit capacity.
Proposed course of action: Lower the 60 Hz load by a new load distribution.

Example

Message: The total of 60 Hz current is over 125% of the circuit capacity.
If <<InHhx>>≠<<InHn>>, the following is a template for a type of message to be displayed to the user:
Anomaly: The total of 60 Hz current is over {v}#4% of the neutral capacity. This conductor is at risk.
Proposed course of action: Increase the capacity of the neutral conductor to meet the line conductor capacity.

Example

Anomaly: The total of 60 Hz current is over 125% of the neutral capacity. This conductor is at risk.

The following is a table listing the events sent by the sensors to the control unit or the algorithm executed by the PC to identify the defect condition. The table also provides the conditions to send the error message to the user.
Table for the fourth sequence of events:

| # | Source | Event/Data | State (T0) | Transition (T1) | Diagnosis Condition Condition |
|---|---|---|---|---|---|
| 1 | Sensor{e} | MarginalCircuit | 0 | 1 | |
| 2 | Sensor{e} | Overload | 0 | 0 | |
| 3 | Sensor{e} | Overcurrent | 0 | 0 | |
| 4 | Sensor{v} | «PExceed» | | | |
| 5 | Sensor{e} | CH | 0 | 1 | |
| 6 | Sensor{e} | CH_VeryHigh | 0 | 0 | |
| 7 | Control unit {c} | ΔT #1 | | | ΔT > 1 min |
| 8 | Control unit {m} | | | | |

The following table is a description of the variables and definitions:

| «PThreshold» | Value in percentage of I compared to I. Default value is 80%. |
|---|---|
| «PExceed» | The percentage of exceeding compared to «PThreshold». The formula is: ((I − I)/I) − «PThreshold» |

The following is a template for a type of message to be displayed to the user.
Anomaly: The total of 60 Hz and harmonic current is over {v}#4% of the circuit capacity.
Proposed course of action: Lower the 60 Hz and/or harmonic load by a new load distribution.

Example

Anomaly: The total of 60 Hz and harmonic current is over 15% of the circuit capacity.
If <<InHhx>>≠<<InHn>>, the following is a template for a type of message to be displayed to the user:
Anomaly: The total of 60 Hz and harmonic current is over {v}#4% of the neutral conductor capacity. This conductor is at risk.
Proposed course of action: Increase the capacity of the neutral conductor to meet the line conductor capacity.

Example

Proposed course of action: The electrical load overpasses the capacity of the neutral conductor by 15%. Increase the capacity of the neutral conductor to meet the line conductor capacity.

The following is a table listing the events sent by the sensors to the control unit or the algorithm executed by the PC to identify the defect condition. The table also provides the conditions to send the error message to the user.
Table for the fifth sequence of events:

| # | Source | Event/Data | State (T0) | Transition (T1) | Diagnosis Condition Condition |
|---|---|---|---|---|---|
| 1 | Sensor{e} | MarginalCircuit | 1 | 1 | |
| 2 | Sensor{e} | Overload | 0 | 1 | |
| 3 | Sensor{e} | Overcurrent | 0 | 0 | |
| 4 | Sensor{v} | «PExceed» | | | |
| 5 | Sensor{e} | HC | 0 | 1 | |
| 6 | Sensor{e} | HC_VeryHigh | 0 | 0 | |
| 7 | Control unit {c} | ΔT #1 | | | ΔT > 1 min |
| 8 | Control unit {m} | | | | |

The following table is a description of the variables and definitions:

| «PThreshold» | Value in percentage of I compared to I. Default value is 80%. |
|---|---|
| «PExceed» | The percentage of exceeding compare to «PThreshold». The formula is: ((In − I)/I) − «PThreshold» |

The following is a template for a type of message to be displayed to the user.
Anomaly: The total of 60 Hz and harmonic current is over {v}#7% of the circuit capacity.
Proposed course of action: Lower the 60 Hz and/or harmonic load by a new load distribution.

Example

Anomaly: The total of 60 Hz and harmonic current is over 35% of the circuit capacity.
If <<InHhx>>≠<<InHn>>, The following is a template for a type of message to be displayed to the user.
Anomaly: The total of 60 Hz and harmonic current is over {v}#4% of the neutral conductor capacity. This conductor is at risk.
Proposed course of action: Increase the capacity of the neutral conductor to meet the line conductor capacity.

Example

Proposed course of action: The electrical load overpasses the capacity of the neutral conductor by 35%. Increase the capacity of the neutral conductor to meet the line conductor capacity.

The following is a table listing the events sent by the sensors to the control unit or the algorithm executed by the PC to identify the defect condition. The table also provides the conditions to send the error message to the user.
Table for the sixth sequence of events:

| # | Source | Event/Data | State (T0) | Transition (T1) | Diagnosis Condition Condition |
|---|--------|------------|------------|-----------------|-------------------------------|
| 1 | Sensor{e} | MarginalCircuit | 1 | 1 | |
| 2 | Sensor{e} | Overload | 1 | 1 | |
| 3 | Sensor{e} | Overcurrent | 0 | 1 | |
| 4 | Sensor{v} | «PExceed» | | | |
| 5 | Sensor{e} | HC | 0 | 1 | |
| 6 | Sensor{e} | HC_VeryHigh | 0 | 0 | |
| 7 | Control unit{c} | ΔT #1 | | | ΔT > 1 min |
| 8 | Control unit{m} | | | | |

The following table is a description of the variables of the previous table:

| | |
|---|---|
| «PThreshold» | Value in percentage of I compared to I. Default value is 80% |
| «PExceed» | The percentage of exceeding compared to «PThreshold». The formula is: ((I − I)/I) − «PThreshold» |

The following is a template for a type of message to be displayed to the user:
Anomaly: The total of 60 Hz and harmonic current is over {v}#7% of the circuit capacity.
Proposed course of action: Lower the 60 Hz and/or harmonic load by a new load distribution.

Example

Message: The total of 60 Hz and harmonic current is over 15% of the circuit capacity.
If <<InHhx>>≠<<InHn>>, the following is a template for a type of message to be displayed to the user:
Anomaly: The total of 60 Hz and harmonic current is over {v}#4% of the neutral conductor capacity. This conductor is at risk.
Proposed course of action: Increase the capacity of the neutral conductor to meet the line conductor capacity.

Example

Anomaly: The total of 60 Hz and harmonic current is over 15% of the neutral conductor capacity. This conductor is at risk.

The following table is a listing of events sent by the sensors 14, 15 to the control unit 11 or the algorithm executed by the PC to identify the defect condition. The table also provides the conditions to send the error message to the user.
Table for the seventh sequence of events:

| # | Source | Event/Data | State (T0) | Transition (T1) | Diagnosis Condition Condition |
|---|--------|------------|------------|-----------------|-------------------------------|
| 1 | Sensor{e} | MarginalCircuit | 0 | 1 | |
| 2 | Sensor{e} | Overload | 0 | 0 | |
| 3 | Sensor{e} | Overcurrent | 0 | 0 | |
| 4 | Sensor{v} | «PExceed» | | | |
| 5 | Sensor{e} | HC | 1 | 1 | |
| 6 | Sensor{e} | HC_VeryHigh | 0 | 1 | |
| 7 | Control unit{c} | ΔT #1 | | | ΔT > 1 min |
| 8 | Control unit{m} | | | | |

The following is description of the variables and definitions:

| | |
|---|---|
| «PThreshold» | Value in percentage of I compared to I. Default value is 80%. |
| «PExceed» | The percentage of exceeding compared to «PThreshold». The formula is: ((I − I)/I) − «PThreshold» |

The following is a template for a type of message to be displayed to the user:
Anomaly: The total harmonic current is over {v}#4% of the circuit capacity.
Proposed course of action: Lower the harmonic load by a new load distribution.

Example

Message: The total of harmonic current is over 15% of the circuit capacity.
If <<InHhx>>≠<<InHn>>, the following is a template for a type of message to be displayed to the user:
Anomaly: The total harmonic current is over {v}#4% of the neutral conductor capacity. This conductor is at risk.
Proposed course of action: Increase the capacity of the neutral conductor to meet the line conductor capacity.

Example

Anomaly: The total harmonic current is over 15% of the neutral conductor capacity. This conductor is at risk.

The following is a table listing the events sent by the sensors 14, 15 to the control unit 11 or the algorithm executed by the PC to identify the defect condition. The table also provides the conditions to send the error message to the user.

Table for the eight sequence of events:

| # | Source | Event/Data | State (T0) | Transition (T1) | Diagnosis Condition Condition |
|---|--------|------------|------------|-----------------|-------------------------------|
| 1 | Sensor{e} | MarginalCircuit | 1 | 1 | |
| 2 | Sensor{e} | Overload | 0 | 1 | |
| 3 | Sensor{e} | Overcurrent | 0 | 0 | |
| 4 | Sensor{v} | «PExceed» | | | |
| 5 | Sensor{e} | HC | 1 | 1 | |
| 6 | Sensor{e} | HC_VeryHigh | 0 | 1 | |
| 7 | Control unit{c} | ΔT #1 | | | ΔT > 1 min |
| 8 | Control unit{m} | | | | |

The following is a description of the variables and definitions used:

| | |
|---|---|
| «PThreshold» | Value in percentage of I compared to I. Default value is 80%. |
| «PExceed» | The percentage of exceeding compared to «PThreshold». The formula is: ((I − I)/I) − «PThreshold». |

The following is a template for a type of message to be displayed to the user.
Anomaly: The total harmonic current is over {v}#7% of the circuit capacity.
Proposed course of action: Lower the harmonic load by a new load distribution.

Example

Anomaly: The total of harmonic current is over 35% of the circuit capacity.
If <<InHhx>>≠<<InHn>>, The following is a template for a type of message to be displayed to the user.
Anomaly: The total harmonic current is over {v}#4% of the neutral conductor capacity. This conductor is at risk.
Proposed course of action: Increase the capacity of the neutral conductor to meet the line conductor capacity.

Example

Anomaly: The total harmonic current is over 35% of the neutral conductor capacity. This conductor is at risk.

The following is a table listing the events sent by the sensors to the control unit 11 or the algorithm executed by the PC to identify the defect condition. The table also provides the conditions to send the error message to the user.

Table for the ninth sequence of events:

| # | Source | Event/Data | State (T0) | Transition (T1) | Diagnosis Condition Condition |
|---|--------|------------|------------|-----------------|-------------------------------|
| 1 | Sensor{e} | MarginalCircuit | 1 | 1 | |
| 2 | Sensor{e} | Overload | 1 | 1 | |
| 3 | Sensor{e} | Overcurrent | 0 | 1 | |
| 4 | Sensor{v} | «PExceed» | | | |
| 5 | Sensor{e} | HC | 1 | 1 | |
| 6 | Sensor{e} | HC_VeryHigh | 0 | 1 | |
| 7 | Control unit{c} | ΔT #1 | | | ΔT > 1 min |
| 8 | Control unit{m} | | | | |

The following table is a description of variables from the previous table:

| | |
|---|---|
| «PThreshold» | Value in percentage of I compared to I. Default value is 80%. |
| «PExceed» | The percentage of exceeding compared to «PThreshold». The formula is: ((I − I)/I) − «PThreshold». |

The following is a template for a type of message to be displayed to the user.
Anomaly: The total harmonic current is over {v}#7% of the circuit capacity.
Proposed course of action: Lower the harmonic load by a new load distribution.

Example

Anomaly: The total of harmonic current is over 125% of the circuit capacity.
If <<InHhx>>≠<<InHn>>, The following is a template for a type of message to be displayed to the user.
Anomaly: The total harmonic current is over {v}#4% of the neutral conductor capacity. This conductor is at risk.
Proposed course of action: Increase the capacity of the neutral conductor to meet the line conductor capacity.

Example

Anomaly: The total harmonic current is over 125% of the neutral conductor capacity. This conductor is at risk.

It should be noted that The sensor needs to send to the control unit 11, the ratio between the 60 Hz current and the harmonic contents.

High $THD_1$

The objective of the High $THD_1$ fault detection algorithm is to Identify the harmonic distortion on a circuit. This electrical fault detection algorithm can be applied to any application. In this electrical fault detection algorithm, THD= (Σpower of harmonics)/total power. The circumstances in which this fault is detected are when a Refer to the Utility or International convention for threshold.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|---|---|---|---|---|
| 1 | Sensor{e} | THD | 0 | 1 | |
| 2 | Control unit{m} | | | | |

The following is a template for a message to be displayed to the user:
Anomaly: The system has identified a high level of harmonic distortion.
Proposed course of action: Remove some non-linear load in this circuit.
External Intervention The objective of the External Intervention fault detection algorithm is to identify and locate a current limitation device triggered by an external intervention. The current limitation device can be a breaker, a fuse, a current overload, etc. The external intervention can be voluntary or accidental. Voluntary interventions include a human intervention by a person in the facility wishing to rapidly stop operation of a motor or a load, or a remote controlling of an electronic current limitation device by an external system. Accidental interventions include an accidental physical triggering of a breaker by a human or an animal or by a hard piece of material, such as displacement of a breaker by a moving cow or displacement of a breaker by a piece of equipment falling to the floor. Both types of interventions must be identified because stopping an equipment by triggering its breaker is not an appropriate way to control an equipment and can cause long-term damage to the equipment or other problems. An example of a problem would be contamination of a reservoir if the reservoir washing equipment was stopped by its breaker during a technician intervention on the reservoir and was not started again before a new milk production is introduced in the reservoir.

Identify if the load was in operation or not. This electrical fault detection algorithm can be applied to any application. In this electrical fault detection algorithm, it is a must for some equipment (Bulk tank, ventilation) to know the state of the breaker. The sensor 14, 15 must validate if its load is present or not when the breaker opening is detected.

The system must verify if the rules below are not activated: Overcurrent, Electrical arc, Temperature, Short-circuit, Repetitive starting.

The circumstances in which this fault is detected are when the current limitation device was triggered due to an external intervention with or without a load in operation.

Table for the first sequence of events:

| # | Source | Event/Data | State (T0) | Transition (T1) | Diagnosis Condition |
|---|---|---|---|---|---|
| 1 | Sensor{e} | VoltageDetected | 1 | 0 | |
| 2 | Sensor{e} | CurrentDetected | 1 | 0 | |
| 3 | Sensor{e} | LoadDetected | 1 | 0 | |
| 4 | Control unit{v} | «OtherRulesInViolation» | 0 | 0 | |
| 5 | Control unit{m} | | | | |

The following is a template for a message to be displayed to the user:
Anomaly: The current limitation device at <<Hx_list>> has been opened during load operation by an external intervention (such as a human intervention, an accidental physical triggering or a remote controlling) and is not an electrical fault.
Proposed course of action: Locate the person, animal or remote system which has interrupted the load operation to correct the situation.

Example

Anomaly: The current limitation device at H1 has been opened during load operation by an external intervention (such as a human intervention, an accidental physical triggering or a remote controlling) and is not an electrical fault.

Table for the second sequence of events:

| # | Source | Event/Data | State (T0) | Transition (T1) | Diagnosis Condition |
|---|---|---|---|---|---|
| 1 | Sensor{e} | VoltageDetected | 1 | 0 | |
| 2 | Sensor{e} | CurrentDetected | 0 | 0 | |
| 3 | Sensor{e} | LoadDetected | 0 | 0 | |
| 4 | Control unit{v} | «OtherRulesInViolation» | 0 | 0 | |
| 5 | Control unit{m} | | | | |

The following is a template for a second type of message to be displayed to the user.
Anomaly: The current limitation device at <<Hx_list>> has been opened during load operation by an external intervention (such as a human intervention, an accidental physical triggering or a remote controlling) and is not an electrical fault.
Proposed course of action: Locate the person, animal or remote system which has interrupted the load operation to correct the situation.

Example

Anomaly: The current limitation device at H1 has been opened during load operation by an external intervention (such as a human intervention, an accidental physical triggering or a remote controlling) and is not an electrical fault.

It should be noted that such analysis is optional. The end user will have the possibility to activate it or not. The sensors 14, 15 need to send to the control unit 11 the ratio between the 60 Hz current and the harmonic contents Bonding The objective of the Bonding fault detection algorithm is to verify the presence of a bonding before the power is turned on. This electrical fault detection algorithm can be applied to the breaker panel and sub panel.

In this electrical fault detection algorithm, whenever a bonding is created, a current always flows through this link even if the power is off. Before turning on the power, it is verified if the current sensor detects a current. The location of the sensor is known from the data stored and associated to the sensor. The location of the sensor can be determined if the sensor is at the main entrance or at the sub panel. A bonding can only be done at the main entrance.

The first sequence is the case where the sensor is located at the main entrance and detects a bonding, which is correct according to the first Proposed course of action.

The second sequence is the case where the sensor is anywhere but at the main entrance and detects a bonding, which is incorrect according to the second Proposed course of action.

The third sequence is the case where the sensor is located at the main entrance and does not detect a bonding, which is incorrect according to the third Proposed course of action.

The circumstances in which this fault is detected are when a sensor is at the breaker panel or sub panel and detects a bonding. A sensor located in the main entrance would be used to detect if there is a bonding or no bonding.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|------------|------------|-----------------|---------------------|
| 1 | SensorIZL{e} | CurrentDetected | 0 | 1 | |
| 2 | Control unit{m} | | | | |

The following messages relates to massages when a sensor is located at the main entrance 3.

The following is a template for a message to be displayed to the user:

Anomaly: The system has identified a neutral-ground bonding. This bonding confirms the physical link between a neutral link and the ground.

Proposed course of action: This bonding is in conformity with the regulation. It is recommended to maintain this link all the time.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|--------|------------|------------|-----------------|---------------------|
| 1 | SensorIZL{e} | CurrentDetected | 0 | 0 | |
| 2 | Control unit{m} | | | | |

The following messages relates to massages when a sensor is located at the main entrance 3.

The following is an example for a second type of message to be displayed to the user.

Anomaly: The system has not identified a neutral-ground bonding.

Proposed course of action: The regulation requires for safety a physical link between the neutral and the ground. Create this bonding in the main panel or a IZL sensor.

The following is a table listing the events sent by the sensors 14, 15 to the control unit 11 or the algorithm executed by the PC to identify the defect condition. The table also provides the conditions to send the error message to the user.

Table for the third sequence of events:

| # | Source | Event/Data | State (T0) | Transition (T1) | Diagnosis Condition |
|---|--------|------------|------------|-----------------|---------------------|
| 1 | Sensor{e} | VoltageDetected | 0 | 0 | |
| 2 | Sensor{e} | CurrentDetectedHn | 0 | 1 | |
| 3 | Sensor{e} | IDiff | 0 | 1 | |
| 4 | Control unit{m} | | | | |

The following messages relates to massages when a sensor is not located at the main entrance 3:

The following is a template for a third type of message to be displayed to the user:

Anomaly: The system has identified a neutral-ground bonding but the electrical power is off. This indicates a physical bonding between the neutral and the ground.

Proposed course of action: The only bond that is in conformity with the regulation is in the main panel. Use a megger to locate other neutral-ground bondings and split them.

The following is a table listing the events sent by the sensors 14, 15 to the control unit 11 or the algorithm executed by the PC to identify the defect condition. The table also provides the conditions to send the error message to the user.

Table for the fourth sequence of events:

| # | Source | Event/Data | State (T0) | Transition (T1) | Diagnosis Condition |
|---|--------|------------|------------|-----------------|---------------------|
| 1 | SensorIZL{e} | CurrentDetected | 1 | 0 | |
| 2 | Control unit{m} | | | | |

The following messages relates to massages when a sensor is located at the main entrance 3:

The following is a template for a fourth type of message to be displayed to the user.

Anomaly: The system has not identified a neutral-ground bonding.

Proposed course of action: The regulation requires for safety a physical link between the neutral and the ground. Create this bonding in the main panel.

Differential Leakage Current

The objective of the Differential leakage current fault detection algorithm is to, locate and identify a differential leaking current, at the circuit breaker. This electrical fault detection algorithm can be applied to the breaker panel and sub panel.

In this electrical fault detection algorithm, a current leakage to the ground may cause a hot conductor or a neutral conductor to be over a circuit with or without a load.

The circumstances in which this fault is detected are when a leakage (Hx) to the ground with or without a load.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|---|---|---|---|---|
| 1 | Sensor{e} | CurrentDetected | 0 | 1 | |
| 2 | Sensor{e} | LoadDetected | 0 | 0 | |
| 3 | Sensor{e} | IDiff | 0 | 1 | |
| 5 | Control unit{m} | | | | |

The following is a template for a second type of message to be displayed to the user.
Anomaly: The system has detected a ground fault for the conductor <<Hx>>. This is a severe defect and immediate action is required.
Proposed course of action: This link is located between the circuit breaker and the switch. With a megger, locate the defect and repair it.

Example

Anomaly: The system has detected a ground fault for the conductor H2. This is a severe defect and immediate action is required.
Proposed course of action: The conductor H2 has a link to the ground. This link is located between the circuit breaker and the switch. With a megger, locate the defect and repair it.

The following is a table listing the events sent by the sensors 14, 15 to the control unit 11 or the algorithm executed by the PC to identify the defect condition. The table also provides the conditions to send the error message to the user.
Table for the third sequence of events:

| # | Source | Event/Data | State (T0) | Transition (T1) | Diagnosis Condition |
|---|---|---|---|---|---|
| 1 | Sensor{e} | CurrentDetected | 1 | 1 | |
| 2 | Sensor{e} | Load Detected | 1 | 1 | |
| 3 | Sensor{e} | IDiff | 0 | 1 | |
| 5 | Control unit{m} | | | | |

The following is a template for a third type of message to be displayed to the user.
Anomaly: The system has detected a ground fault for the conductor <<Hx>>. This is a severe defect and immediate action is required.
Proposed course of action: This link is located between the circuit breaker and the load. With a megger, locate the defect and repair it.

Example

Anomaly: The system has detected a ground fault for the conductor H2. This is a severe defect and immediate action is required.
Proposed course of action: The conductor H2 has a link to the ground. This link is located between the circuit breaker and the load. With a megger, locate the defect and repair it.

It should be noted that 0 to 1 A reading is from the differential sensor. Over 1.1 A, it is a mathematic difference between the conductors. Locate the position of the sensor. Identify the current defect at 60 Hz and at HF. Identify the technology in cause with the harmonics signature. When IDiff is saturated, work with $\Sigma(Hhx_1 - Hhx_2 - Hhx_3)$.

Mechanical Load Loss

The objective of the Mechanical load loss fault detection algorithm is to identify a mechanical load loss.

In this electrical fault detection algorithm, a failure may create a mechanical load loss on some equipment. The load loss creates a current reduction compared to the normal operation of the equipment. This current reduction is used to detect a load loss. This electrical fault detection algorithm can be applied to any application. The circumstances in which this fault is detected are when a Current reduction of x % compared to the normal operation.

The following is a table listing the events sent by the sensors 14, 15 to the control unit 11 or the algorithm executed by the PC to identify the defect condition. The table also provides the conditions to send the error message to the user.
Table for the first sequence of events:

| # | Source | Event/Data | State | Transition | Diagnosis Condition |
|---|---|---|---|---|---|
| 1 | Sensor{e} | LoadLost | 0 | 1 | |
| 2 | Control unit{m} | | | | |

If motor load, the following message can be used:
Anomaly: Currently the motor operates without a load. The link between the motor and the mechanical load is broken.
Proposed course of action: Verify the link between the motor and the mechanical load.

If conventional load, the following message can be used:
Anomaly: The system has identified an abnormal low current.
Proposed course of action: Verify all loads over this circuit.

It should be noted that it is necessary to include a hysteresis on the comparison of "Current History" for the conventional load.

Mechanical Jam

The objective of the Mechanical Jam fault detection algorithm is to identify a mechanical jam and the consequence on the circuit. This electrical fault detection algorithm can be applied to Motor annotations or Breaker Panel. A mechanical jam is a direct consequence of a mechanical failure. The thermal protection should open or the breaker should trip without any indication to the technician.

The circumstances in which this fault is detected are when an activation of the thermal protection and when Breaker is opened.

The following is a table listing the events sent by the sensors 14, 15 to the control unit 11 or the algorithm executed by the PC to identify the defect condition. The table also provides the conditions to send the error message to the user.
Table for the first sequence of events:

| # | Source | Event/Data | State (T0) | Transition (T1) | Transition (T2) | Diagnosis Condition |
|---|---|---|---|---|---|---|
| 1 | Sensor{e} | VoltageDetected | 1 | 1 | 0 | |
| 2 | Sensor{e} | CurrentDetected | 1 | 1 | 0 | |

-continued

| # | Source | Event/Data | State (T0) | Transition (T1) | Transition (T2) | Diagnosis Condition |
|---|---|---|---|---|---|---|
| 3 | Sensor{e} | LoadDetected | 1 | 1 | 0 | |
| 4 | Sensor{e} | Overload Load > 200% | 0 | 1 | 0 | |
| 5 | Control unit{c} | ΔT#3 | | | | ΔT#3 > 1 s |
| 6 | Control unit{m} | | | | | |

The following is a template for a message to be displayed to the user:
Anomaly: The system has identified a mechanical jam during operation. The direct consequence of this event is the opening of the circuit breaker <<Hx>>.
Proposed course of action: The setting of thermal protection of the load is incorrect. Call a certified technician to verify the thermal protection of the load, the motor and the load attached to it before resuming the operation.

Example

Message: The system has identified a mechanical jam during operation. The direct consequence of this event is the opening of the circuit breaker H1.
Note: The breaker has opened or some fuses have blown.
The following is a table listing the events sent by the sensors 14, 15 to the control unit 11 or the algorithm executed by the PC to identify the defect condition. The table also provides the conditions to send the error message to the user.
Table for the second sequence of events:

| # | Source | Event/Data | State (T0) | Transition (T1) | Transition (T2) | Diagnosis Condition |
|---|---|---|---|---|---|---|
| 1 | Sensor{e} | VoltageDetected | 1 | 1 | 1 | |
| 2 | Sensor{e} | CurrentDetected | 1 | 1 | 0 | |
| 3 | Sensor{e} | LoadDetected | 1 | 1 | 0 | |
| 4 | Sensor{e} | Overload Load > 200% | 0 | 1 | 0 | |
| 5 | PC{c} | ΔT#3 | | | | ΔT#3 > 1 s |
| 6 | Control unit{m} | | | | | |

The following is a template for a second type of message to be displayed to the user.
Anomaly: The system has identified a mechanical jam. The thermal protection has opened. The load operation is halted.
Proposed course of action: Call a certified technician to verify the motor and the load attached to it. Ask the technician to reset the thermal protection before resuming the operation.
Note: The thermal protection of the motor is activated (open)
Repetitive Start
The objective of the Repetitive start fault detection algorithm is to validate the conformity of the command entered in the database based on the shutdown period and the number of startups per hour of the motor. This electrical fault detection algorithm can be applied to Motor annotations in the breaker panel only.
In this electrical fault detection algorithm, a water pump should not run more than four (4) times per hour. More start-ups may indicate a leak, a burned connector or a mechanical jam of a limit switch.
The circumstances in which this fault is detected are when a number of start-ups per hour are exceeding the threshold.

The following is a table listing the events sent by the sensors 14, 15 to the control unit 11 or the algorithm executed by the PC to identify the defect condition. The table also provides the conditions to send the error message to the user.
Table for the first sequence of events:

| # | Source | Event/Data | State (T0) | Transition (T1) | Diagnosis Condition |
|---|---|---|---|---|---|
| 1 | PC {e} | ↑motor | | | |
| 2 | PC {c} | #1/h | | | #1/h > «STThreshold» |
| 3 | Control unit{m} | | | | |

The following table is a description of variables from the previous table:

| | |
|---|---|
| «STThreshold» | The programmed startup per hour threshold. |

The following is a template for a message to be displayed to the user:
Anomaly: The number of startups per hour exceeds the programmed threshold.
Proposed course of action: The activation command (pressure switch) of the startup might be defective. A voltage drop due to the inrush startup current may also influence the magnetization of the switch. Verify the switch viability.
Unbalanced Current
The objective of the Unbalanced current fault detection algorithm is to determine the phase-to-phase current offset. This electrical fault detection algorithm can be applied to Motor annotations, in the Breaker panel only.
In this electrical fault detection algorithm, an unbalanced current between phases cannot exceed 2%. When the unbalanced current exceeds 2%, the equipment is at risk and the load should be shed when the unbalanced current passes over 5%. The circumstances in which this fault is detected are when a Unbalanced current>2%

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|-----------|-----|-----|---------|
| 1 | Sensor{e} | UnbalancedCurrent | 0 | 1 | |
| 2 | SensorT{e} | UnbalancedVoltage | 0 | 1 | |
| 3 | Control unit{m} | | | | |

The following is a template for a message to be displayed to the user:
Anomaly: The system has identified an unbalanced current.
Proposed course of action: This unbalanced current has been created by an unbalanced voltage. Verify the cause of the unbalanced voltage anomaly detected.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|--------|-----------|-----|-----|---------|
| 1 | Sensor{e} | UnbalancedCurrent | 0 | 1 | |
| 2 | SensorT{e} | UnbalancedVoltage | 0 | 0 | |
| 3 | Control unit{m} | | | | |

The following is a template for a second type of message to be displayed to the user.
Anomaly: The system has identified an unbalanced current.
Proposed course of action: This situation is created by a bad connection to the load.

Correct the connection to the load.

The current sensor must be associated with the voltage sensor to identify the type of network.

Overload of the Load

The objective of the Overload of the Load fault detection algorithm is to Identify if an equipment is overloaded. This electrical fault detection algorithm can be applied to Motor annotations in the Breaker panel.

In this electrical fault detection algorithm, the motor can be attached to a circuit breaker with higher tolerance such as a motor of 10 A over a 30 A circuit, verify if the motor is in normal operation.

Message #1 is for the case in which no voltage drop has been detected. Message #2 is for the case in which a voltage drop has been detected.

The circumstances in which this fault is detected are when a Current consumption higher than normal.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|-----------|-----|-----|---------|
| 1 | Sensor{e} | OverloadLoad > 100% | 0 | 1 | |
| 2 | SensorT{e} | UnderVoltage | 0 | 0 | |
| 3 | Control unit{c} | ΔT#3 | | | |
| 4 | Control unit{c} | | | | (#5 > 1 s) |
| 5 | Control unit{m} | | | | |

The following is a template for a message to be displayed to the user:
Anomaly: The system has detected that the equipment is overloaded.
Proposed course of action: Verify the mechanical load and the setting of the equipment protection.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|--------|-----------|-----|-----|---------|
| 1 | Sensor{e} | OverloadLoad > 100% | 0 | 1 | |
| 2 | SensorT{e} | UnderVoltage | 0 | 1 | |
| 3 | Control unit{c} | ΔT#3 | | | |
| 4 | Control unit{c} | | | | (#5 > 1 s) |
| 5 | Control unit{m} | | | | |

The following is a template for a second type of message to be displayed to the user.
Anomaly: The system has detected that the equipment is overloaded.
Proposed course of action: A voltage drop from the utility creates an overload on the equipment. This situation puts the equipment in jeopardy. An evaluation of the electrical network is needed.

Heavy Start

The objective of the Heavy Start fault detection algorithm is to identify a heavy start. This electrical fault detection algorithm can be applied to Motor annotations and Breaker panel In this electrical fault detection algorithm, a heavy start is detected when the inrush current is higher than normal or when the equipment takes more time to finish its start-up transition. The system needs to verify if the increase of inrush current is due to a voltage drop.

Message #1 is for the case in which no voltage drop has been detected. Message #2 is for the case in which a voltage drop has been detected. The circumstances in which this fault is detected are when a voltage drop or mechanical failure of the load.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|---|---|---|---|---|
| 1 | Sensor{e} | CurrentDetected | 0 | 1 | |
| 2 | Sensor{e} | IsqrT | 0 | 1 | |
| 3 | Sensor{v} | IsqrT | | | |
| 4 | PC{c} | ↑motor | 0 | 1 | |
| 5 | PC{v} | ϴ[3] IsqrT | | | |
| 6 | PC{c} | | | | IsqrT > ϴ[3] IsqrT |
| 7 | PC{m} | | | | |

The following is a template for a message to be displayed to the user:

Anomaly: The system has detected a heavy start.

Proposed course of action: A mechanical defect during startup creates a huge inrush current. Verify the mechanical section of the equipment or the load.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|---|---|---|---|---|
| 1 | Sensor{e} | CurrentDetected | 0 | 1 | |
| 2 | Sensor{e} | IsqrT | 0 | 1 | |
| 3 | Sensor{v} | IsqrT | | | |
| 4 | SensorT{e} | UnderVoltage | 0 | 1 | |
| 5 | PC{c} | ↑motor | 0 | 1 | |
| 6 | PC{v} | ϴ[3] IsqrT | | | |
| 7 | PC{c} | | | | IsqrT > ϴ[3] IsqrT |
| 8 | PC {m} | | | | |

The following is a template for a second type of message to be displayed to the user.

Anomaly: The system has detected a heavy start.

Proposed course of action: A voltage drop from the utility creates an overload on the equipment. This situation puts the equipment in jeopardy. An evaluation of the electrical network is needed.

Short-Circuit

The objective of the Short-Circuit fault detection algorithm is to identify a short-circuit. This electrical fault detection algorithm can be applied to any application.

In this electrical fault detection algorithm, A short-circuit is produced when the current flows from a conductor to another conductor, to a neutral conductor or to the ground without any limitation or control. The system locates the short-circuit and indicates if a load was in operation during this time. The circumstances in which this fault is detected are when a Short-circuit between a phase and the neutral conductor, Short-circuit between two (2) phases, Short-circuit between a phase and the ground.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|---|---|---|---|---|
| 1 | Sensor{e} | Short-Circuit | 0 | 1 | |
| 2 | Sensor{e} | VoltageDetected | 1 | 0 | |
| 3 | Sensor{e} | CurrentDetected | 0 | 1 | |
| 4 | Sensor{e} | LoadDetected | 0 | 1 | |
| 5 | Sensor{e} | IDiff | 0 | 0 | |
| 6 | Control unit{m} | | | | |

The following is a template for a message to be displayed to the user:

Anomaly: The system has identified a short-circuit over <<HxList>>.

Proposed course of action: The short-circuit is located between the circuit breaker and the switch. loss of voltage on the conductors. With a megger, locate and repair the defect.

Example

Anomaly: The system has identified a short-circuit over H1 and H2.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|---|---|---|---|---|
| 1 | Sensor{e} | CurrentDetected | 1 | 1 | |
| 2 | Sensor{e} | LoadDetected | 1 | 1 | |
| 3 | Sensor{e} | Short-Circuit | 0 | 1 | |
| 4 | Sensor{e} | VoltageDetected | 1 | 0 | |
| 5 | Sensor{e} | IDiff | 0 | 0 | |
| 6 | Control unit{m} | | | | |

The following is a template for a second type of message to be displayed to the user.

Anomaly: The system has identified a short-circuit over <<Hx>> and <<Hx'>>.

Proposed course of action: The short-circuit is located between the circuit breaker and the load. A voltage drop over conductors is present. With a megger, locate and repair the defect.

Example

Anomaly: The system has identified a short-circuit over H1 and H2.

The following is a table listing the events sent by the sensors 14, 15 to the control unit 11 or the algorithm executed by the PC to identify the defect condition. The table also provides the conditions to send the error message to the user.

Table for the third sequence of events:

| # | Source | Event/Data | State (T0) | Transition (T1) | Diagnosis Condition |
|---|---|---|---|---|---|
| 1 | Sensor{e} | Short-Circuit | 0 | 1 | |
| 2 | Sensor{e} | VoltageDetected | 1 | 0 | |
| 3 | Sensor{e} | CurrentDetected | 0 | 1 | |
| 4 | Sensor{e} | IDiff | 0 | 1 | |
| 5 | Sensor{e} | LoadDetected | 0 | 1 | |
| 6 | Control unit{m} | | | | |

The following is a template for a fourth type of message to be displayed to the user. The message includes a Anomaly section and a Proposed course of action section.
Anomaly: The system has identified a short-circuit over <<Hx>> and the ground.
Proposed course of action: The short-circuit is located between the circuit breaker and the switch. A voltage drop over conductors is present. With a megger, locate and repair the defect.

Example

Anomaly: The system has identified a short-circuit over H1 and the ground.
The following is a table listing the events sent by the sensors 14, 15 to the control unit 11 or the algorithm executed by the PC to identify the defect condition. The table also provides the conditions to send the error message to the user.
Table for the fourth sequence of events:

| # | Source | Event/Data | State (T0) | Transition (T1) | Diagnosis Condition |
|---|---|---|---|---|---|
| 1 | Sensor{e} | CurrentDetected | 1 | 1 | |
| 2 | Sensor{e} | LoadDetected | 1 | 1 | |
| 3 | Sensor{e} | Short-Circuit | 0 | 1 | |
| 4 | Sensor{e} | VoltageDetected | 1 | 0 | |
| 5 | Sensor{e} | IDiff | 0 | 1 | |
| 6 | Control unit{m} | | | | |

The following is a template for a fourth type of message to be displayed to the user.
Anomaly: The system has identified a short-circuit over <<Hx>> and the ground.
Proposed course of action: The short circuit is located between the circuit breaker and the load. A voltage drop over the conductor is present. With a megger, locate and repair the defect.

Example

Anomaly: The system has identified a short-circuit over H1 and the ground.
It should be noted that a small differential current will be created during the short-circuit and needs to be ignored.
Leakage of an Electrical Fence Controller The objective of the leakage of an electrical fence controller fault detection algorithm is to identify the presence of an electrical fence controller with its differential signature. This electrical fault detection algorithm can be applied to any application.

In this electrical fault detection algorithm, such signals circulate over the neutral network and the installation ground. It is necessary to identify through the differential mode such signals and to locate their source. When it is impossible to identify the source from a circuit breaker, it indicates that the signal is coming from the outside of the building 20. The circumstances in which this fault is detected are when a differential current pulsing every second.
The following is a table listing the events sent by the sensors 14, 15 to the control unit 11 or the algorithm executed by the PC to identify the defect condition. The table also provides the conditions to send the error message to the user.
Table for the first sequence of events:

| # | Source | Event/Data | State (T0) | Transition (T1) | Diagnosis Condition |
|---|---|---|---|---|---|
| 1 | Sensor{e} | IDiffHF | 0 | 1 | |
| 2 | Sensor{e}@Main entrance | IDiffHF | 0 | 0 | |
| 3 | Control unit{m} | | | | |

The following is a template for a message to be displayed to the user:
Anomaly: A leak from an electrical fence has been identified in this circuit breaker. This leak runs in the grounding system and puts the livestock at risk.
Proposed course of action: With the help the electrical network adviser, proceed to the correction immediately.
The following is a table listing the events sent by the sensors 14, 15 to the control unit 11 or the algorithm executed by the PC to identify the defect condition. The table also provides the conditions to send the error message to the user.
Table for the second sequence of events:

| # | Source | Event/Data | State (T0) | Transition (T1) | Diagnosis Condition |
|---|---|---|---|---|---|
| 1 | Sensor{e} | IDiffHF | 0 | 0 | |
| 2 | Sensor{e}@Main Entrance | IDiffHF | 0 | 1 | |
| 2 | Control unit{v} | No electronics fence controller in the equipment list | | | |
| 3 | Control unit{m} | | | | |

The following is a template for a second type of message to be displayed to the user:
Anomaly: A leak from an electrical fence has been identified in the main panel. This leak is from the outside of the building. It runs in the grounding system and puts the livestock at risk.
Proposed course of action: With the help of an electrical network adviser, proceed to the correction immediately.
The following is a table listing the events sent by the sensors 14, 15 to the control unit 11 or the algorithm executed by the PC to identify the defect condition. The table also provides the conditions to send the error message to the user.
Table for the third sequence of events:

| # | Source | Event/Data | State (T0) | Transition (T1) | Diagnosis Condition |
|---|---|---|---|---|---|
| 1 | Sensor{e} | IDiffHF | 0 | 1 | |
| 2 | Sensor{e}@Main entrance | IDiffHF | 0 | 1 | |
| 3 | Control unit{m} | | | | |

The following is a template for a third type of message to be displayed to the user.
Anomaly: A leak from an electrical fence has been identified in the main panel and its sub-panel. This leak runs in the grounding system and puts the livestock at risk.
Proposed course of action: With the help of an electrical network adviser, proceed to the correction immediately.

Thermal Protection

The objective of the Thermal Protection fault detection algorithm is to verify the thermal protection setting and the influence of the room temperature. This electrical fault detection algorithm can be applied to Installation at the main panel.

In the annotation motor electrical fault detection algorithm, a high temperature room influences the thermal protection dissipation. To compensate for spurious shutdowns, the user increases the current value threshold. This puts the motor at risk. When the control unit 11 identifies equipment at risk, the load can be shed.

The circumstances in which this fault is detected are when an OverloadLoad is present for more than one minute.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|------------|------------|-----------------|---------------------|
| 1 | Sensor{e} | OverloadLoad > 100% | 0 | 1 | |
| 2 | Control unit{c} | | | | ΔT#1 > 1 min |
| 3 | Control unit{m} | | | | |

The following is a template for a message to be displayed to the user:
Anomaly: The thermal protection of the motor is not properly set. As a result, the motor is not properly protected.
Proposed course of action: Ask an electrician to properly set the thermal protection.

It should be noted that the name plate and the service factor of the motor needs to be in the database.

Identification and Localization

The objective of the identification and localization algorithm is to identify the nature of the electrical conductor in each hole of the current sensor. This electrical fault detection algorithm can be applied to any application. In this electrical fault detection algorithm, the current sensor must be able to identify each type of conductor passing through each hole.

The following table provides examples of codes that may be used depending on the number of current holes sensors used to detect an anomaly.

| CODE |
|------|
| TwoHoles_H1_H2_Neutral_Error = 0 |
| TwoHoles_H1_Neutral = 1 |
| TwoHoles_H2_Neutral = 2 |
| TwoHoles_H1_H2_Not_Neutral = 3 |
| ThreeHoles_H1_H2_H3_Neutral_Error = 4 |
| ThreeHoles_H1_H2_Neutral_Error = 5 |
| ThreeHoles_H1_H3_Neutral_Error = 6 |
| ThreeHoles_H1_Neutral = 7 |
| ThreeHoles_H2_H3_Neutral_Error = 8 |
| ThreeHoles_H2_Neutral = 9 |
| ThreeHoles_H3_Neutral = 10 |
| ThreeHoles_H1_H2_H3_Not_Neutral = 11 |
| FourHoles_H1_H2_H3_H4_Neutral_Error = 12 |
| FourHoles_H1_H2_H3_Neutral_Error = 13 |
| FourHoles_H1_H2_H4_Neutral_Error = 14 |
| FourHoles_H1_H2_Neutral_Error = 15 |
| FourHoles_H1_H3_H4_Neutral_Error = 16 |
| FourHoles_H1_H3_Neutral_Error = 17 |
| FourHoles_H1_H4_Neutral_Error = 18 |
| FourHoles_H1_Neutral = 19 |
| FourHoles_H2_H3_H4_Neutral_Error = 20 |
| FourHoles_H2_H3_Neutral_Error = 21 |
| FourHoles_H2_H4_Neutral_Error = 22 |
| FourHoles_H2_Neutral = 23 |
| FourHoles_H3_H4_Neutral_Error = 24 |
| FourHoles_H3_Neutral = 25 |
| FourHoles_H4_Neutral = 26 |
| FourHoles_H1_H2_H3_H4_Not_Neutral_Error = 27 |

Figure 16A:
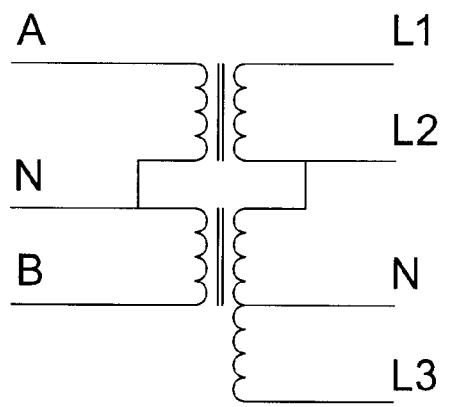
FIG. 16a is a schematic view of an electric circuit to be analyzed in accordance with an embodiment.
Figure 16B:
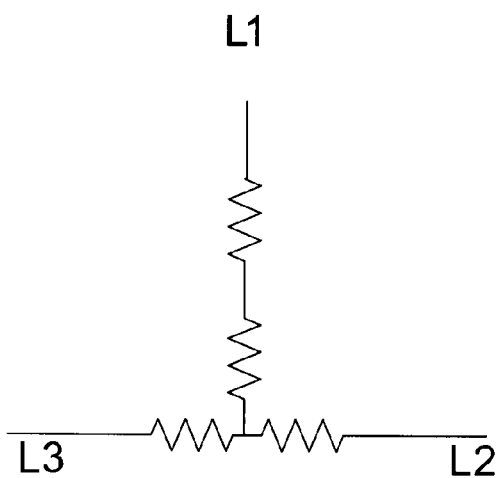
FIG. 16b is a schematic view of an electric circuit to be analyzed in accordance with an embodiment.

FIGS. 16a and 16b shows the different circuit configuration to be analyzed. The circumstances in which this fault is detected are when one conductor is missing can be, for example, open breakers, bad installation (L1–L1–N).

In this first sequence of events, no message is sent to the user unless an error is detected in the different circuit according to the previous table.

Table for the first sequence of events:

| # | Source | Event/Data | State (T0) | Transition (T1) | Diagnosis Condition |
|---|--------|------------|------------|-----------------|---------------------|
| 1 | Sensor{e} | CodeDetat | | | |

It should be noted that this rule must be initialised at the sensor power up.

High Frequency

The objective of the High Frequency fault detection algorithm is to Identify if the network frequency is higher than normal. This electrical fault detection algorithm can be applied to all applications. In this electrical fault detection algorithm, when the generator replaces the utility, the network frequency may deviate from the standard. The circumstances in which this fault is detected are when a Freq>Threshold.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|------------|------------|-----------------|---------------------|
| 1 | Sensor{e} | FreqHigh | 0 | 1 | |
| 2 | Control unit{m} | | | | |

The following is a template for a message to be displayed to the user:
Anomaly: The system has identified a frequency violation over the electrical network. The network frequency is above 60 Hz.
Proposed course of action: With an electrical network adviser, proceed to correction immediately.

Low Frequency

The objective of the Low Frequency fault detection algorithm is to Identify if the network frequency is higher than normal. This electrical fault detection algorithm can be applied to any application. In this electrical fault detection algorithm, when the generator replaces the utility, the network frequency may deviate from the standard. The circumstances in which this fault is detected are when a Freq<Threshold.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|-----------|------------|-----------------|---------------------|
| 1 | Sensor{e} | FreqLow | 0 | 1 | |
| 2 | Control unit{e} | | | | |

The following is a template for a message to be displayed to the user:

Anomaly: The system has identified a frequency violation over the electrical network. The network frequency is under 60 Hz.

Proposed course of action: With an electrical network adviser, proceed to correction immediately.

Temperature

The objective of the Temperature fault detection algorithm is to identify the cause of the temperature raise. With the temperature sensor in the current sensor and the one in the gateway, it can be determined if the temperature raise is due to an electrical defect or if it is a room temperature raise. This electrical fault detection algorithm can be applied to Breaker panel and sub panel.

In this electrical fault detection algorithm, the temperature can be raised for different causes. The thermal sensor temperature at the gateway 13 is the indicator of the room temperature. With the gateway's temperature, the system is able to determine if the temperature raise is at the breaker or if it is the room temperature that was raised to a certain level.

Electrical defects that can make the conductor temperature increase include electrical Arc, repetitive startups, overcurrent.

The circumstances in which this fault is detected are when a temperature threshold is reached and no electrical defect is detected.

The following is a table listing the events sent by the sensors 14, 15 to the control unit 11 or the algorithm executed by the PC to identify the defect condition. The table also provides the conditions to send the error message to the user.

Table for the first sequence of events:

| # | Source | Event/Data | State (T0) | Transition (T1) | Diagnosis Condition |
|---|--------|-----------|------------|-----------------|---------------------|
| 1 | Sensor{e} | HighTemp | 0 | 1 | |
| 2 | Sensor{e} | VeryHighTemp | 0 | 0 | |
| 3 | Sensor{v} | CapTemp | | | |
| 4 | Gateway{v} | Temp | | | |
| 5 | Control unit{c} | ConTemp ≠ CapTemp | | | |
| 6 | Control unit{v} | «OtherLawInViolation» | | | |
| 7 | Control unit{c} | «Rule_message_x» = IDB(#5) | | | |
| 8 | Control unit{c} | «Solution_x_Rule_x» = IDB(#5) | | | |
| 9 | Control unit{m} | | | | |

The following table is a description of variables from the previous table:

| | |
|---|---|
| «Rule_message_x» | Template selected based on the electrical defect detected. |
| «Solution_x_Rule_x» | Proposed course of action of the electrical defect detected. |

The following is a template for a message to be displayed to the user:

Anomaly: The conductor temperature is over 40° C. This situation is related to <<Rule_message_x>> and it reduces the equipment lifetime by 50%.

Proposed course of action: To resolve this issue: <<Solution_x_Rule_x>>.

Example

Anomaly: The conductor temperature is over 40° C. This situation is related to an electrical arc and it reduces the equipment lifetime by 50%.

Proposed course of action: To resolve this issue: the electrical arc is located between the circuit breaker and the switch. This could be generated by a loose conductor at a terminal, a bad junction, a burned contact on a motor starter. Inspect all cable junctions, terminals and switches.

The following is a table listing the events sent by the sensors 14, 15 to the control unit 11 or the algorithm executed by the PC to identify the defect condition. The table also provides the conditions to send the error message to the user.

Table for the second sequence of events:

| # | Source | Event/Data | State (T0) | Transition (T1) | Diagnosis Condition |
|---|---|---|---|---|---|
| 1 | Sensor{e} | HighTemp | 1 | 1 | |
| 2 | Sensor{e} | VeryHighTemp | 0 | 1 | |
| 3 | Sensor{v} | CapTemp | | | |
| 4 | Gateway{v} | Temp | | | |
| 5 | Control unit{c} | ConTemp ≠ CapTemp | | | |
| 6 | Control unit{v} | «OtherLawInViolation» | | | |
| 7 | Control unit{c} | «Rule_message_x» = IDB(#5) | | | |
| 8 | Control unit{c} | «Solution_x_Rule_x» = IDB(#5) | | | |
| 9 | Control unit{m} | | | | |

The following table is a description of variables from the previous table:

| «Rule_message_x» | Template selected based on the electrical defect detected. |
|---|---|
| «Solution_x_Rule_x» | Solution of the electrical defect detected. |

The following is a template for a second type of message to be displayed to the user.
Anomaly: The conductor temperature is over 50° C. This situation is related to <<Rule_message_x>> and it reduces the equipment lifetime by 70%.
Proposed course of action: To resolve this issue: <<Solution_x_Rule_x>>.

Example

Anomaly: The conductor temperature is over 50° C. This situation is related to an electrical arc and it reduces the equipment lifetime by 70%.
Proposed course of action: To resolve this issue: the electrical arc is located between the circuit breaker and the switch. This could be generated by a loose conductor at a terminal, a bad junction, a burned contact on a motor starter. Inspect all cable junctions, terminals and switches.

The following is a table listing the events sent by the sensors 14, 15 to the control unit 11 or the algorithm executed by the PC to identify the defect condition. The table also provides the conditions to send the error message to the user.

Table for the third sequence of events:

| # | Source | Event/Data | State (T0) | Transition (T1) | Diagnosis Condition |
|---|---|---|---|---|---|
| 1 | Sensor{e} | HighTemp | 0 | 1 | |
| 2 | Sensor{e} | VeryHighTemp | 0 | 0 | |
| 3 | Sensor{v} | CapTemp | | | |
| 4 | Gateway{v} | Temp | | | |
| 5 | Control unit{c} | ConTemp = CapTemp | | | |
| 6 | Control unit{m} | | | | |

The following is a template for a third type of message to be displayed to the user.
Anomaly: The room temperature is over 40° C. This situation reduces the equipment lifetime by 50%.
Proposed course of action: Proceed immediately to an adequate ventilation to reduce the room temperature.

The following is a table listing the events sent by the sensors 14, 15 to the control unit 11 or the algorithm executed by the PC to identify the defect condition. The table also provides the conditions to send the error message to the user.

Table for the fourth sequence of events:

| # | Source | Event/Data | State (T0) | Transition (T1) | Diagnosis Condition |
|---|---|---|---|---|---|
| 1 | Sensor{e} | HighTemp | 1 | 1 | |
| 2 | Sensor{e} | VeryHighTemp | 0 | 1 | |
| 3 | Sensor{v} | CapTemp | | | |
| 4 | Gateway{v} | Temp | | | |
| 5 | Control unit {c} | ConTemp = CapTemp | | | |
| 6 | Control unit {m} | | | | |

The following is a template for a fourth type of message to be displayed to the user.
Anomaly: The room temperature is over 50° C. This situation reduces the equipment lifetime by 70%.
Proposed course of action: Proceed immediately to an adequate ventilation to reduce the room temperature.

Voltage Sensor Decision Rules

The same notation as for the Current Sensor Decision Rules is used.

Identification and Localisation

The objective of the identification and localisation fault detection algorithm is to identify the voltage and the phase to validate the connection conformity and its characteristics. This electrical fault detection algorithm can be applied to any application. In this electrical fault detection algorithm, the sensor must be able to identify the type of connection (transformer of the utility) to confirm if the presence of the voltage is in conformity. The circumstances in which this fault is detected are when a breaker is opened at Hx, the connection polarity is defective. (L1–L1–N), and validation has to be done after any interruption.

Table for the first sequence of events:

| # | Source | Event/Data | State (t0) | Transition (t1) | Diagnosis Condition |
|---|---|---|---|---|---|
| 1 | SensorV{e} | VoltageDetected | 0 | 1 | φ1 |
| 2 | SensorV{e} | VoltageDetected | 0 | 0 | φ2 |
| 3 | Control unit{m} | | | | |

The following is a template for a message to be displayed to the user:
Anomaly: The system did not detect power over <<Hx>> during power up.
Proposed course of action: Verify the circuit breaker and the sensor connection.

Table for the second sequence of events:

| # | Source | Event/Data | State (t0) | Transition (t1) | Diagnosis Condition |
|---|---|---|---|---|---|
| 1 | SensorV{e} | PhaseShift | 0 | 1 | |
| 2 | SensorV{e} | VoltageDetected | 1 | 1 | |
| 3 | Control unit{m} | | | | |

The following is a template for a second type of message to be displayed to the user.
Anomaly: The phase over <<Hx>> is not normal.
Proposed course of action: Verify the circuit breaker and the sensor connection.

Table for the third sequence of events:

| # | Source | Event/Data | State (t0) | Transition (t1) | Diagnosis Condition |
|---|---|---|---|---|---|
| 1 | SensorV{e} | VoltageDetected | 1 | 0 | |
| 2 | Control unit{c} | | | | Delay(1) |
| 3 | SensorV{e} | VoltageDetected | 0 | 1 | |
| 4 | SensorV{e} | TBD | 0 | 1 | |

The following is a template for a third type of message to be displayed to the user.
Anomaly: The system has identified the presence of the auxiliary power source.
Warning: From now until further notice, failures or perturbation will be assigned to the auxiliary power source.

Table for the first sequence of events: #4 (Cases 1 to 3)

| # | Source | Event/Data | State (t0) | Transition (t1) | Diagnosis Condition |
|---|---|---|---|---|---|
| 1 | SensorV{e} | VoltageDetected | 1 | 1 | |
| 2 | SensorV{e} | CETN | | | DeltaOpen |
| 3 | | | | | |

The following is a template for a fourth type of message to be displayed to the user.
Anomaly: The system has detected a Delta-Open network
Proposed course of action: Some of the perturbations will be assigned to this type of power network e.g. delta open. Call Utility to rewire the transformer.

Table for the first sequence of events: #5 (Case 4)

| # | Source | Event/Data | State (t0) | Transition (t1) | Diagnosis Condition |
|---|---|---|---|---|---|
| 1 | SensorV{e} | VoltageDetected | 1 | 1 | |
| 2 | SensorV{e} | CETN | | | Scott |
| 3 | | | | | |

The following is a template for a fifth type of message to be displayed to the user:
Anomaly: The system has identified a Scott power network
Proposed course of action: With the help of your electrical network specialist, identify and request the modification at the utility of the transformer wiring. For example, use Scott configuration Table for the first sequence of events: #6

| # | Source | Event/Data | State (t0) | Transition (t1) | Diagnosis Condition |
|---|---|---|---|---|---|
| 1 | SensorV{e} | VoltageDetected | 0 | 1 | |
| 2 | SensorV{e} | CETN | | | CODE |
| 3 | Control unit{c} | IDB | 0 | 1 | CETN old ≠ new CETN |

The following is a template for a sixth type of message to be displayed to the user.
Anomaly: The system has identified a phase inversion during the power up.
Proposed course of action: Immediately interrupt the power! Proceed to the wiring correction before resume operation. The power supply connection is reversely connected. The engine of the electrical equipment is at risk.
Note: In one application, there may be more than one voltage sensor. It is important to specify the correct location.

Neutral Conductor Loss

The objective of the neutral conductor Loss fault detection algorithm is to Verify the connection of the neutral conductor. This electrical fault detection algorithm can be applied to any application. The rule is applied to neutral conductor only.

In this electrical fault detection algorithm, a neutral conductor can be removed from the main circuit inadvertently. This may cause a voltage rise of several tens of volts and put in jeopardy all equipment using the neutral conductor. Equipment supplied with the less loaded phase may have a voltage increase (sometimes until the composite voltage).

The circumstances in which this fault is detected are when an Identify the neutral opening or a power up without neutral (use of a generator). Formula Single-phase: $|V1n|-|V2n|<5\% \times Vn$, Formula Three-phase: $|V1n|-|V2n|-|V3n|<5\% \times Vn$.

Table for the first sequence of events:

| # | Source | Event/Data | State (t0) | Transition (t1) | Diagnosis Condition |
|---|---|---|---|---|---|
| 1 | SensorV{e} | VoltageDetected | 1 | 1 | |
| 2 | SensorV{e} | NeutralLost | 0 | 1 | |
| 3 | Control unit {m} | | | | |

The following is a template for a message to be displayed to the user:
Anomaly: The neutral conductor has been opened during operation. The electrical network is in danger. Shut down the electrical network as soon as possible.
Proposed course of action: With a megger, locate and repair the defect. Verify the entire electrical load using a neutral conductor (120V, 277V or 347V) and verify all equipment before resuming operation.
Table for the second sequence of events:

| # | Source | Event/Data | State (t0) | Transition (t1) | Diagnosis Condition |
|---|---|---|---|---|---|
| 1 | SensorV{e} | VoltageDetected | 0 | 1 | |
| 2 | SensorV{e} | NeutralLost | 0 | 1 | |
| 3 | Control unit {m} | | | | |

The following is a template for a second type of message to be displayed to the user.
Anomaly: During the power up, the neutral conductor was not correctly connected or was missing. The electrical network is at high risk. Shut down the electrical circuit as soon as possible.
Proposed course of action: With a megger, locate and repair the defect. Verify the entire electrical load using a neutral conductor (120V, 277V or 347V) and verify all equipment before resuming operation.
Interruption
The objective of the Interruption fault detection algorithm is to validate the length of the power interruption when the interruption duration is more than one (1) minute. This electrical fault detection algorithm can be applied to any application. The rule is applied by phase. In this electrical fault detection algorithm, Identifies the length and the number of the power interruption allows verifying the availability of the auxiliary source and its starting time.
The circumstances in which this fault is detected are when a Voltage interruption. Vrms<10%*Vn, for more than one (1) minute.
Table for the first sequence of events:

| # | Source | Event/Data | State (t0) | Transition (t1) | Diagnosis Condition |
|---|---|---|---|---|---|
| 1 | SensorV{e} | VoltageDetected | 1 | 0 | |
| 2 | Control unit {c} | Δt#1 | | | |
| 3 | Control unit {c} | | | | Δt > 1 m |
| 4 | Control unit {m} | | | | |

The following is a template for a message to be displayed to the user:
Anomaly:—The power was interrupted for more than one (1) minute.
Proposed course of action: If you have an auxiliary source, verify its starting time.
Upon receipt of the alarm, the system displays a warning, rounded at the minute. The warning should indicate:
Anomaly: The power failure duration is: <<hh:mm>>
Undervoltage
The objective of the undervoltage fault detection algorithm is to identify an undervoltage compared to the nominal voltage that may have an impact on the motor operation. This electrical fault detection algorithm can be applied to any application. The rule is applied by phase.
In this electrical fault detection algorithm, an undervoltage creates an increase of the current consumption of the motor. The circumstances in which this fault is detected are when an undervoltage more than 10%. The situation must persist for more than five (5) minutes per slipping hour. Vrms<90%*Vn
Table for the first sequence of events:

| # | Source | Event/Data | State (t0) | Transition (t1) | Diagnosis Condition |
|---|---|---|---|---|---|
| 1 | SensorV{e} | Undervoltage | 0 | 1 | |
| 2 | SensorV{e} | VoltageDetected | 1 | 1 | |
| 3 | Control unit {c} | Δt#1 | | | |
| 4 | Control unit {c} | | | | Δt > 5 m/h |
| 5 | Control unit {m} | | | | |

The following is a template for a message to be displayed to the user:
Anomaly: The voltage is 10% lower than the nominal value. This situation occurs for more than five (5) minutes.
Proposed course of action: In collaboration with an electrician, verify that the load of the installation is acceptable for the Utility. If so, ask the Utility to correct the situation.
Voltage Dips
The objective of the voltage dips fault detection algorithm is to identify voltage dips. A voltage dip is defined by a fall of at least 10% of the nominal voltage on one or more phases for a short period of time varying from eight (8) milliseconds to one minute. This electrical fault detection algorithm can be applied to any applications. The rule is applied by phase.
In this electrical fault detection algorithm, the voltage dips are mainly caused by a phenomenon leading to high currents which are caused by the impedances of the network elements. The voltage drop will have less low amplitude as the point of observation is far away from the electrical perturbation.
The circumstances in which this fault is detected are when a drop of amplitude for more than 10% of the nominal voltage for more than eight (8) milliseconds to one minute. 8 ms<Δt<80 ms and Vrms<90% Vn. More than two times by slipping 24 h.
Table for the first sequence of events:

| # | Source | Event/Data | State (t0) | Transition (t1) | Diagnosis Condition |
|---|---|---|---|---|---|
| 1 | SensorV{e} | Undervoltage | 0 | 1 | |
| 2 | SensorV{e} | VoltageDetected | 1 | 1 | |
| 3 | PC{c} | Δt#1 | | | |
| 4 | PC{c} | | | | 8 ms < Δt < 80 ms |
| 5 | PC{m} | | | | |

The following is a template for a message to be displayed to the user:
Anomaly: The system has identified an undervoltage over <<Hx>>. This may damage the electrical equipment. This undervoltage has occurred more than two times in the last 24 hours.
Proposed course of action: If this event is repetitive over a long period of time, contact an electrician to tell him about the problem.

It should be noted that All events detected by this rule need to be logged and sorted by hour, week, month and year. All sorting categories need to be slipping time categories.

Log of all events for more than one minute but less than five consecutive minutes.

Power Failure

The objective of the Power Failure fault detection algorithm is to identify a short power failure corresponding to the temporary power supply loss on all the phases for a period of time lower than one minute. This electrical fault detection algorithm can be applied to any application. The rule is applied by phase. The circumstances in which this fault is detected are when a (V<10% Vn) & (Δt<80 ms) transient, (V<10% Vn) & (80 ms<Δt<1 m) short interruption, More than two times by slipping 24 h.

Table for the first sequence of events:

| # | Source | Event/Data | State (t0) | Transition (t1) | Diagnosis Condition |
|---|--------|------------|------------|-----------------|---------------------|
| 1 | SensorV{e} | VoltageDetected | 1 | 0 | |
| 2 | PC{c} | Δt#1 | | | |
| 3 | PC{c} | | | | Δt < 80 ms |
| 4 | PC{m} | | | | |

The following is a template for a message to be displayed to the user:

Anomaly: The system has identified transient power failure over <<Hx>> more than 2 times in the last 24 hours.

Proposed course of action: If this event is repetitive, contact the Utility to inform about the problem.

Table for the second sequence of events:

| # | Source | Event/Data | State (t0) | Transition (t1) | Diagnosis Condition |
|---|--------|------------|------------|-----------------|---------------------|
| 1 | SensorV{e} | VoltageDetected | 1 | 0 | |
| 2 | Control unit {c} | Δt#1 | | | |
| 3 | Control unit {c} | | | | 80 ms < Δt < 1 m |
| 4 | Control unit {m} | | | | |

The following is a template for a second type of message to be displayed to the user.

Anomaly: The system has identified a short power failure over <<Hx>> more than 2 times in the last 24 hours.

Proposed course of action: If this event is repetitive, contact your Utility to inform them about the problem.

Overvoltage

The objective of the Overvoltage fault detection algorithm is to identify a sudden increase of the voltage value on one or more phases for a short period of time. This electrical fault detection algorithm can be applied to all applications. The rule is applied by phase.

In this electrical fault detection algorithm, an overvoltage is a sudden rise of the effective value of the tension of more than 10% of the nominal voltage, which is restored after a short period of time. The overvoltage duration is between eight milliseconds and one minute. The circumstances in which this fault is detected are when a V>110% Vn/phase. Voltage increases more than 10% of the nominal voltage. Must persist more than five minutes per slipping hour.

Table for the first sequence of events:

| # | Source | Event/Data | State (t0) | Transition (t1) | Diagnosis Condition |
|---|--------|------------|------------|-----------------|---------------------|
| 1 | SensorV{e} | Overvoltage | 0 | 1 | |
| 2 | SensorV{e} | VoltageDetected | 1 | 1 | |
| 3 | Control unit{c} | ΔT#1 | | | |
| 4 | Control unit{c} | | | | ΔT >= 5 m/h |
| 5 | Control unit{m} | | | | |

The following is a template for a message to be displayed to the user:

Anomaly: The system has identified temporary overvoltage over the network. This overvoltage has happened on the conductor <<Hx>> for more than five minutes in the last hour. This affects the electrical equipment.

Proposed course of action: If this event is repetitive, contact the Utility to inform them about the problem.

Unbalanced Voltage

The objective of the Unbalanced Voltage fault detection algorithm is to identify a situation when the three tensions of the three-phase system are not equal in amplitude or are not shifted of 120° from ones to the others. This electrical fault detection algorithm can be applied to any application for three-phase network. The rule is applied by phase.

In this electrical fault detection algorithm, the unbalanced voltage is defined, according to the method of the symmetrical components, like the existing relationship between the module of the opposite component of the tension and the direct component. The circumstances in which this fault is detected are when a V/V>Threshold. Warning: this formula is not applicable over certain types of network. The network has been identifying (identification and localisation). Acceptable: 95% of time/slipping week. Normally: <de 2%. Occasionally: <3%.

Table for the first sequence of events:

| # | Source | Event/Data | State (t0) | Transition (t1) | Diagnosis Condition |
|---|--------|------------|------------|-----------------|---------------------|
| 1 | SensorV{e} | Unbalancedvoltage | 0 | 1 | |
| 2 | SensorV{e} | VoltageDetected | 1 | 1 | |
| 3 | Control unit {m} | | | | |

The following is a template for a message to be displayed to the user:

Anomaly: An unbalanced voltage level of <<x>> % has been identified by the system. This unbalanced voltage is steady and puts the electrical equipment at risk.

Proposed course of action: Contact the Utility, as soon as possible, to indicate the problem.

Impulse

The objective of the Impulse (Transient overvoltage, spikes) fault detection algorithm is to identify the very fast increase of voltage at a high frequency, independently of the network. Overvoltage can take the form of a one-way impulse of negative polarity or a damped oscillation. This electrical fault detection algorithm can be applied to any application. The rule is applied by phase.

In this electrical fault detection algorithm, Generally ranging between 100 Hz to 9 Khz, the raising edge is typically between 0.5 µs and 5 µs, generally limited to 6 Kv. The circumstances in which this fault is detected are when a $\Delta t < T/2$ & $V > 110\% Vn$ Table for the first sequence of events:

| # | Source | Event/Data | State (t0) | Transition (t1) | Diagnosis Condition |
|---|--------|------------|------------|-----------------|---------------------|
| 1 | SensorV{e} | OverVoltage | 0 | 1 | |
| 2 | SensorV{e} | VoltageDetected | 1 | 1 | |
| 3 | Control unit {c} | $\Delta t\#1$ | | | |
| 4 | Control unit {c} | | | | $\Delta t < T/2$ |
| 5 | Control unit{m} | | | | |

The following is a template for a message to be displayed to the user:
Anomaly: The system has identified more than two transient overvoltages in the last 24 hours.
Proposed course of action: With an electrician, verify if those impulses come from defective equipment. If not, contact the Utility with this problem.

Source Impedance

The objective of the source Impedance fault detection algorithm is to calculate the source impedance. This electrical fault detection algorithm can be applied to any application. The rule is applied to the circuit.

In this electrical fault detection algorithm, the current of the electronic drives combined with the source impedance may cause a distortion of the supplied voltage. This voltage distortion may produce parasitic currents and voltage in the environment even under ideal conditions of the power network. To prevent or limit this mode of production of parasitic tension, there exist a relation between the gauge of a drive and the Utility source impedance.

The circumstances in which this fault is detected are when a distortion factor is lower than 5%, the ratio between the impedance equivalent to 60 Hz of the drive and the source impedance of the network utility is be equivalent or higher than 80. The criterion of the distortion factor of voltage is slightly more severe for a drive single-phase current, 5 vs 4. Identify the network type (single-phase or three-phase).

Table for the first sequence of events:

| # | Source | Event/Data | State (t0) | Transition (t1) | Diagnosis Condition |
|---|--------|------------|------------|-----------------|---------------------|
| 1 | SensorV{e} | ImpSource | 0 | 1 | |
| 2 | SensorV{e} | VoltageDetected | 1 | 1 | |
| 3 | Control Unit{m} | | | | |

The following is a template for a message to be displayed to the user:
Message: The source impedance of your electrical networks is too high. This creates leakage current into the animal environment. The variable speed drive is at risk. Your installation impedance must be 80 times higher then the source impedance. Currently, the ratio is <<ratio>>
Proposed course of action: Contact your electrical network specialist to correct your impedance ratio.

Harmonic Content

The objective of the Harmonic Content fault detection algorithm is to verify the harmonic threshold. This electrical fault detection algorithm can be applied to any application. The rule is applied by phase.

In this electrical fault detection algorithm, the rates of the individual harmonics (Ti) and the total harmonic content (T) correspond to the effective value of the harmonic voltage measured on time intervals of integration in X minutes (10 m). The harmonic levels of voltage must be evaluated without any electrical perturbation like: fast transients, undervoltage, overvoltage, short dips and interruptions or when the phases voltage fall below 50% from the nominal voltage.

Target values: In the case of the harmonic voltage, the harmonic content (T) equal to 8% and the various individual harmonic contents should be lower than the values of the table below during 95% of time over one period of one week measurement.

The following table shows the Target value by harmonic for low voltage Utility network.

| Harmonic odds | | Harmonic events | |
|---|---|---|---|
| Voltage | | | |
| Harmonic Rank n | Harmonic % | Harmonic Rank n | Voltage Harmonic % |
| 3 | 6 | 2 | 2.0 |
| 5 | 6 | 4 | 1.5 |
| 7 | 5 | 6 | 0.75 |
| 9 | 3.5 | 8 | 0.6 |
| 11 | 3.5 | 10 | 0.6 |
| 13 | 3 | 12 to 24 | 0.5 |
| 15 | 2 | | |
| 17 | 2 | | |
| 19 to 25 | 1.5 | | |

The circumstances in which this fault is detected are when any harmonic that exceeds the profile.

Table for the first sequence of events:

| # | Source | Event/Data | State (t0) | Transition (t1) | Diagnosis Condition |
|---|--------|------------|------------|-----------------|---------------------|
| 1 | SensorV{e} | HC | 0 | 1 | |
| 2 | Control unit{m} | | | | |

The following is a template for a message to be displayed to the user:
Anomaly: The <<#h>> harmonic exceeding is threshold by <<x>> %. This affects the livestock and the electrical equipment.
Proposed course of action: Contact an electrician to identify the defective load.

It should be noted that the evaluation of the harmonic contents having a % of the fundamental harmonics makes it possible to find the absolute levels of harmonics even if the fundamental harmonics fluctuate.

High THDv

The objective of the High THDv fault detection algorithm is to Identify if there is a harmonic distortion over the network. Verify if the distortion factor is higher than 5%. This electrical fault detection algorithm can be applied to any applications. The rule is applied by phase.

In this electrical fault detection algorithm, $THDv = (V^2 - (V1)^2)/(V1)^2$. The harmonic current combined with the source impedance may cause a distortion on the power network. The side effect of this voltage distortion is the production of stray currents and voltage in the animal environment even under ideal conditions of operation of the network Utility. In order to prevent or limit these phenomena, the ratio between the harmonic generator and the source impedance of the network Utility must be higher than 80 times. The circumstances in which this fault is detected are when a THDV>Threshold=%

Table for the first sequence of events:

| # | Source | Event/Data | State (t0) | Transition (t1) | Diagnosis Condition |
|---|--------|------------|------------|-----------------|---------------------|
| 1 | SensorV{e} | THDv | 0 | 1 | |
| 2 | PC{m} | | | | |

The following is a template for a message to be displayed to the user:
Anomaly: The distortion factor is higher than x %. This distortion factor affects all the electrical equipment.
Proposed course of action: Lower the non-linear load or proceed to a complete evaluation of the source impedance.
Low Frequency The objective of the Low Frequency fault detection algorithm is to Identify if the frequency is lower than the nominal frequency. This situation occurs when auxiliary power is used. This electrical fault detection algorithm can be applied to any application. The rule is applied by phase. In this electrical fault detection algorithm, Auxiliary powers are more inclined to create frequency variation. The circumstances in which this fault is detected are when a Freq<Threshold. The defect must be measured over a certain period of time.

Table for the first sequence of events:

| # | Source | Event/Data | State (t0) | Transition (t1) | Diagnosis Condition |
|---|--------|------------|------------|-----------------|---------------------|
| 1 | SensorV{e} | FreqLow | 0 | 1 | |
| 2 | Control unit{m} | | | | |

The following is a template for a message to be displayed to the user:
Anomaly: The system has identified a lower frequency of the power supply. This affects the equipment operation.
Proposed course of action: With the help of an electrician, fix the problem as soon as possible. If an auxiliary source is used, check it.
High Frequency The objective of the High Frequency fault detection algorithm is to Identify if the frequency is higher than the nominal frequency. This situation occurs when auxiliary power is used. This electrical fault detection algorithm can be applied to any application. The rule is applied by phase. In this electrical fault detection algorithm, the auxiliary powers are more inclined to create frequency variation. The circumstances in which this fault is detected are when a Freq>Threshold. The defect must be measured over a certain period of time.

Table for the first sequence of events:

| # | Source | Event/Data | State (t0) | Transition (t1) | Diagnosis Condition |
|---|--------|------------|------------|-----------------|---------------------|
| 1 | SensorV{e} | FreqHigh | 0 | 1 | |
| 2 | Control unit{m} | | | | |

The following is a template for a message to be displayed to the user:
Anomaly: The system has identified a higher frequency of the power supply. This affects the equipment operation.
Proposed course of action: With the help of an electrician, fix the problem as soon as possible. If an auxiliary source is used, check it.

The embodiments described above are intended to be exemplary only. The scope of the invention is therefore intended to be limited solely by the appended claims.

While illustrated in the block diagrams as groups of discrete components communicating with each other via distinct data signal connections, it will be understood by those skilled in the art that the illustrated embodiments may be provided by a combination of hardware and software components, with some components being implemented by a given function or operation of a hardware or software system, and many of the data paths illustrated being implemented by data communication within a computer application or operating system. The structure illustrated is thus provided for efficiency of teaching the described embodiment.

What is claimed is:

1. A method for real time monitoring of an electrical network in a facility in order to detect an electrical anomaly, the method comprising:
use of a processor for carrying out each of the following steps:
receiving real time sensor data including at least one measured value measured in real time by at least one sensor installed on a conductor of said electrical network in said facility, each said at least one measured value being one of a current value and a voltage value;
retrieving an anomaly detection rule, said rule having an identification of a required input, a formula, and a threshold reference value, for a detection of an anomaly, said threshold reference value being determined using a nominal value for said input for said relevant element;
extracting at least one relevant measured value from said at least one measured value using said identification of said required input;
comparing said at least one relevant measured value to said threshold reference value according to said formula to determine one of a presence and an absence of said anomaly in said real time sensor data; and
if said anomaly is determined to be present, then retrieving and providing anomaly monitoring data, said anomaly monitoring data including: (1) anomaly nature data describing a nature of the anomaly; and (2) monitoring course of action data describing a monitoring course of action to be carried out to address said anomaly determined to be present.

2. The method as claimed in claim 1, further comprising generating an indication that said electrical anomaly is detected and outputting a message including said anomaly monitoring data.

3. The method as claimed in claim 2, further comprising formatting said real time sensor data into formatted data, and wherein said outputting said message comprises including said formatted data with said anomaly monitoring data.

4. The method as claimed in claim 1, wherein said receiving real time sensor data comprises receiving real time sensor data including at least one measured value measured in real time by sixteen current sensors and a voltage sensor.

5. The method as claimed in claim 1, further comprising:
retrieving potential sources data for said anomaly determined to be present including a list of potential sources for said anomaly;

retrieving installation data for said electrical network;
determining a source of said electrical anomaly in said electrical network using said list of potential sources, said real time sensor data and said installation data;
and wherein said providing anomaly monitoring data comprises providing an indication of said determined source.

6. The method as claimed in claim 1, further comprising:
retrieving type data for said anomaly determined to be present including a list of types for said anomaly and a corresponding detection rule for each of said types;
determining a type of said electrical anomaly in said electrical network using said list of types, said corresponding detection rule and said real time sensor data;
and wherein said providing anomaly monitoring data comprises providing an indication of said determined type.

7. The method as claimed in claim 1, wherein said anomaly is one of: an erroneous installation of said sensor, an electrical arc, a short circuit, an external intervention on a current limitation device, a bonding, a leakage of current, an overcurrent, a lost load, a harmonic distortion anomaly, a mechanical jam, an unbalanced current, an overload of a load, a repetitive start, a heavy start, a thermal protection anomaly, a power failure, an unbalanced voltage, a frequency value anomaly, a voltage value anomaly, a loss of a neutral conductor, and a temperature anomaly.

8. The method as claimed in claim 7, wherein said anomaly is said electrical arc, said at least one sensor is a current sensor, and said at least one measured value is a current value, said identification of said required input is a value for a current, said formula is performing a standard deviation on a vector of subtractions of said value for said current for a previous cycle by another current value, for a number n of cycles, said another current value being one of a current value for a present cycle and a current value for an average cycle, said threshold reference value is a reference value for said standard deviation;
wherein said extracting comprises extracting n current acquired signals from said real time sensor data; and
wherein said comparing comprises applying said formula to said n current acquired signals and comparing said standard deviation to said reference value to determine one of a presence and an absence of said electrical arc.

9. The method as claimed in claim 8, further comprising determining said current value for an average cycle by accumulating a number m of current values over m cycles and performing an average on said m current values to obtain said current value for said average cycle.

10. The method as claimed in claim 7, wherein said anomaly is said external intervention on said current limitation device, said at least one sensor is a current sensor, and said at least one measured value is two sets of values from consecutive time periods, each set including a current presence value, a voltage presence value and a load presence value, said identification of said required input is a status of a current, a status of a voltage and a status of a load, said formula is subtracting each value from one of said two consecutive sets from a corresponding value in the other one of said two consecutive sets, said threshold reference value is a transition value;
wherein said extracting comprises extracting an indication of a status of a current from said current presence value, of a status of a voltage from said voltage presence value and a status of a load from said load presence value from said real time sensor data;
wherein said comparing comprises applying said formula and comparing said obtained set of subtracted values to said transition value to determine an occurrence of a abnormal transition if one of
said transition for each of said voltage, said current and said load is from a present status to an absent status over said two consecutive time periods; and
said transition for said voltage is from a present status to an absent status over said two consecutive time periods and said status of said current and said load is an absent status and said transition for said current and said load is nil;
further comprising retrieving a status for other anomalies, said status being one of presence of at least one other anomaly and absence of any other anomaly; and
wherein said comparing further comprises if said status for other anomalies is said absence of any other anomaly and said abnormal transition is determined to be occurred, determining a presence of said external intervention on a current limitation device anomaly.

11. The method as claimed in claim 10, further comprising determining said current presence value by comparing a measured current value with a current presence threshold value, determining said voltage presence value by comparing a measured voltage value with a voltage presence threshold value and determining said load presence value by comparing a measured load value with a load presence threshold value.

12. The method as claimed in claim 7, wherein said anomaly is said erroneous installation of said sensor, said at least one sensor is a current sensor having at least two conductor holes, and said at least one measured value is a measured voltage value for each of said at least two conductor holes of said sensor, said identification of said required input is a value for a voltage, said threshold reference value is a threshold voltage value, said formula is subtracting said value for said voltage by said threshold voltage value;
wherein said comparing comprises applying said formula to each said measured voltage value and further comprises:
if said measured voltage value is greater than said threshold voltage value, determining said corresponding one of said sensor holes to be a line conductor;
if said measured voltage value is smaller than said threshold voltage value, determining said corresponding one of said sensor holes to be a neutral conductor;
determining a number of holes having been determined to be a neutral conductor to be neutral holes, if said number of neutral holes is greater than one, determining a presence of said erroneous installation anomaly and determining a type of said erroneous installation anomaly to be a number of neutral holes anomaly.

13. The method as claimed in claim 12, wherein said comparing further comprises:
determining a number of holes having been determined to be a line conductor to be a number of live holes;
if said number of live holes is zero, determining a presence of said erroneous installation anomaly and determining a type of said erroneous installation anomaly to be a number of live holes anomaly.

14. The method as claimed in claim 13, wherein said at least one measured value includes a measured phase value for each of said at least two conductor holes of said sensor, said identification of said required input includes a value for a phase, said threshold reference value includes a single phase threshold phase value and a three-phase threshold phase value, said formula further includes subtracting a phase shift between phases of each line conductors with one of said single phase threshold phase value and said three-phase threshold phase value;

wherein said comparing further comprises:
if said number of live holes is two, determining a phase shift between said phase measured value of said line conductors, comparing said phase shift with said single phase threshold phase value, if said erroneous installation anomaly is determined to be present, determining a type of said erroneous installation anomaly to be a phase shift anomaly;
if said number of live holes is three, determining three phase shifts between said phase measured value of said line conductors, comparing each of said three phase shifts with said three-phase threshold phase value, if said erroneous installation anomaly is determined to be present, determining a type of said erroneous installation anomaly to be a phase shift anomaly;
if said number of live holes is four, determining a presence of an erroneous installation anomaly and determining a type of said erroneous installation anomaly to be a live hole anomaly.

15. A system for real time monitoring of an electrical network in a facility in order to detect an electrical anomaly, the system comprising:
a sensor data receiver for receiving real time sensor data including at least one measured value measured in real time by at least one sensor installed on a conductor of said electrical network, each said at least one measured value being one of a current value and a voltage value;
an anomaly detector for
retrieving an anomaly detection rule from an anomaly detection rule database, said rule having an identification of a required input, a formula, and a threshold reference value, for a detection of an anomaly, said threshold reference value being determined using a nominal value for said input for said relevant element;
receiving said real time sensor data from said sensor data receiver and extracting at least one relevant measured value from said at least one measured value using said identification of said required input;
comparing said at least one relevant measured value to said threshold reference value according to said formula to determine one of a presence and an absence of said anomaly in said real time sensor data;
an event generator controlled by said processor for retrieving and providing anomaly monitoring data if said anomaly is determined to be present by said processor, said anomaly monitoring data including: (1) anomaly nature data describing a nature of the anomaly; and (2) monitoring course of action data describing a monitoring course of action to be carried out to address said anomaly determined to be present.

16. The system as claimed in claim 15, further comprising a source locator for
retrieving potential sources data for said anomaly determined to be present from said anomaly detection rule database including a list of potential sources for said anomaly;
retrieving installation data for said electrical network from a system installation database; and
determining a source of said electrical anomaly in said electrical network using said list of potential sources, said real time sensor data and said installation data;
wherein said event generator provides an indication of said determined source.

17. The system as claimed in claim 15, further comprising a type determiner for
retrieving type data for said anomaly determined to be present from said anomaly detection rule database including a list of types for said anomaly and a corresponding detection rule for each of said types; and
determining a type of said electrical anomaly in said electrical network using said list of types, said corresponding detection rule and said real time sensor data;
wherein said event generator provides an indication of said determined type.

18. The system as claimed in claim 15, wherein said anomaly is one of: an erroneous installation of said sensor, an electrical arc, a short circuit, an external intervention on a current limitation device, a bonding, a leakage of current, an overcurrent, a lost load, a harmonic distortion anomaly, a mechanical jam, an unbalanced current, an overload of a load, a repetitive start, a heavy start, a thermal protection anomaly, a power failure, an unbalanced voltage, a frequency value anomaly, a voltage value anomaly, a loss of a neutral conductor, and a temperature anomaly.

19. The system as claimed in claim 18, wherein said anomaly is said electrical arc, said at least one sensor is a current sensor, and said at least one measured value is a current value, said identification of said required input is a value for a current, said formula is performing a standard deviation on a vector of subtractions of said value for said current for a previous cycle by another current value, for a number n of cycles, said another current value being one of a current value for a present cycle and a current value for an average cycle, said threshold reference value is a reference value for said standard deviation;
wherein said anomaly detector extracts n current acquired signals from said real time sensor data and applies said formula to said n current acquired signals and compares said standard deviation to said reference value to determine one of a presence and an absence of said electrical arc.

20. The system as claimed in claim 18, wherein said anomaly is said external intervention on a current limitation device, said at least one sensor is a current sensor, and said at least one measured value is two sets of values from consecutive time periods, each set including a current presence value, a voltage presence value and a load presence value, said identification of said required input is a status of a current, a status of a voltage and a status of a load, said formula is subtracting each value from one of said two consecutive sets from a corresponding value in the other one of said two consecutive sets, said threshold reference value is a transition value;
wherein said anomaly detector
extracts an indication of a status of a current from said current presence value, of a status of a voltage from said voltage presence value and a status of a load from said load presence value from said real time sensor data;
applies said formula and compares said obtained set of subtracted values to said transition value to determine an occurrence of a abnormal transition if one of
said transition for each of said voltage, said current and said load is from a present status to an absent status over said two consecutive time periods; and
said transition for said voltage is from a present status to an absent status over said two consecutive time periods and said status of said current and said load is an absent status and said transition for said current and said load is nil;
further comprising a system communicator for retrieving a status for other anomalies, said status being one of presence of at least one other anomaly and absence of any other anomaly; and wherein said anomaly detector obtains said status for other anomalies from said system communicator and if said status for other anomalies is said absence of any other anomaly and said abnormal transition is determined to be occurred, determines a presence of said external intervention on a current limitation device anomaly.

21. The system as claimed in claim 18, wherein said anomaly is an erroneous installation of said sensor, said at least one sensor is a current sensor having at least two conductor holes, and said at least one measured value is a measured voltage value for each of said at least two conductor holes of said sensor, said identification of said required input is a value for a voltage, said threshold reference value is a threshold voltage value, said formula is subtracting said value for said voltage by said threshold voltage value;

wherein said anomaly detector
applies said formula to each said measured voltage value;
if said measured voltage value is greater than said threshold voltage value, determines said corresponding one of said sensor holes to be a line conductor;
if said measured voltage value is smaller than said threshold voltage value, determines said corresponding one of said sensor holes to be a neutral conductor;
determines a number of holes having been determined to be a neutral conductor to be neutral holes, if said number of neutral holes is greater than one, determines a presence of said erroneous installation anomaly and determines a type of said erroneous installation anomaly to be a number of neutral holes anomaly.

22. The system as claimed in claim 21, wherein said anomaly detector:
determines a number of holes having been determined to be a line conductor to be a number of live holes;
if said number of live holes is zero, determines a presence of said erroneous installation anomaly and determines a type of said erroneous installation anomaly to be a number of live holes anomaly.

23. The system as claimed in claim 22, wherein said at least one measured value includes a measured phase value for each of said at least two conductor holes of said sensor, said identification of said required input includes a value for a phase, said threshold reference value includes a single phase threshold phase value and a three-phase threshold phase value, said formula further includes subtracting a phase shift between phases of each line conductors with one of said single phase threshold phase value and said three-phase threshold phase value;

wherein said anomaly detector
if said number of live holes is two, determines a phase shift between said phase measured value of said line conductors, compares said phase shift with said single phase threshold phase value, if said erroneous installation anomaly is determined to be present, determines a type of said erroneous installation anomaly to be a phase shift anomaly;
if said number of live holes is three, determines three phase shifts between said phase measured value of said line conductors, compares each of said three phase shifts with said three-phase threshold phase value, if said erroneous installation anomaly is determined to be present, determines a type of said erroneous installation anomaly to be a phase shift anomaly;
if said number of live holes is four, determines a presence of an erroneous installation anomaly and determines a type of said erroneous installation anomaly to be a live hole anomaly.

24. The method of claim 1, wherein the anomaly nature data comprises an error code.

25. The system of claim 15, wherein the anomaly nature data comprises an error code.

26. The method of claim 1, further comprising saving the anomaly nature data and the monitoring course of action data in a database.

27. The method of claim 1, further comprising saving the anomaly nature data and the monitoring course of action data in a database.

28. The method of claim 1, wherein the anomaly monitoring data further comprises a history of alarms.

29. The system of claim 15, wherein the anomaly monitoring data further comprises a history of alarms.

30. The method of claim 1, wherein the anomaly nature data describes an amplitude of a current on a conductor.

31. The system of claim 15, wherein the anomaly nature data describes an amplitude of a current on a conductor.

32. The method of claim 1, wherein the anomaly nature data describes a temperature of a conductor.

33. The system of claim 15, wherein the anomaly nature data describes a temperature of a conductor.

34. The method of claim 1, wherein the anomaly nature data describes a magnitude of at least a first current harmonic on a conductor.

35. The system of claim 15, wherein the anomaly nature data describes a magnitude of at least a first current harmonic on a conductor.

36. The method of claim 1, wherein the anomaly monitoring data further comprises at least some of the real time sensor data.

37. The system of claim 1, wherein the anomaly monitoring data further comprises at least some of the real time sensor data.

* * * * *